US007999800B2

(12) United States Patent
Iwabuchi et al.

(10) Patent No.: US 7,999,800 B2
(45) Date of Patent: Aug. 16, 2011

(54) DISPLAY DEVICE FOR PARTIAL DISPLAY

(75) Inventors: Tomoyuki Iwabuchi, Kanagawa (JP);
Ryo Arasawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 864 days.

(21) Appl. No.: 11/494,258

(22) Filed: Jul. 27, 2006

(65) Prior Publication Data
US 2007/0063959 A1 Mar. 22, 2007

(30) Foreign Application Priority Data

Jul. 29, 2005 (JP) .................................. 2005-222219

(51) Int. Cl.
*G06F 3/038* (2006.01)
(52) U.S. Cl. ........................................................ 345/204
(58) Field of Classification Search .................. 345/204
See application file for complete search history.

(56) References Cited

U.S. PATENT DOCUMENTS

| 5,867,140 A * | 2/1999 | Rader .............................. 345/98 |
| 5,881,299 A * | 3/1999 | Nomura et al. ................ 713/324 |
| 6,522,319 B1 * | 2/2003 | Yamazaki ...................... 345/103 |
| 6,771,247 B2 | 8/2004 | Sato et al. |
| 6,897,838 B2 | 5/2005 | Okamoto |
| 6,900,788 B2 * | 5/2005 | Yamazaki ...................... 345/103 |
| 7,071,930 B2 * | 7/2006 | Kondo et al. ................... 345/204 |
| 2001/0024187 A1 | 9/2001 | Sato et al. |
| 2001/0052887 A1 * | 12/2001 | Tsutsui et al. ................... 345/87 |
| 2002/0075249 A1 * | 6/2002 | Kubota et al. .................. 345/204 |
| 2002/0140642 A1 | 10/2002 | Okamoto |
| 2002/0175887 A1 | 11/2002 | Yamazaki |
| 2005/0012732 A1 * | 1/2005 | Koyama et al. ................ 345/205 |

FOREIGN PATENT DOCUMENTS

| EP | 0 974 952 A1 | 1/2000 |
| EP | 1 136 978 A2 | 9/2001 |
| EP | 1 577 874 A2 | 9/2005 |

(Continued)

OTHER PUBLICATIONS

International Search Report re application No. PCT/JP2006/315090, dated Oct. 31, 2006.

(Continued)

*Primary Examiner* — Richard Hjerpe
*Assistant Examiner* — Andrew Schnirel
(74) *Attorney, Agent, or Firm* — Husch Blackwell LLP

(57) ABSTRACT

In order to achieve lower power consumption, a technique of performing display (partial display) by utilizing only a part of a display area is used. For example, a display area is divided, a plurality of driver circuits for driving the divided display areas independently are provided, and only a region where a fixed pattern is displayed is driven in a power saving mode, thereby partial display is performed; however, display cannot be performed at an arbitrary position. Alternatively, partial display can be performed by inputting a video signal to a pixel in an arbitrary display area; however, a structure of a driver circuit is complicated. The object of the invention is to provide a display device which can perform partial display at an arbitrary position and reduce power consumption. In partial display, operation of a signal line driver circuit is set so as to be stopped and a non-display signal is set so as to be outputted from the signal line driver circuit when a pixel in a non-display area is selected.

9 Claims, 42 Drawing Sheets

FOREIGN PATENT DOCUMENTS

| | | |
|---|---|---|
| EP | 1 583 071 A2 | 10/2005 |
| EP | 1 600 931 A2 | 11/2005 |
| JP | 2001-264814 | 9/2001 |
| JP | 2001-356746 | 12/2001 |
| JP | 2002-287695 | 10/2002 |
| JP | 2002-297105 | 10/2002 |
| JP | 2002-297106 | 10/2002 |
| JP | 2003-162263 | 6/2003 |
| WO | WO 99/40561 A1 | 8/1999 |

OTHER PUBLICATIONS

Written Opinion re application No. PCT/JP2006/315090, dated Oct. 31, 2006.

* cited by examiner

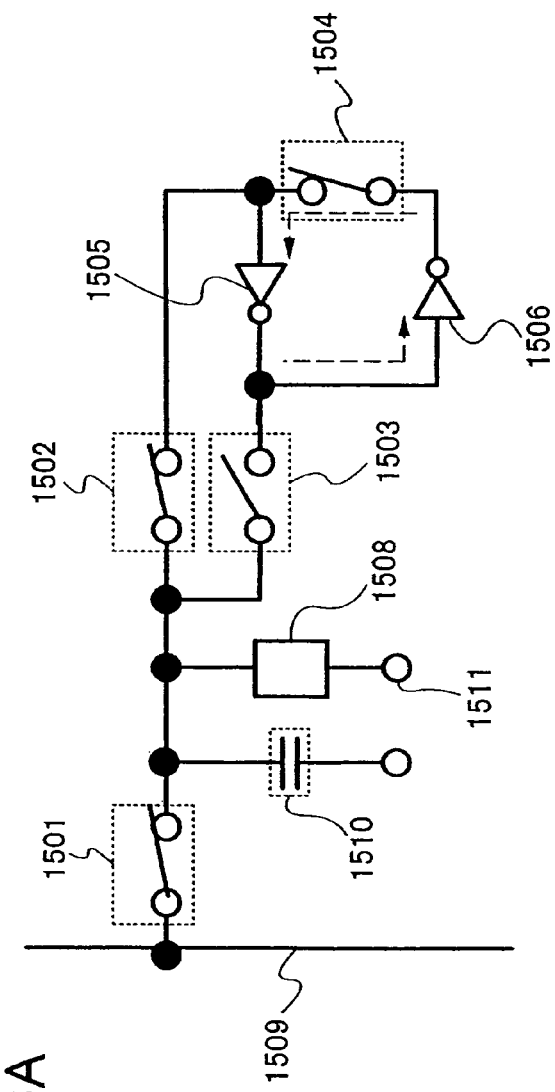
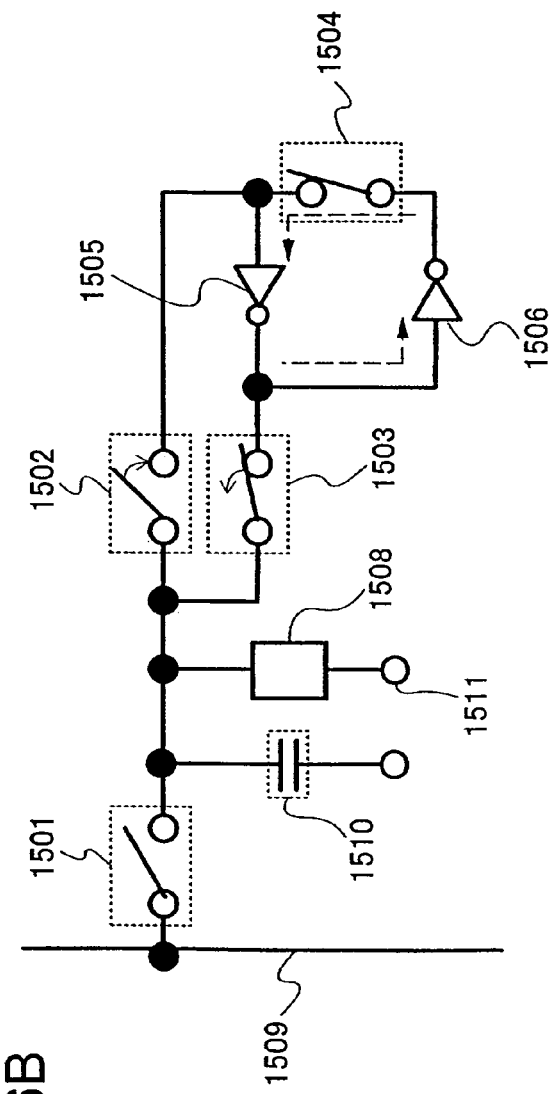
FIG. 16A
FIG. 16B

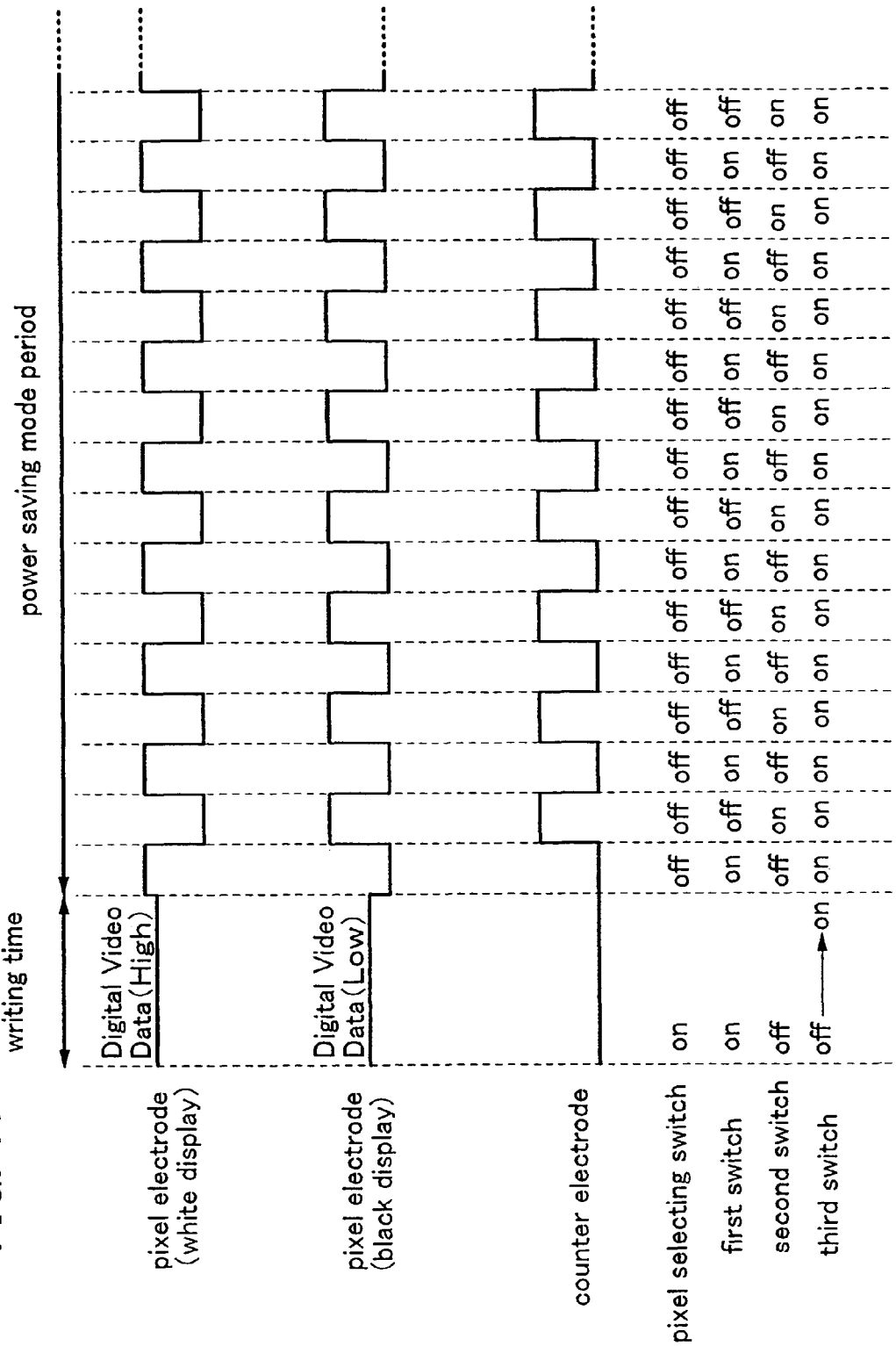

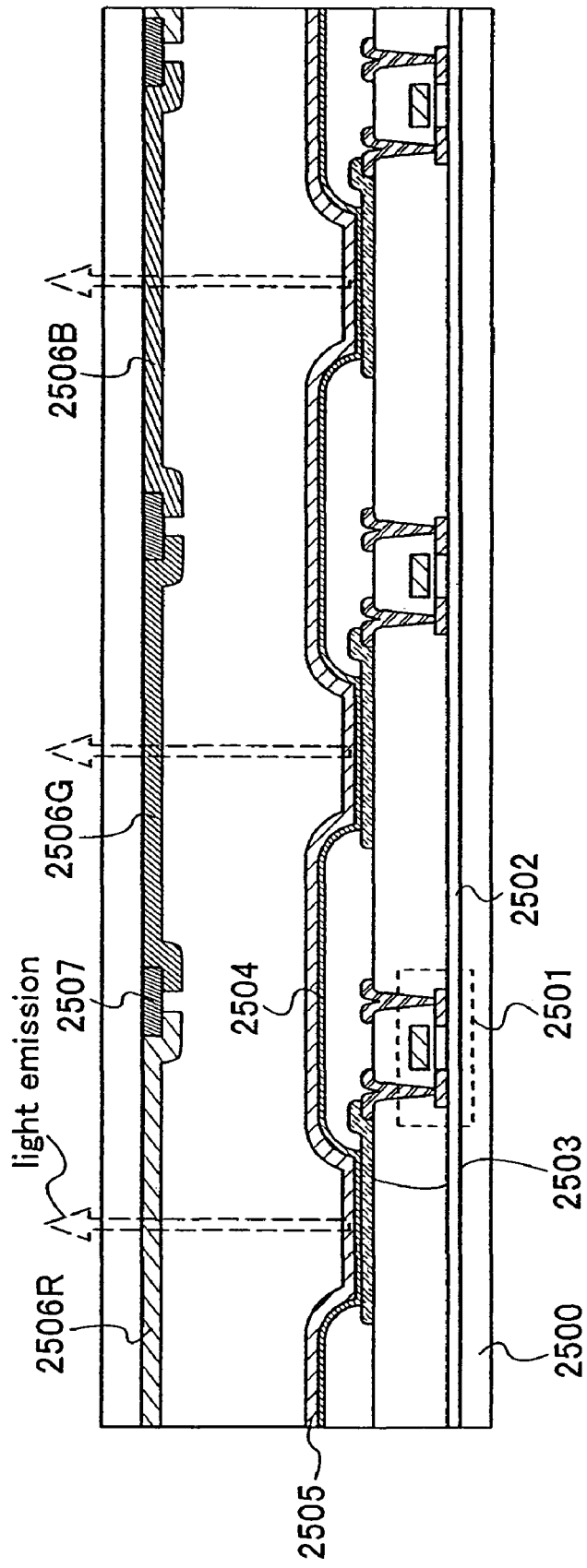

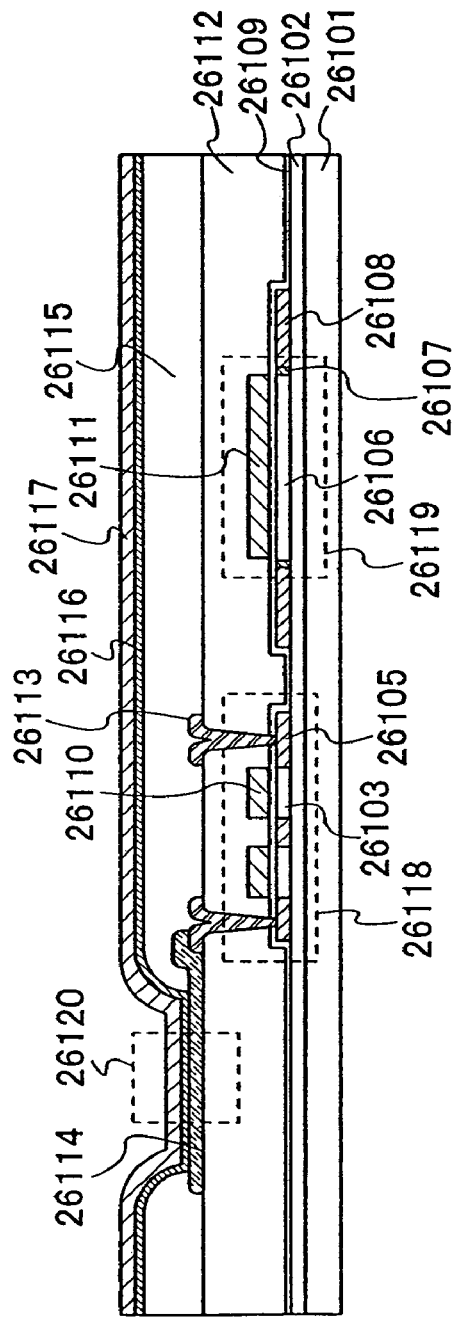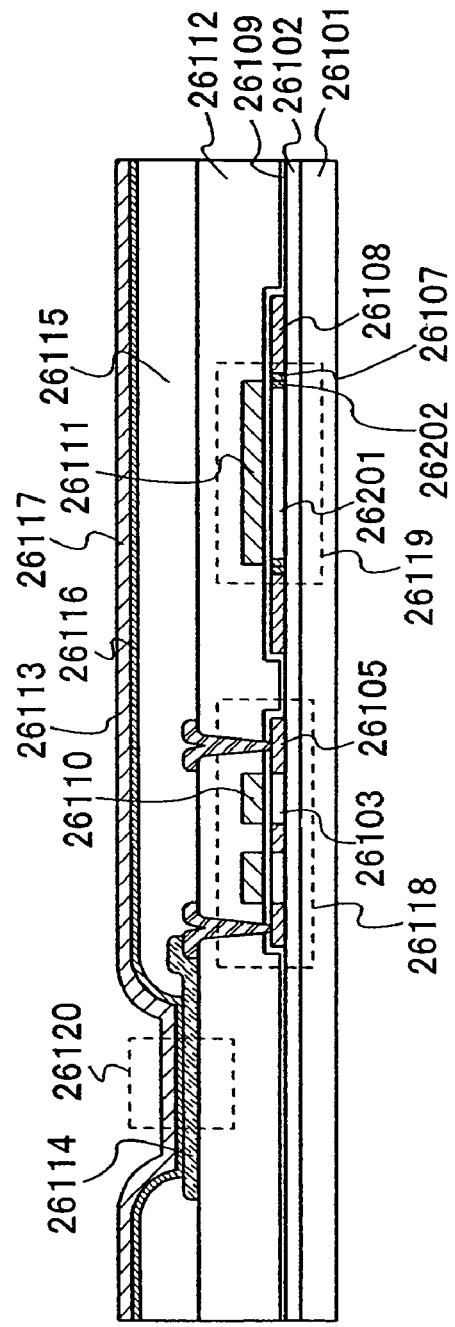

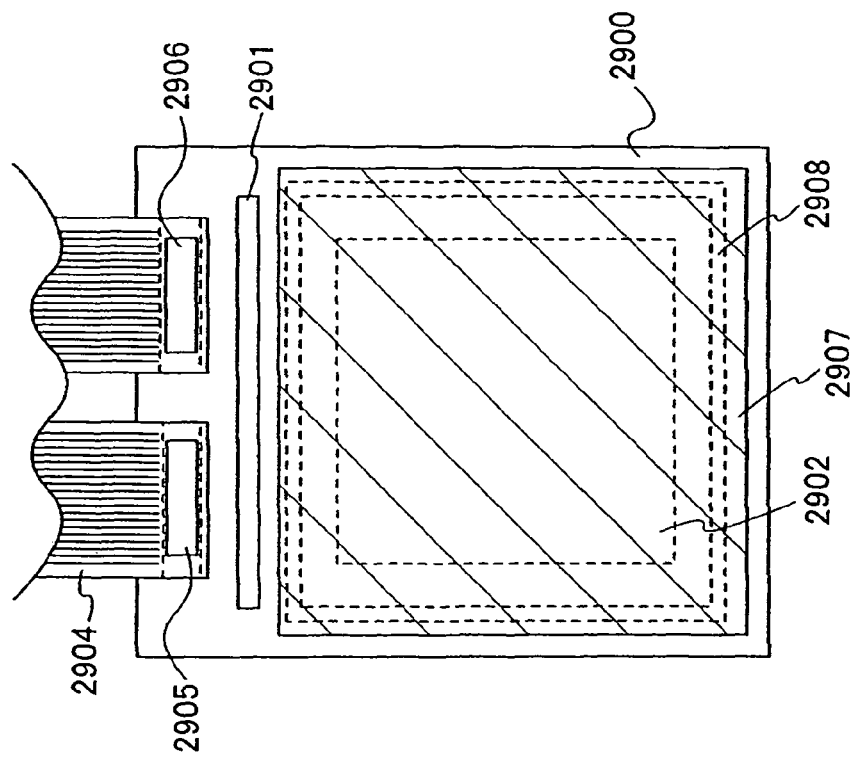

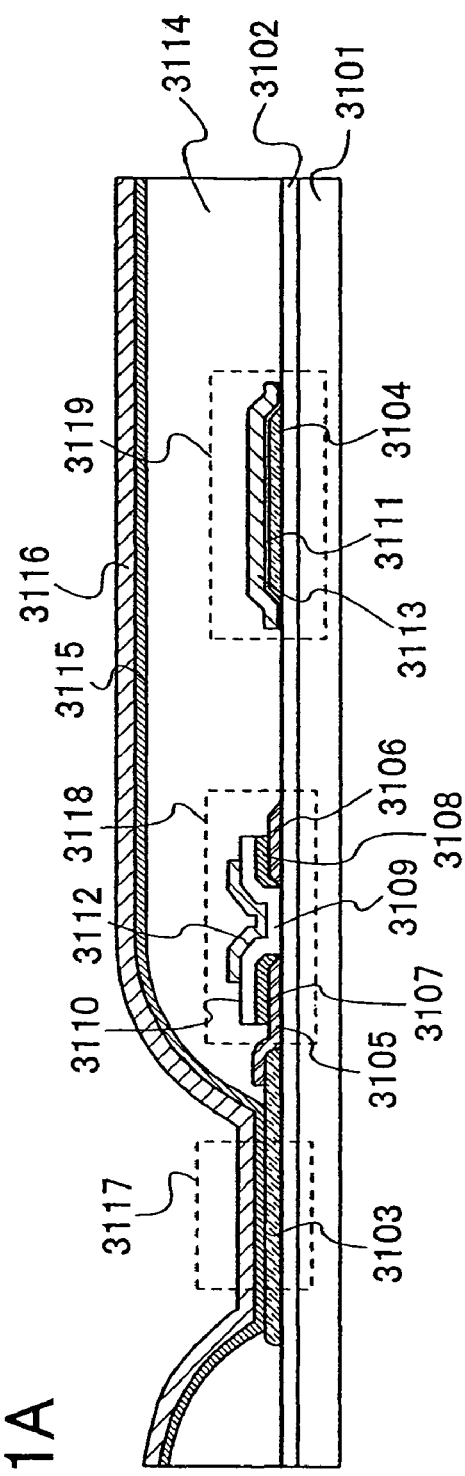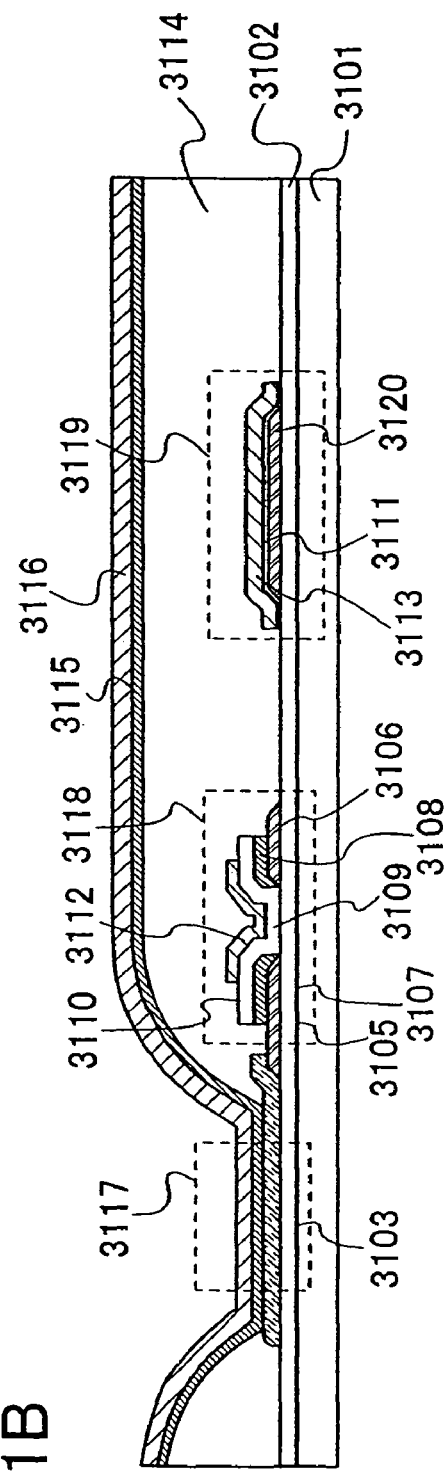

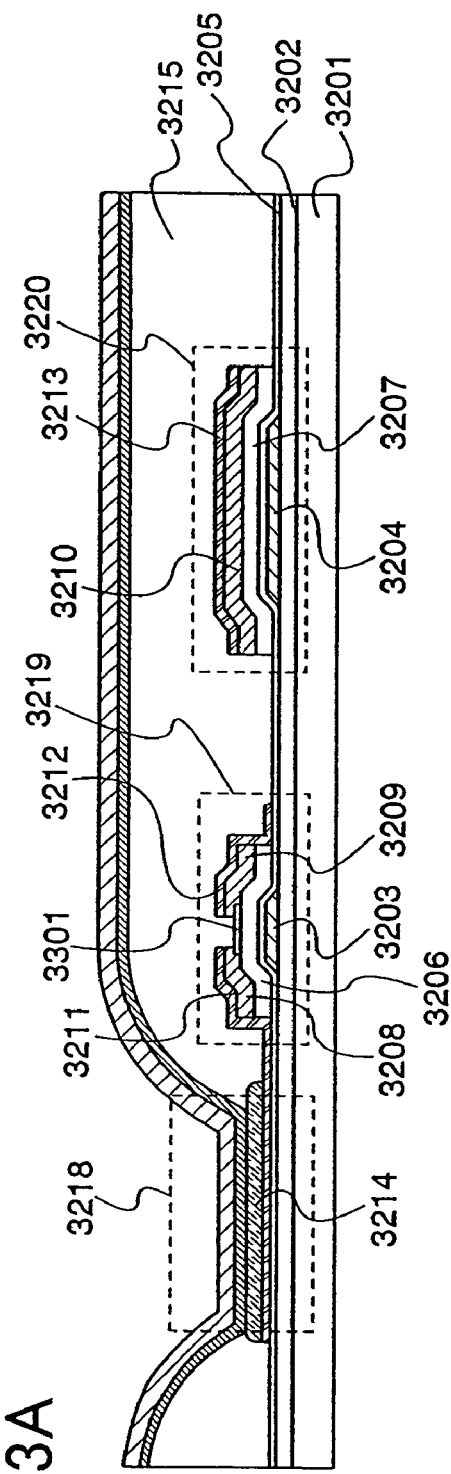
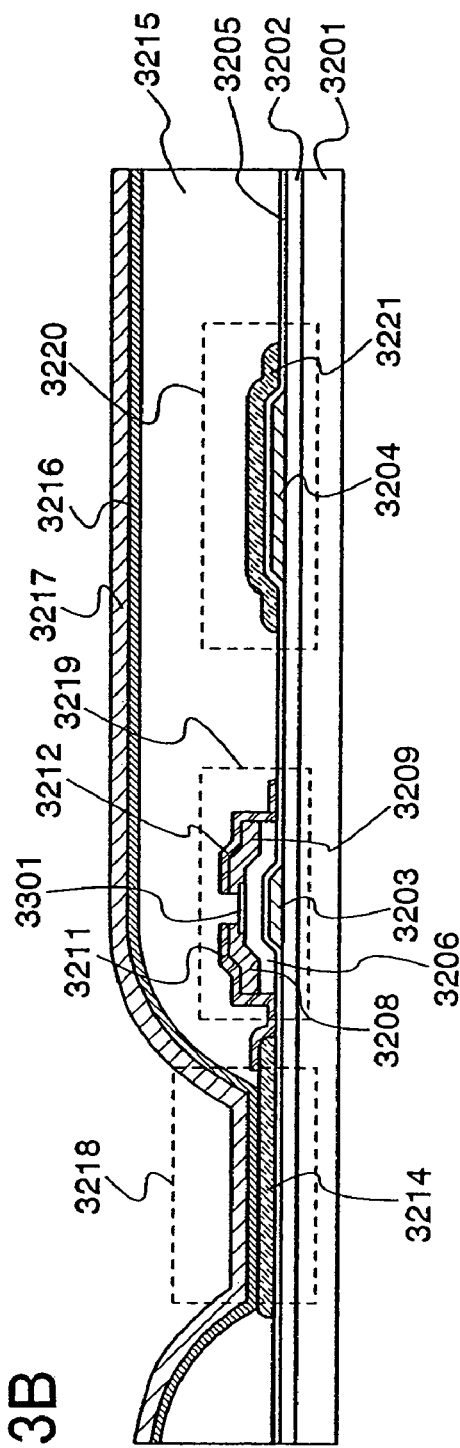
FIG. 33A
FIG. 33B

DISPLAY DEVICE FOR PARTIAL DISPLAY

TECHNICAL FIELD

The present invention relates to an active matrix display device in which a plurality of pixels are arranged in matrix, and particularly relates to a display device which performs partial display by utilizing a part of a plurality of pixels and a driving method thereof. In addition, the invention relates to an electronic appliance having the display device in a display portion.

BACKGROUND ART

A liquid crystal display (LCD) which is a display device formed of a display element such as a liquid crystal is widely used. On the other hand, in recent years, a so-called self-light emitting display device, that is, a light-emitting device has been attracting attention, which has a pixel formed of a display element such as a light-emitting diode (LED). As a display element used for such a self-light emitting display device, an organic light-emitting diode (also referred to as OLED (Organic Light-Emitting Diode), an organic Light emitting element, electroluminescence (EL) element, or the like) has been attracting attention, and used for an EL display and the like. A display element such as an OLED is self-light emitting; therefore, it has advantages such as higher visibility of pixels, no backlight, and higher response speed compared to a liquid crystal display.

These days, an EL display has been particularly used in a display portion of a portable electrical appliance such as a mobile phone. In such a portable electrical appliance, still lower power consumption is required.

[Patent Document 1] Japanese Patent Laid-Open No. 2002-297106

DISCLOSURE OF INVENTION

In order to achieve lower power consumption, a technique of performing display (partial display) by utilizing only a part of a display area is used. For example, a display area is divided, a plurality of driver circuits for driving the divided display areas independently are provided, and only a region where a fixed pattern is displayed is driven in a power saving mode, thereby partial display is performed.

With such a structure, however, display cannot be performed at an arbitrary position. Further, since specifications are different depending on a model of a display device, respective driver circuits are required to be developed.

Alternatively, partial display can be performed by inputting a video signal to a pixel in an arbitrary display area. In the case of partial display, the number of times the signal is rewritten to a pixel in a non-display area is reduced, thereby lower power consumption can be achieved. (see Patent Document 1)

With such a structure, however, a structure of a driver circuit is complicated. Besides, power consumption is not sufficiently lowered.

The object of the invention is to provide a display device which can perform partial display at an arbitrary position and reduce power consumption.

In performing partial display, the display device of the invention stops inputting a clock signal to a signal line driver circuit and stops operation of a shift register circuit included in the signal line driver circuit when a pixel in a non-display area is selected, thereby a non-display signal is inputted to the pixel.

Hereinafter, a specific structure of the invention is described.

The display device of the invention includes a signal line driver circuit for outputting a signal to be written to a pixel and a scan line driver circuit for selecting a pixel to which a signal is written. The signal line driver circuit includes a switching circuit for outputting a predetermined signal from the signal line driver circuit while the scan line driver circuit selects a pixel and the signal line driver circuit stops operating.

Further, the display device of the invention includes a signal line driver circuit for outputting a signal to a signal line to be written to a pixel and a scan line driver circuit for selecting a pixel to which the signal is written. The signal line driver circuit includes a shift register circuit, a latch circuit, and a switching circuit. The switching circuit has a switch which electrically connects between the signal line and an output terminal of the latch circuit, or a wire to which a predetermined potential is applied.

Further, the display device of the invention includes a pixel portion provided with a plurality of pixels, a signal line driver circuit for outputting a signal to be written to a pixel, a scan line driver circuit for selecting a pixel to which a signal is written, and a control unit for stopping operation of the signal line driver circuit. The pixel includes a unit for holding an analog voltage and a unit for storing a digital signal. A predetermined signal is outputted from the signal line driver circuit while a pixel is selected by the scan line driver circuit and the signal line driver circuit stops operating.

Further, in the display device of the invention having the aforementioned structure, the unit for storing the digital signal stores the predetermined signal.

Further, in the display device of the invention having the aforementioned structure, the pixel includes a liquid crystal display element.

The invention provides a driving method of a display device which includes a shift register circuit, a latch circuit, and a switching circuit in a signal line driver circuit, and can perform partial display. In performing partial display, while a pixel in a display area is selected, a signal outputted from the latch circuit is supplied to a signal line by the switching circuit, whereas while a pixel in a non-display area is selected, a non-display signal is supplied to the signal line by the switching circuit. While a pixel in the display area is selected, a clock signal is inputted to the shift register circuit, whereas when a pixel in the non-display area starts to be selected, a clock signal stops being inputted to the shift register circuit. When shifting from selection of a pixel in the non-display area to a pixel in the display area, a clock signal starts to be inputted to the shift register circuit no less than one horizontal period prior to the start of selection of the pixel in the display area.

Further, the invention provides a driving method of a display device which includes a shift register circuit and a switching circuit in a signal line driver circuit, and can perform partial display. In performing partial display, while a pixel in a display area is selected, a signal outputted from a video line is supplied to a signal line through the switching circuit, whereas while a pixel in a non-display area is selected, a non-display signal is supplied to the signal line through the switching circuit. While a pixel in the display area is selected, a clock signal is inputted to the shift register circuit, whereas while a pixel in the non-display area is selected, a clock signal stops being inputted to the shift register circuit.

A switch used in this specification may be anything such as an electrical switch or a mechanical switch as far as it can control a current flow. It may be a transistor, a diode, or a logic circuit configured with them. Therefore, in the case of using a transistor as a switch, polarity (conductivity) thereof is not particularly limited because it operates just as a switch. However, when an off current is preferred to be small, a transistor of polarity with a small off current is preferably used. For example, a transistor which has an LDD region or a multi-gate structure has a small off current. Further, it is desirable that an n-channel transistor be employed when a potential of a source terminal of the transistor operating as a switch is closer to a low potential side power source (Vss, GND, 0 V or the like), whereas a p-channel transistor be employed when a potential of the source terminal is closer to the high potential side power source (Vdd or the like). This helps the switch operate efficiently since the absolute value of the gate-source voltage of the transistor can be increased. It is to be noted that a CMOS switch can also be applied by using both n-channel and p-channel transistors.

In the invention, "being connected" means "being electrically connected". Therefore, another element, switch, or the like may be provided in the predetermined connection.

Note that various modes can be applied to a display element. For example, a display medium in which contrast is changed by an electromagnetic effect can be used, such as a light emitting element (organic light emitting element, inorganic light emitting element, light emitting element containing organic material and inorganic material), an electron discharging element, a liquid crystal element, an electron ink, a light diffraction element, a discharging element, a digital micromirror device (DMD), a piezoelectric element, or a carbon nanotube. It is to be noted that an EL panel type display device using a light emitting element includes an EL display; a display device using an electron discharging element includes a field emission display (FED), an SED type flat panel display (Surface-conduction Electron-emitter Display), and the like; a liquid crystal panel type display device using a liquid crystal element includes a liquid crystal display; a digital paper type display device using an electron ink includes electronic paper; a display device using a light diffraction element includes a grating light valve (GLV) type display; a PDP (Plasma Display Panel) type display using a discharging element includes a plasma display; a DMD panel type display device using a digital micromirror device includes a digital light processing (DLP) type display device; a display device using a piezoelectric element includes a piezoelectric ceramic display; a display device using a carbon nanotube includes a nano emissive display (NED) and the like.

It is to be noted that kinds of transistors applicable to the invention are not limited. Accordingly, the following transistors are applicable to the invention: a thin film transistor (TFT) using a non-single crystalline semiconductor film typified by amorphous silicon and polycrystalline silicon; a MOS transistor which is formed using a semiconductor substrate or an SOI substrate; a junction transistor; a bipolar transistor; a transistor using an organic semiconductor or a carbon nanotube; and other transistors. Kinds of substrates over which a transistor is provided are not limited; therefore, a transistor can be provided over a single crystalline substrate, an SOI substrate, a glass substrate, a plastic substrate, or the like.

It is to be noted that any type of transistor can be used and formed over any substrate as a transistor of the invention. Therefore, all of the circuits may be formed over a glass substrate, a plastic substrate, a single crystalline substrate, an SOI substrate, or any substrate. Alternatively, a part of a circuit may be formed over a certain substrate and another part of the circuit may be formed over another substrate. That is, not all of the circuit is required to be formed over the same substrate. For example, a part of a circuit may be formed over a glass substrate using a TFT and another part of the circuit may be formed over a single crystalline substrate into an IC chip which may be provided over the glass substrate by COG (Chip On Glass). Alternatively, the IC chip may be connected to a glass substrate using TAB (Tape Auto Bonding) or a printed substrate.

It is to be noted in the invention that one pixel corresponds to one element which can control brightness. Therefore, for example, one pixel expresses one color element by which brightness is expressed. Accordingly, in the case of a color display device formed of color elements of R (red), G (green), and B (blue), the smallest unit of an image is formed of three pixels of an R pixel, a G pixel, and a B pixel. It is to be noted that a color element is not limited to be formed of three colors, and may be formed of more than three colors or a color other than RGB. For example, RGB to which white is added (RGBW) or RGB to which one or more colors selected from yellow, cyan, magenta, emerald green, vermilion, and the like are added can be employed. Alternatively, a similar color to at least one of RGB may be added to RGB, for example, R, G, B1, B2 may be employed. Although B1 and B2 are both blue, they have slightly different frequencies. By using such a color element, an image closer to a real thing can be displayed and power consumption can be reduced. Further, as another example, in the case of controlling the brightness of one color element by using a plurality of regions, one of the plurality of regions corresponds to one pixel. Therefore, for example, in the case of performing an area gray scale display, a plurality of regions for controlling the brightness are provided for one color element, which express a gray scale as a whole. One of the regions for controlling the brightness corresponds to one pixel. Therefore, in this case, one color element is formed of a plurality of pixels. Moreover, in this case, regions which contribute to display may differ in size depending on the pixel. In the plurality of regions for controlling the brightness provided for one color element, that is, a plurality of pixels which constitute one color element, the viewing angle may be expanded by supplying each pixel with a slightly different signal.

It is to be noted in this specification that the case where pixels are arranged in matrix corresponds to a case where pixels are arranged in a grid pattern where longitudinal stripes and lateral stripes cross each other or to a case where three color elements that are minimum elements of one image are arranged in what is called a delta pattern when a full color display is performed using the three color elements (for example, RGB). Further, the size of a pixel may be different depending on the color element.

It is to be noted that a transistor is an element having at least three terminals including a gate electrode, a drain region, and a source region. A channel forming region is provided between a drain region and a source region. Here, it is difficult to determine the source region or the drain region since they depend on the structure, operating condition, and the like of the transistor. Therefore, in this embodiment mode, each of the region functioning as a source and the region functioning as a drain may be referred to as a first terminal or a second terminal.

It is to be noted in this specification that a semiconductor device corresponds to a device including a circuit having a semiconductor element (transistor, diode, or the like). Further, a display device may include not only a main body of a display panel in which a plurality of pixels including display elements and a peripheral driver circuit for driving the pixels are formed over a substrate but also the one provided with a flexible printed circuit (FPC) or a printed wiring board (PWB). A light emitting device corresponds to a display device using a self-light emitting display element in particular.

In the invention, in performing partial display, when a pixel in a non-display area is selected by a scan line driver circuit, operation of a signal line driver circuit is stopped, thereby power consumption can be lowered.

BRIEF DESCRIPTION OF DRAWINGS

FIGS. 16A and 16B are diagrams showing operations of a pixel which can be applied to a display device of the invention.

FIG. 17 is a diagram showing an operation of a pixel which can be applied to a display device of the invention.

FIG. 25 is a diagram showing a display panel of the invention.

FIGS. 26A and 26B are diagrams showing structures of a transistor and a capacitor which can be applied to a pixel of the invention.

FIGS. 29A and 29B are diagrams showing display panels of the invention.

FIGS. 31A and 31B are diagrams showing structures of a transistor and a capacitor which can be applied to a pixel of the invention.

FIGS. 33A and 33B are diagrams showing structures of a transistor and a capacitor which can be applied to a pixel of the invention.

BEST MODE FOR CARRYING OUT THE INVENTION

Figure 1:
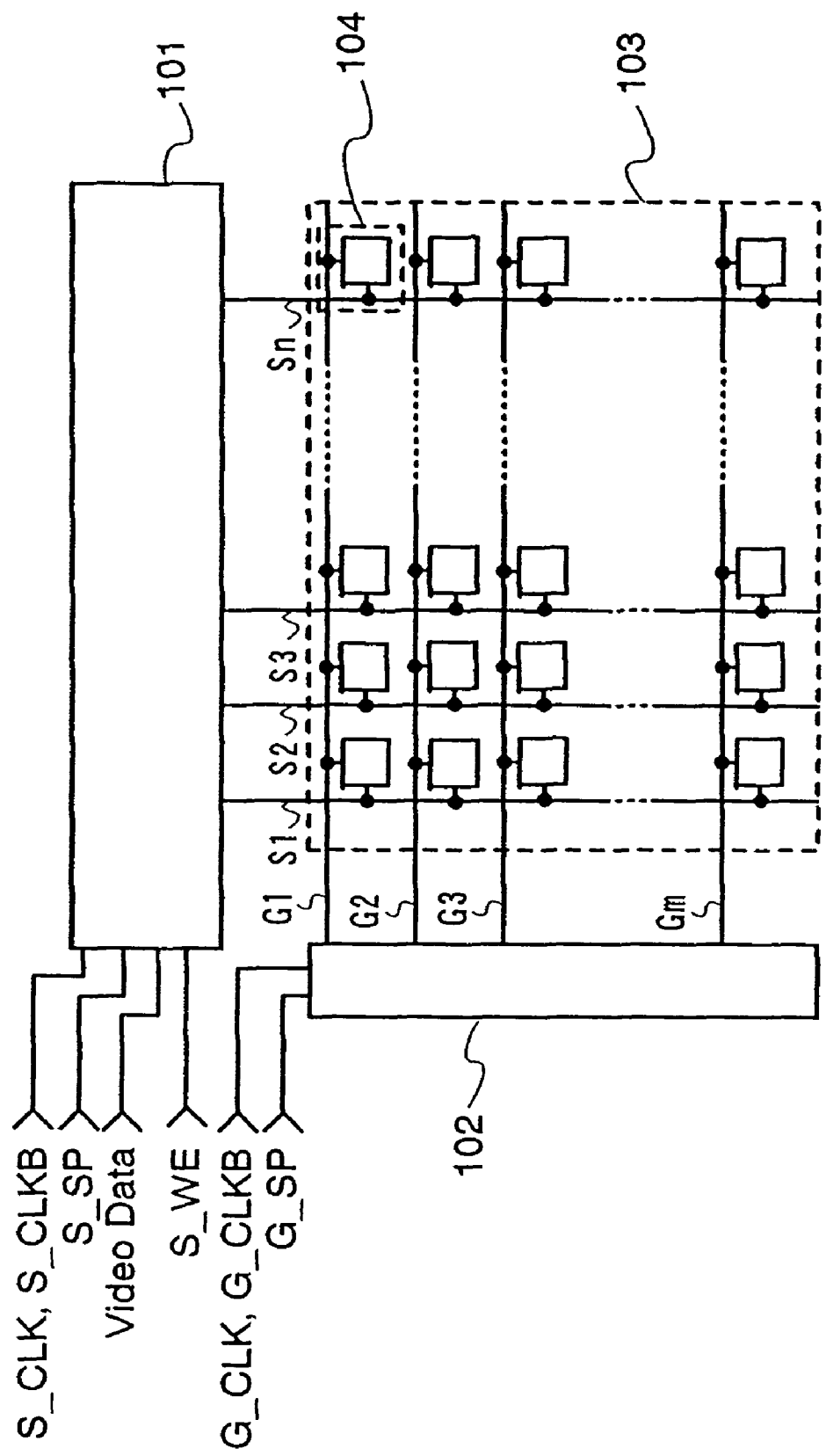
FIG. 1 is a diagram showing a display device of the invention.

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein.

A display device of the invention includes a pixel portion, a scan line driver circuit and a signal line driver circuit which drive the pixel portion. A plurality of scan lines are extended from the scan line driver circuit to the pixel portion. A plurality of signal lines are extended from the signal line driver circuit to the pixel portion. In addition, a plurality of pixels are arranged in matrix corresponding to the scan lines and the signal lines.

The scan line driver circuit supplies to a scan line a signal for selecting a pixel to which a signal is written. The signal line driver circuit supplies to a signal line a signal to be written to a pixel. That is, the signal outputted from the signal line driver circuit is written to a pixel selected by the scan line driver circuit.

The pixel has a display element, a unit for storing a written signal, and a unit for controlling drive of the display element. The pixel to which the signal is written stores the signal and keeps a state (lighting state or non-lighting state) in accordance with the signal.

Therefore, in the case of displaying an image, normally, all the pixels are selected and respective signals are written to the pixels, which enables display of a moving image or a still image.

Here, a display device of the invention can perform partial display. In the case of partial display, a part of the pixel portion (for example, pixels from an i-th row to a j-th row in the pixel portion) is a display area and the other part of the pixel portion is a non-display area. While the scan line driver circuit selects a non-display area, an operation of the signal line driver circuit is stopped. It is to be noted that the operation of the signal line driver circuit may be stopped all the while the scan line driver circuit selects the non-display area. Alternatively, the operation of the signal line driver circuit may be stopped in a part of the period when the scan line driver circuit selects the non-display area as well.

It is to be noted that the case where the operation of the signal line driver circuit is stopped corresponds to, for example, a case where a clock signal (CLK), an inverted clock signal (CLKB), and the like stop to be inputted to the signal line driver circuit, thereby operation of a shift register circuit in the signal line driver circuit is stopped. That is, operation of a shift register circuit is stopped, which outputs a sampling pulse for taking timing to convert video signals serially inputted to the signal line driver circuit into parallel video signals corresponding to pixels of each column.

While the operation of the signal line driver circuit is stopped, a non-display signal is supplied from the signal line driver circuit to a signal line, thereby the non-display signal can be inputted to a pixel selected by a scan line.

It is to be noted that the non-display signal is not limited to a signal which makes a pixel emit no light. That is to say, a pixel to which the non-display signal is inputted in the pixel portion may form a background image independent of display. The background image may be displayed in white or black as far as lower power consumption of the display device can be achieved.

In this manner, in partial display, operation of the shift register circuit which operates at high speed in the signal line driver circuit is stopped. As a result, power consumption can be lowered.

Embodiment Mode 1

In this embodiment mode, description is made with reference to FIG. 1 of a basic structure of a display device having a normal display mode and a power saving mode, which includes a unit for stopping operation of a shift register circuit in a signal line driver circuit when the power saving mode is selected.

The display device includes a signal line driver circuit 101, a scan line driver circuit 102, and a pixel portion 103. In addition, a plurality of signal lines S1 to Sn are extended from the signal line driver circuit 101 to the pixel portion 103, and a plurality of scan lines G1 to Gm are extended from the scan line driver circuit 102 to the pixel portion 103. Further, a plurality of pixels 104 are arranged in matrix corresponding to the scan lines G1 to Gm and the signal lines S1 to Sn in the pixel portion 103. That is, a pixel of p-th row and q-th column is connected to a scan line Gp (one of the scan lines G1 to Gm) and a signal line Sq (one of the signal lines S1 to Sn).

Signals such as a clock signal (G_CLK), an inverted clock signal (G_CLKB), and a start pulse signal (G_SP) are inputted to the scan line driver circuit 102.

The clock signal (G_CLK) is a signal alternating between H (High) and L (Low) at regular intervals, and the inverted clock signal (G_CLKB) is a signal having an inverted polarity of the clock signal (G_CLK). Note that a clock signal and an inverted clock signal may be collectively referred to as a clock signal. In accordance with these signals, the scan line driver circuit 102 is synchronized and the timing to execute a process is controlled. Therefore, when the start pulse signal (GASP) is inputted to the scan line driver circuit 102, a scan signal selecting each pixel row is generated in accordance with the clock signal (G_CLK) and the inverted clock signal (G_CLKB). In other words, the scan signal is a signal sequentially selecting pixels per row through the scan lines connected to the scan line driver circuit 102.

Signals such as a clock signal (S_CLK), an inverted clock signal (S_CLKB), a start pulse signal (S_SP), a video signal (Video Data), and a control signal (S_WE) are inputted to the signal line driver circuit 101.

The clock signal (S_CLK) is a signal alternating between H (High) and L (Low) at regular intervals, and the inverted clock signal (S_CLKB) is a signal having an inverted polarity of the clock signal (S_CLK). In accordance with these signals, the signal line driver circuit 101 is synchronized and the timing to execute a process is controlled. Thus, when the start pulse signal (S_SP) is inputted to the signal line driver circuit 101, a sampling pulse corresponding to a column of a pixel is generated in accordance with the clock signal (S_CLK) and the inverted clock signal (S_CLKB). In other words, the sampling pulse is a signal for controlling the timing to convert a video signal to be written to a pixel into data of a column of the pixel when the video signal is inputted to the signal line driver circuit 101. Therefore, in accordance with this sampling pulse, a video signal (Video Data) inputted to the signal line driver circuit 101 as serial data can be converted into parallel data. Note that in the case of a line sequential display device, this parallel data of the video signal is held in the signal line driver circuit 101 and supplied simultaneously to each of the signal lines S1 to Sn. In addition, in the case of a dot sequential display device, serial data of the video signal is converted into parallel data of the video signal and supplied to each of the signal lines S1 to Sn in accordance with the timing of the sampling pulse. In this manner, the signal line driver circuit 101 supplies a video signal corresponding to pixels of each column to each of the signal lines S1 to Sn.

Accordingly, a pixel row to which a signal is written is selected at the timing of the scan signal generated by the scan line driver circuit 102. Then, the video signal supplied from the signal line driver circuit 101 to the signal lines S1 to Sn is written to the pixels 104 of each column in the selected pixel row. Each pixel 104 stores data of the video signal written thereto for a certain period.

When a normal display mode is selected, pixel rows are sequentially selected, and the video signal corresponding to each pixel 104 is written to all the pixels 104. Note that each pixel 104 can maintain a lighting or non-lighting state by holding data of the signal written thereto for a certain period.

When a power saving mode is selected, partial display is performed. In the case of partial display, a part of the pixel portion 103 (for example, pixels from an i-th row to a j-th row in the pixel portion) is used as a display area and the other part of the pixel portion 103 is used as a non-display area. While the scan line driver circuit 102 selects the non-display area, operation of the signal line driver circuit 101 is stopped. It is to be noted that the operation of the signal line driver circuit 101 is not required to be stopped all the while the scan line driver circuit 102 selects the non-display area. Alternatively, the operation of the signal line driver circuit 101 may be stopped in a part of period when the scan line driver circuit 102 selects the non-display area.

It is to be noted that the case where the operation of the signal line driver circuit 101 is stopped corresponds to, for example, a case where a clock signal (CLK), an inverted clock signal (CLKB), and the like stop to be inputted to the signal line driver circuit 101, thereby operation of a shift register circuit in the signal line driver circuit 101 is stopped. That is, operation of a shift register circuit is stopped, which outputs a sampling pulse for taking timing to convert video signals serially inputted to the signal line driver circuit 101 into parallel video signals corresponding to pixels of each column.

While the operation of the signal line driver circuit 101 is stopped, a non-display signal is supplied from the signal line driver circuit 101 to the signal lines S1 to Sn, thereby the non-display signal can be inputted to a pixel selected by a scan line. It is to be noted that the non-display signal is not limited to a signal which makes a pixel emit no light. That is to say, a pixel to which the non-display signal is inputted in the pixel portion may form a background image independent of display. The background image may be displayed in white or black as far as lower power consumption of the display device can be achieved. In the case where an analog signal is inputted to the pixel 104, a non-display signal may be an arbitrary signal expressing a certain gray scale level. For example, when the non-display area is always in a non-lighting state, progress of deterioration considerably differs between a pixel in the display area and a pixel in the non-display area, which causes an image burn-in phenomenon. Therefore, the non-display signal is preferably a signal of an averaged gray scale level in the pixel portion.

Figure 2:
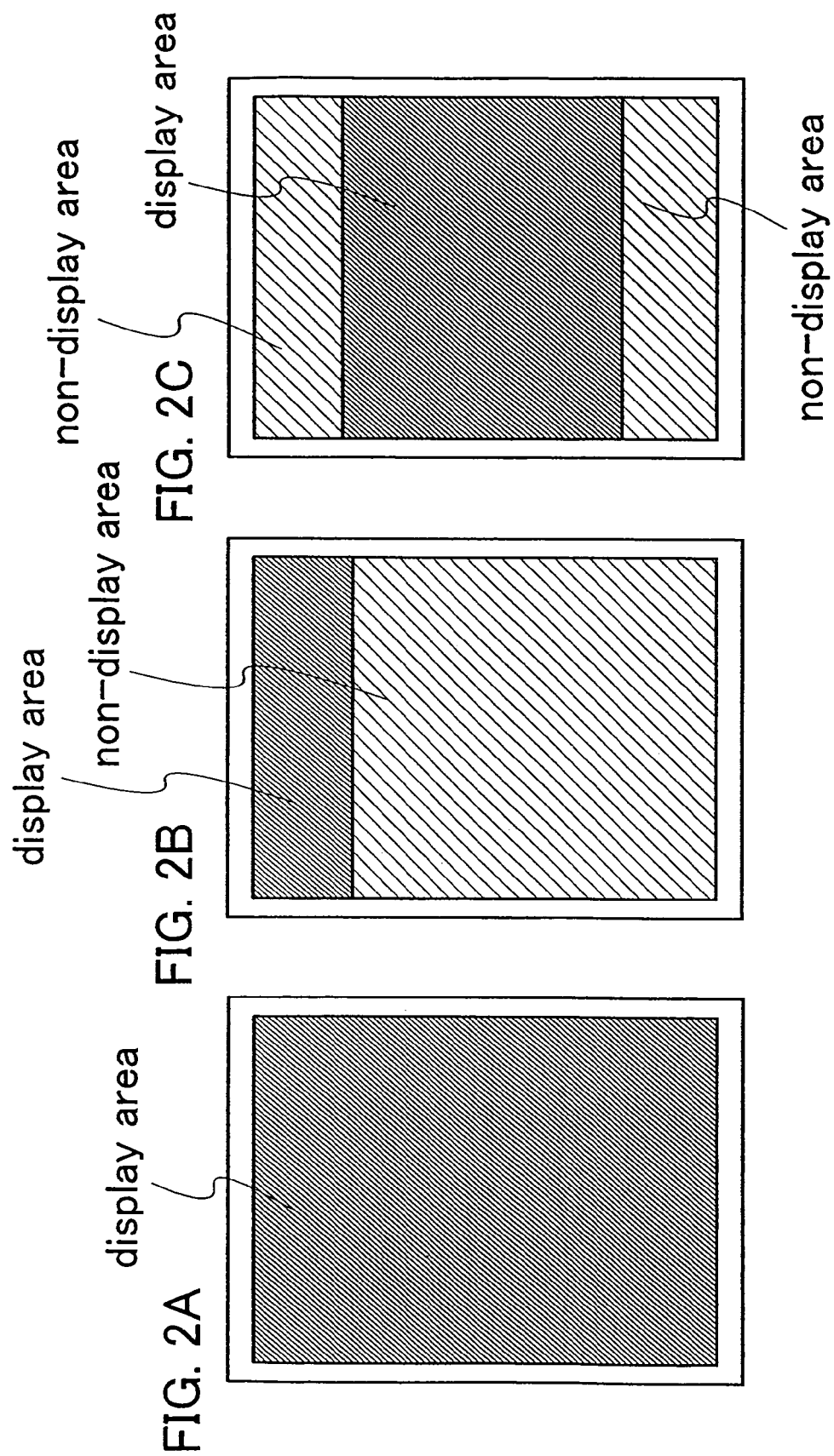
FIGS. 2A to 2C are diagrams each showing a display device of the invention.

In this manner, in the normal display mode, whole area display can be performed, whereas in the power saving mode, partial display can be performed. For example, in the normal display mode, whole area display can be performed as shown in FIG. 2A, whereas in the power saving mode, an upper portion of a display screen can be used as a display area and a lower portion of the display screen can be used as a non-display area as shown in FIG. 2B, or upper and lower portions of the display screen can be non-display areas and an area between the upper and lower portions of the display screen can be a display area as shown in FIG. 2C. In the power saving mode, power consumption can be drastically reduced.

Figure 11:
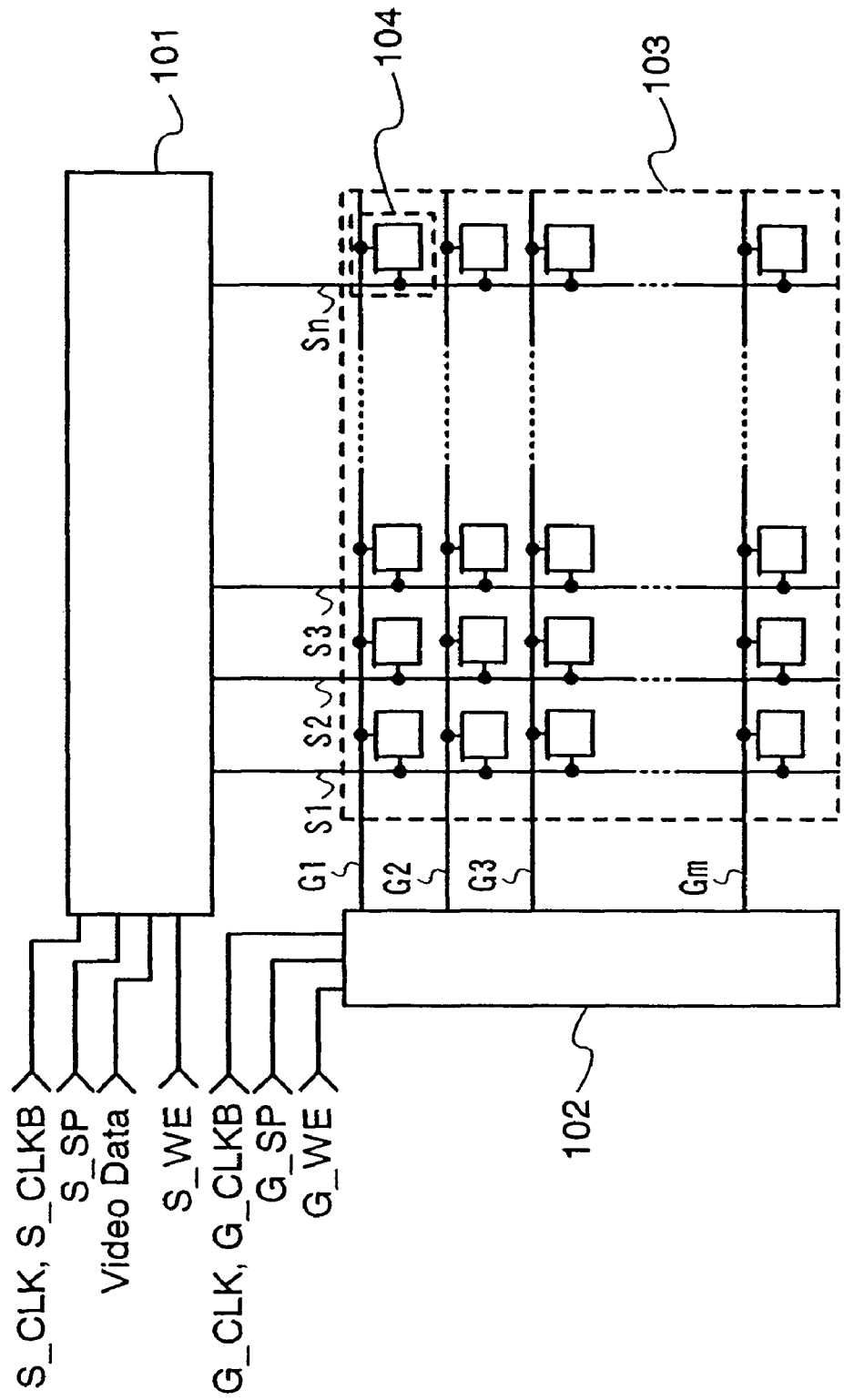
FIG. 11 is a diagram showing a display device of the invention.

It is to be noted that a pixel in the non-display area may be set so as not to be selected. That is to say, a control signal (G_WE) is inputted to the scan line driver circuit 102 as a display device shown in FIG. 11. For example, when the control signal (G_WE) is at an L level, a pixel is selected in accordance with an output of a shift register circuit in the scan line driver circuit 102. On the other hand, when the control signal (G_WE) is at an H level, all the pixels may be set so as not to be selected.

Figure 4:
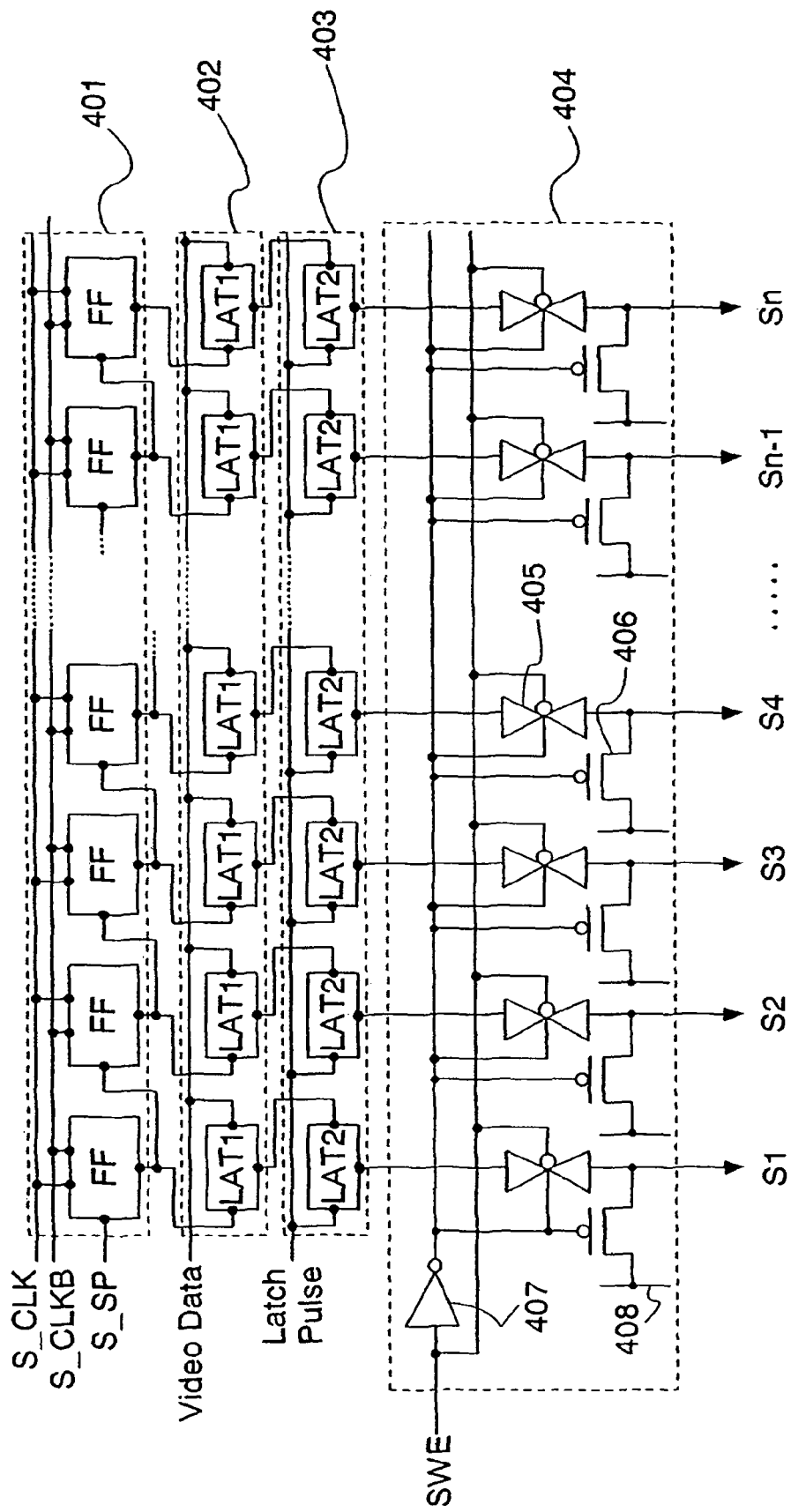
FIG. 4 is a signal line driver circuit which can be applied to a display device of the invention

Subsequently, FIG. 4 shows an example of a signal line driver circuit which can be applied to a display device of this embodiment mode.

The signal line driver circuit shown in FIG. 4 includes a shift register circuit 401, a first latch circuit 402, a second latch circuit 403, and a switching circuit 404. The switching circuit 404 has an analog switch 405 and a transistor 406 at each stage. Each analog switch 405 is connected so as to electrically connect Or disconnect an output terminal at each stage of the second latch circuit 403 and each of the signal lines S1 to Sn. Further, each transistor 406 is connected so as to electrically connect or disconnect a wire 408 and each of the signal lines S1 to Sn. It is to be noted that a potential to be a non-display signal inputted to each pixel is applied to the wire 408.

A clock signal (S_CLK), an inverted clock signal (S_CLKB), and a start pulse signal (S_SP) are inputted to the shift register circuit 401. In accordance with these signals, sampling pulses are sequentially outputted.

The sampling pulses outputted from the shift register circuit 401 are inputted to the first latch circuit 402, and video signals (Video Data) are held in the first latch circuit 402 in accordance with timing of the sampling pulse.

After holding of the video signals is completed up to the last stage in the first latch circuit 402, latch pulses are inputted to the second latch circuit 403 and the video signals held in the first latch circuit 402 in a horizontal retrace period are simultaneously transmitted to the second latch circuit 403.

The video signals transmitted to the second latch circuit 403 are inputted to the switching circuit 404. A control signal (S_WE) is inputted to the switching circuit 404. The control signal controls whether the signals held in the second latch circuit 403 or the signal which puts a pixel in a non-displaying state is supplied to the signal lines S1 to Sn That is, a control signal (S_WE) and an inverted signal of the control signal (S_WE), which can be obtained through the inverter 407, are inputted to a control terminal of the analog switch 405. The inverted signal of the control signal (S_WE) is also inputted to a gate terminal of the transistor 406. Further, the analog switch 405 and the transistor 406 are turned on/off in a complimentary manner. When the analog switch 405 is in an on state, an output terminal at each stage of the second latch circuit 403 and each of the signal lines S1 to Sn are electrically connected, and the transistor 406 is turned off at this time. Meanwhile, when the analog switch 405 is turned off, an output terminal at each stage of the second latch circuit 403 and each of the signal lines S1 to Sn are electrically disconnected, and the transistor 406 is turned on at this time. As a result, the wire 408 connected to a source terminal of the transistor 406 and each of the signal lines S1 to Sn are electrically connected.

That is, when the control signal (S_WE) is at an H level, a non-display signal is outputted from the switching circuit 404 to a pixel, whereas when the control signal (S_WE) is at an L level, a video signal is outputted from the switching circuit 404 to a pixel.

Figure 3:
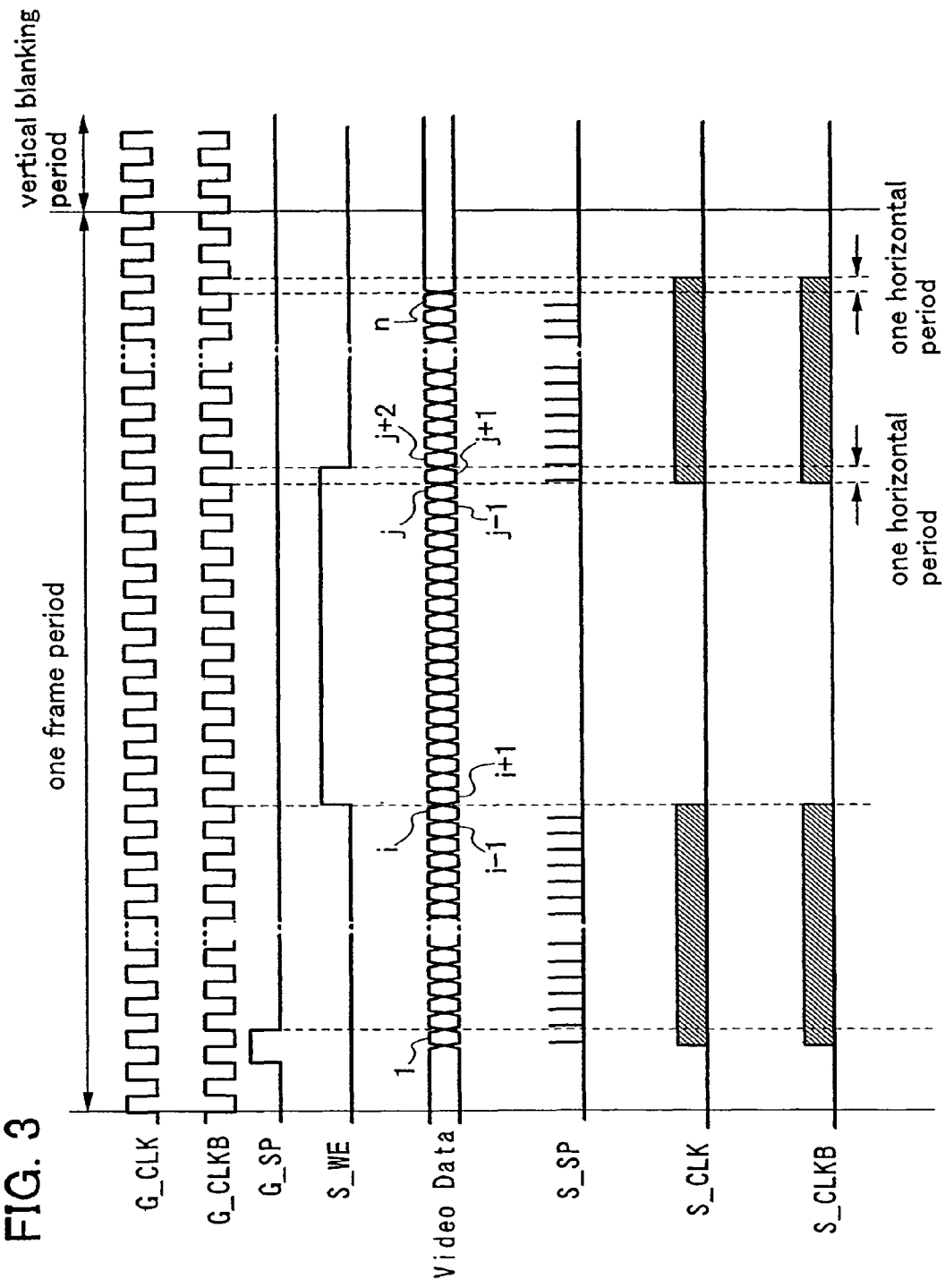
FIG. 3 is a timing chart of a display device of the invention.

Subsequently, FIG. 3 shows a timing chart in the case where upper and lower portions of the display screen are display areas and an area between the upper and lower portions (pixels from an i-th row to a j-th row) of the display screen is a non-display area in the power saving mode of the display device to which the signal line driver circuit of this structure is applied.

Note that when the control signal (S_WE) is at an H level, a non-display signal is outputted from a signal line driver circuit to a signal line. After a video signal of a pixel in an (i−1)th row is transmitted to the second latch circuit 403 so that the video signal is written to the pixel in an (i−1)th row, the control signal (S_WE) is shifted to from an L level to an H level. That is, while or immediately after a video signal of a pixel in an i-th row is inputted to the first latch circuit 402, the control signal (S_WE) is shifted from an L level to an H level.

Immediately after a video signal of a pixel in a (j+1)th row is transmitted to the second latch circuit 403 before a video signal of a pixel in a (j+2)th row is transmitted to the second latch circuit 403, the control signal (S_WE) is shifted from an H level to an L level.

Further, when the control signal (S_WE) is shifted from an L level to an H level, a clock signal (S_CLK) and an inverted clock signal (S_CLKB) stop to be inputted to the shift register circuit 401.

In the case where the clock signal (S_CLK) and the inverted clock signal (S_CLKB) are restored, they are restored no less than one horizontal period prior to the timing to shift the control signal (S_WE) from an H level to an L level. That is, the clock signal (S_CLK) and the inverted clock signal (S_CLKB) are restored before the video signal of the pixel in the (j+1)th row starts to be inputted to the first latch circuit 402.

While the control signal (S_WE) is at an H level, the video signal of the pixel in the (j+1)th row is transmitted from the first latch circuit 402 to the second latch circuit 403. When the control signal (S_WE) is shifted to an L level, the video signal of the pixel in the j+1)th row can be outputted from the signal line driver circuit to the signal line.

Note that while the clock signal (S_CLK) and the inverted clock signal (S_CLKB) stop to be inputted to the shift register circuit 401, a start pulse (S_SP) signal may also stop to be inputted.

Accordingly, central several rows (pixel rows from an i-th row to a j-th row) in a display screen become a non-display area, whereas upper and lower pixel rows except the central several rows (pixel rows from the first row to an (i−1)th row and pixel rows from a j+1)th row to an n-th row) in the display screen become display areas. In the case of partial display, high-speed operation of the signal line driver circuit can be stopped, thereby power consumption can be lowered.

Figure 40:
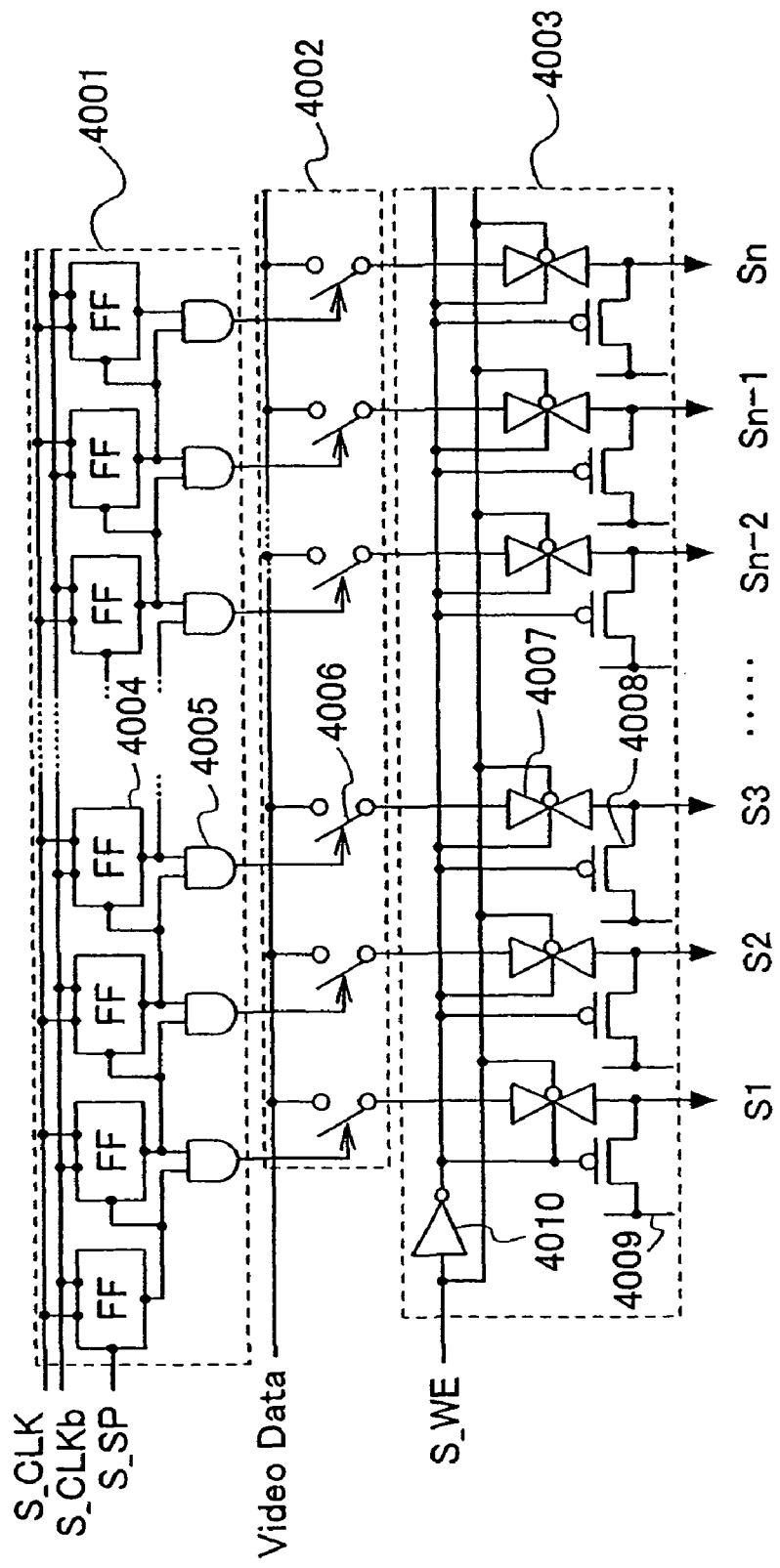
FIG. 40 shows a signal line driver circuit which can be applied to a display device of the invention.

Further, a display device of the invention is not limited to a line sequential driving display device including a signal line driver circuit shown in FIG. 4, and it may be a dot sequential driving display device. FIG. 40 shows a signal line driver circuit which can be applied to the dot sequential driving display device.

The signal line driver circuit shown in FIG. 40 includes a shift register 4001, a sampling switch 4002, and a switching circuit 4003. The shift register circuit 4001 includes plural stages of flip-flop circuits (FF) 4004 and AND circuits 4005. An input terminal of the AND circuit 4005 is connected to an output terminal of the adjacent flip-flop circuit (FF) 4004. Accordingly, a sampling pulse which sequentially shifts is outputted from an output terminal of each AND circuit 4005.

The sampling switch 4002 has a switch 4006 at each stage. An output terminal of the AND circuit 4005 at each stage is connected to a control terminal of the switch 4006 at each stage. Therefore, the switches 4006 are sequentially turned on in accordance with the sampling pulse.

Further, the switching circuit 4003 has an analog switch 4007 and a transistor 4008 at each stage. A video line to which a video signal is inputted is connected to signal lines S1 to Sn through the switch 4006 and the analog switch 4007 at each stage. Each transistor 4008 is connected so as to electrically connect or disconnect a wire 4009 and each of the signal lines S1 to Sn. Note that a potential to be a non-display signal which is inputted to each pixel is applied to the wire 4009.

That is to say, a control signal (S_WE) and an inverted signal of the control signal (S_WE), which can be obtained through an inverter 4010, are inputted to a control terminal of the analog switch 4007. The inverted signal of the control signal (S_WE) is also inputted to a gate terminal of the transistor 4008. Further, the analog switch 4007 and the transistor 4008 are turned on/off in a complimentary manner. When the analog switch 4007 is in an on state, a video line and each of the signal lines S1 to Sn are electrically connected, and the transistor 4008 is turned off at this time. Meanwhile, when the analog switch 4007 is turned off, a video line and each of the signal lines S1 to Sn are electrically disconnected, and the transistor 4008 is turned on at this time. As a result, the wire 4009 connected to a source terminal of the transistor 4008 and each of the signal lines S1 to Sn are electrically connected.

That is, when the control signal (S_WE) is at an H level, a non-display signal is outputted from the switching circuit 4003 to a pixel, whereas when the control signal (S_WE) is at an L level, a video signal is outputted from the switching circuit 4003 to a pixel.

Figure 41:
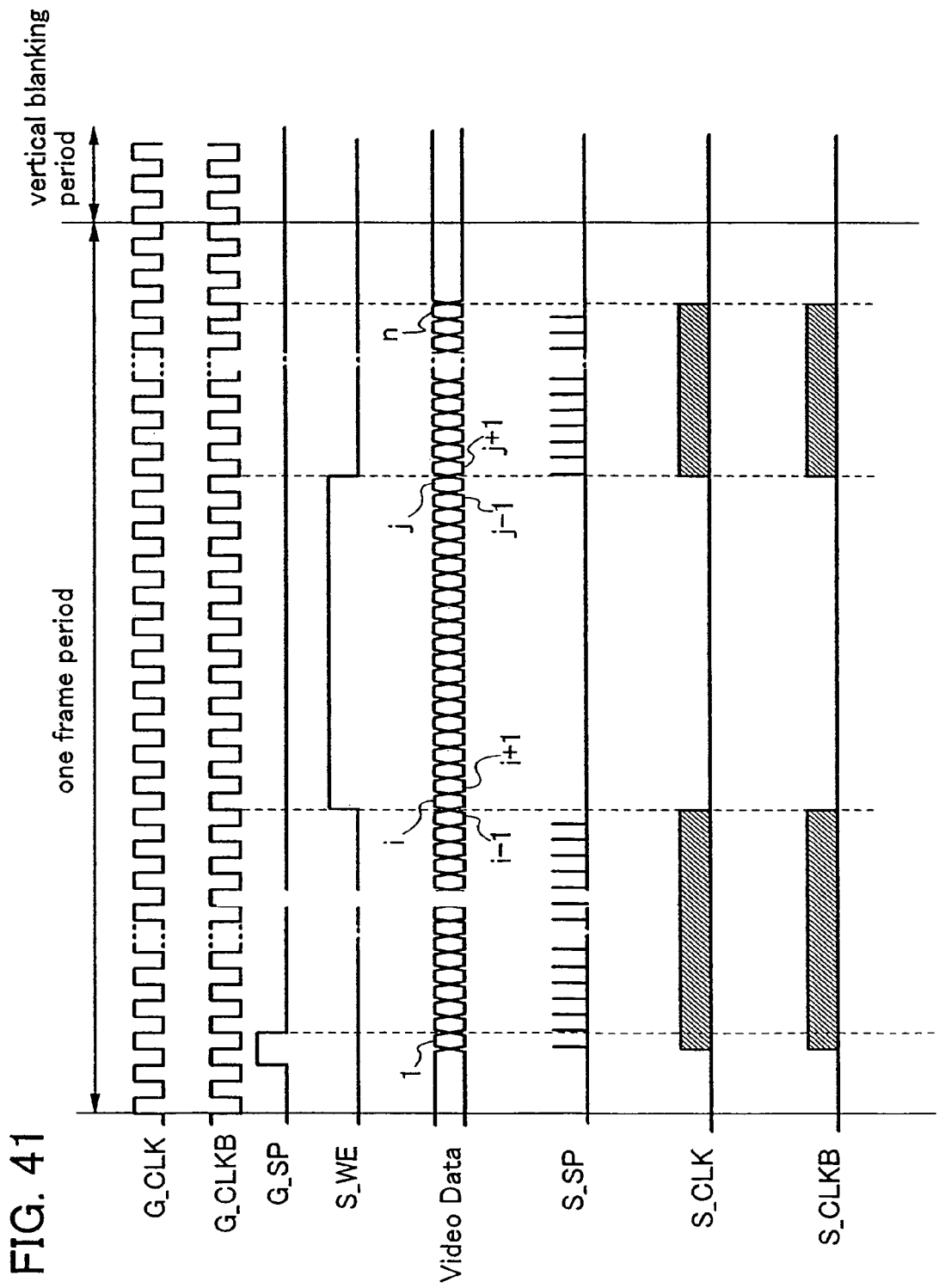
FIG. 41 is a timing chart of a display device of the invention.

Further, FIG. 41 shows a timing chart in the case where upper and lower portions of a display screen are display areas and an area between the upper and lower portions (pixels from an i-th row to a j-th row) of the display screen is a non-display area in the power saving mode of a dot sequential driving display device.

In this case, after a video signal of a pixel in an (i−1)th row is written to a pixel, the control signal (S_WE) is shifted to be from at an L level to at an H level. At this time, the clock signal (S_CLK) and the inverted clock signal (S_CLKB) also stop to be inputted to the signal line driver circuit.

Immediately before a video signal of a pixel in a (i+1)th row is inputted to the signal line driver circuit, the control signal (S_WE) is shifted from an H level to an L level. At this time, the clock signal (S_CLK) and the inverted clock signal (S_CLKB) also stop to be inputted to the signal line driver circuit.

Note that while the clock signal (S_CLK) and the inverted clock signal (S_CLKB) stop to be inputted to the shift register circuit 4001, the start pulse (S_SP) signal may also stop to be inputted.

Accordingly, central several rows (pixel rows from an i-th row to a j-th row) in a display screen become a non-display area, whereas upper and lower pixel rows except the central several rows (pixel rows from the first row to an (i−1)th row and pixel rows from a (j+1)th row to an n-th row) in the display screen become display areas. In the case of partial display, high-speed operation of the signal line driver circuit can be stopped, thereby power consumption can be lowered.

Figure 6:
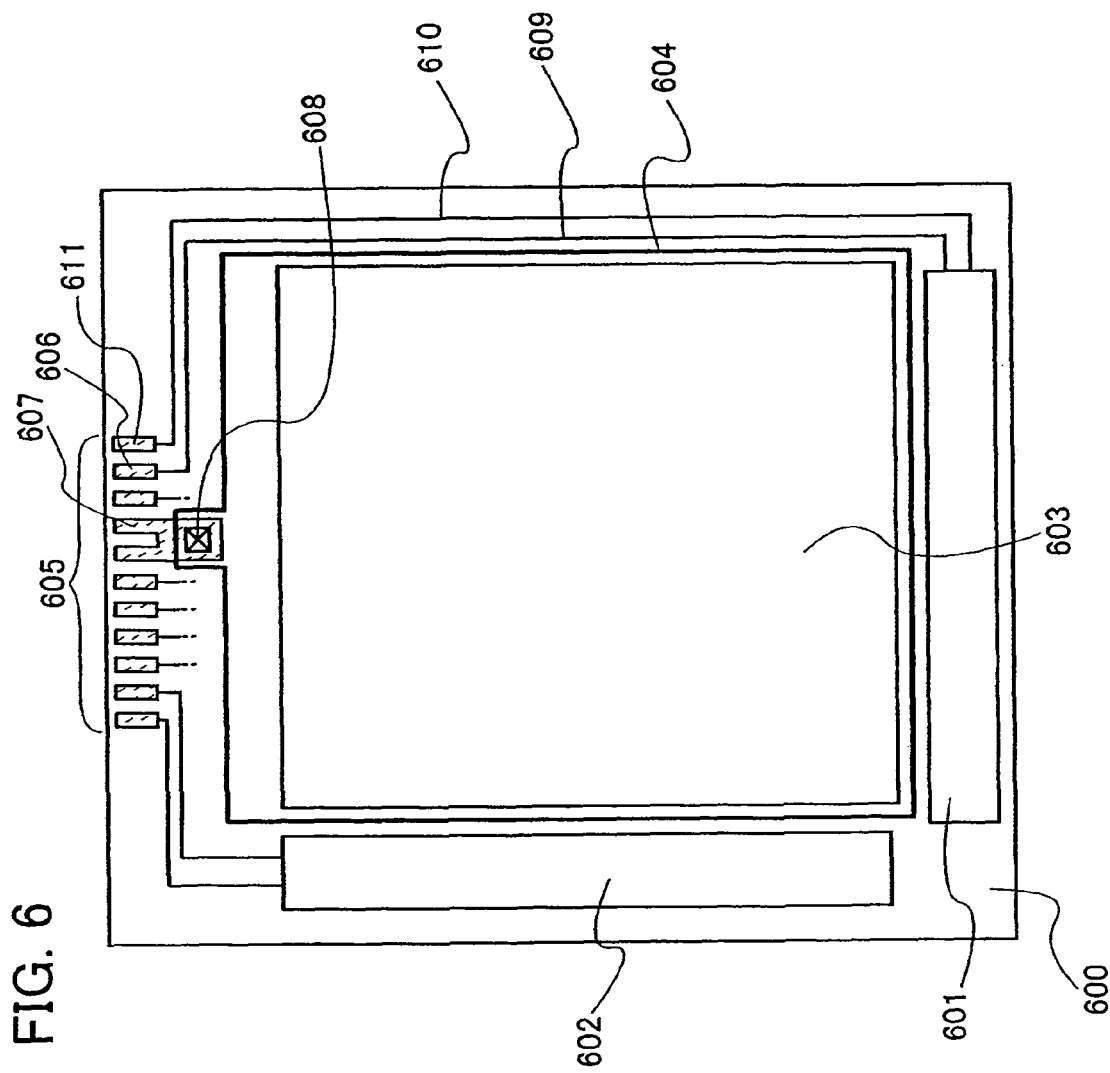
FIG. 6 is a diagram showing an arrangement of a display panel structure of the invention.

FIG. 6 shows a more preferable structure of a display panel in the display device of this embodiment mode. The display panel in FIG. 6 is formed by interposing a pixel portion 603 between a connecting terminal portion 605 to which a signal is inputted externally and a signal line driver circuit 601. A signal line driver circuit 601, a scan line driver circuit 602, a pixel portion 603, and a connecting terminal portion 605 are provided over a substrate 600. Over the pixel portion 603, a counter electrode 604 is formed so as to cover the pixel portion 603. The counter electrode 604 is connected through a contact hole 608 to a wire wider than pads of a plurality of connecting terminals 607 extended from the connecting terminals 607 to which a low power source potential of the counter electrode formed in the connecting terminal portion 605 is inputted. The connecting terminal 606 to which a video signal is inputted is connected to the signal line driver circuit 601 through a video line 609. Further, a connecting terminal 611 to which a clock signal (S_CLK) is inputted is connected to the signal line driver circuit 601 through a clock line 610. In the case of using this structure, the resistance of the power supply line from an FPC to the counter electrode 604 (such as the contact resistance of the connecting terminal 607 and an FPC terminal or the wire resistance between the counter electrode 604 and the connecting terminal 607) can be reduced. Thus, a voltage drop in the power supply line can be reduced, and the potential of the counter electrode 604 can be set normal. Even if lead wiring becomes long like the video line 609 or the clock line 610, in the case of partial display, no signal is inputted to the video line 609 or the clock line 610; therefore, power consumption can be reduced.

Embodiment Mode 2

In this embodiment mode, description is made of a case where the invention is applied to a display device such as an EL display having a current drive display element (hereinafter referred to as a light emitting element) as a display element.

Figure 8:
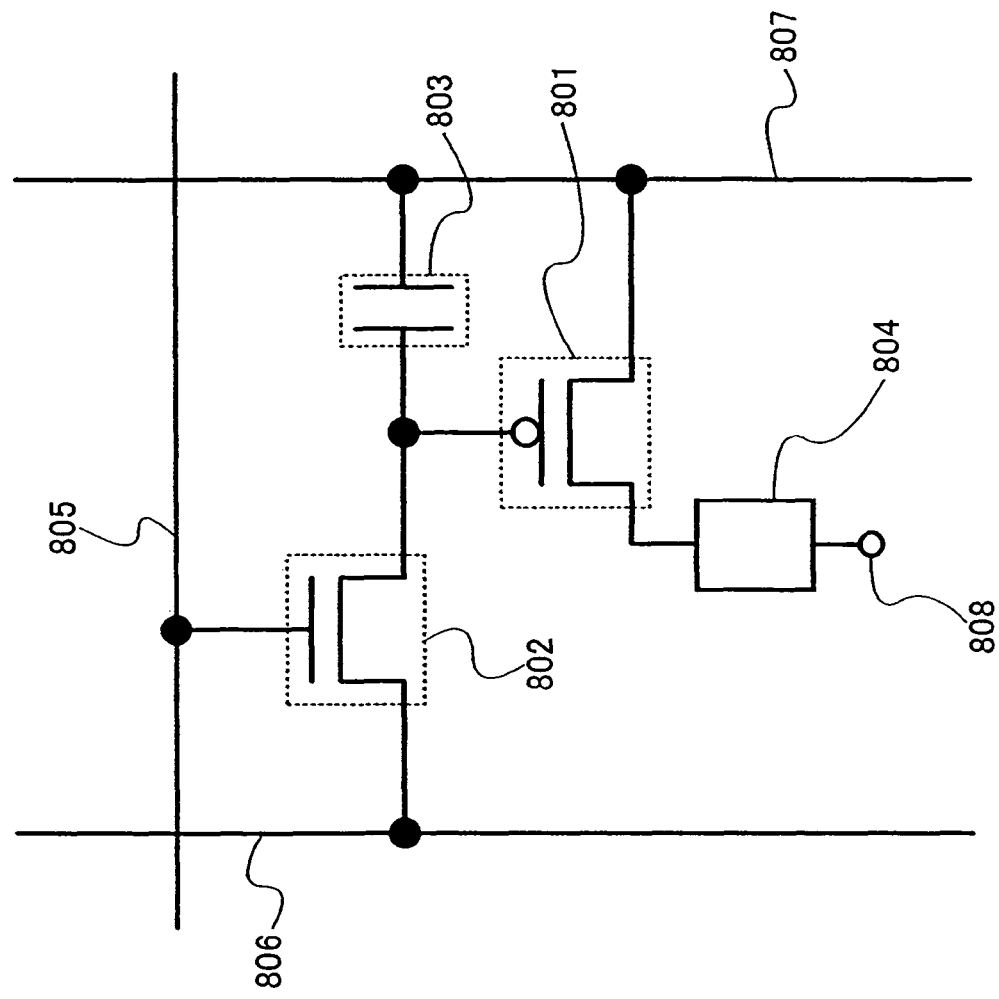
FIG. 8 is a diagram showing a pixel which can be applied to a display device of the invention.

First, description is made of a pixel structure which can be applied to a display device of this embodiment mode with reference to FIG. 8. Although only one pixel is shown here, a plurality of pixels are arranged in matrix in a row direction and a column direction in a pixel portion of the display device. A pixel shown in FIG. 8 includes a first transistor (switching transistor) 802, a second transistor (driving transistor) 801, a capacitor 803, a light emitting element 804, a first wire (scan line) 805, a second wire (signal line) 806, and a third wire (power source line) 807.

A gate terminal, a first terminal (one of a source terminal and a drain terminal), and a second terminal (the other of the source terminal and the drain terminal) of the first transistor 802 are connected to the first wire, 805, the second wire 806, and a gate terminal of the second transistor 801, respectively. Further, the second terminal of the first transistor 802 is connected to the third wire 807 through the capacitor 803. A first terminal (one of a source terminal and a drain terminal) and a second terminal (the other of, the source terminal and the drain terminal) of the second transistor 801 are connected to the third wire 807 and a first electrode (pixel electrode) of the light emitting element 804, respectively. A low power source potential is applied to a second electrode (counter electrode) 808 of the light emitting element 804. Note that a low power source potential is a potential which satisfies the relation: low power source potential<high power source potential on the basis of a high power source potential applied to the third wire 807. As a low power source potential, a GND potential, 0 V, or the like may be applied. A potential difference between a high power source potential and a low power source potential is applied to the light emitting element 804. Then, in order to make the light emitting element 804 emit light by applying a current to the light emitting element 804, a high power source potential and a low power source potential are set so that the potential difference between them is a forward threshold voltage or more.

It is to be noted that the capacitor 803 may be connected to a position where the gate potential of the second transistor 801 can be held. For example, one electrode and the other electrode of the capacitor 803 may be connected to the gate terminal of the second transistor 801 and a wire other than the third wire 807 respectively. The capacitor 803 may be omitted when the gate capacitance of the second transistor 801 is used as a substitute.

Subsequently, operation of a pixel is described.

When a signal is written to a pixel, an H-level signal to turn on the first transistor 802 is supplied to the first wire 805. Then, the first transistor 802 is turned on and a pixel to which a signal is written is selected. Then, a video signal is written from the second wire 806 to a pixel. That is, a charge corresponding to a voltage for the video signal is accumulated in the capacitor 803. When a signal to be supplied to the first wire 805 is set at an L level to turn off the first transistor 802, the capacitor 803 holds the voltage. It is to be noted that a voltage between the gate terminal and the first terminal of the second transistor 801 corresponds to a gate-source voltage Vgs of the second transistor 801.

Here, in the case of a voltage input voltage drive method, a video signal (Vsig (L) to turn on and Vsig (H) to turn off) which turns the second transistor 801 sufficiently on or off is inputted to the gate terminal of the second transistor 801. That is, the second transistor 801 operates in a linear region, which is as a switch.

Therefore, when a video signal Vsig (L) to turn on the second transistor 801 is inputted, a power source potential Vdd applied to the third wire 807 is ideally applied to the first electrode of the light emitting element 804 as it is.

It is preferable that an H level signal supplied to the first wire 805 be a potential V1 which is higher than a video signal to make a pixel emit no light (a gate potential Vsig (H) to turn off the second transistor 801) by a threshold voltage Vth of the first transistor 802 or more. This is because the first terminal of the first transistor 802 as an N-channel transistor becomes a drain terminal when Vsig (H) is inputted to the second wire 806. Therefore, the first transistor 802 is turned off when a potential of the second terminal (source terminal at this time) is lower than a potential of the gate terminal by a threshold voltage Vth of the first transistor 802. That is, when a gate potential of the first transistor 802 is lower than V1, Vsig (H) supplied to the second wire 806 cannot be inputted to the gate terminal of the second transistor 801. Then, the second transistor 801 cannot be turned off completely, thereby the light emitting element 804 slightly emits light in some cases.

It is preferable that an L level signal supplied to the first wire 805 have a potential lower than Vsig (L). For example, in the case where a potential of an L level signal to be supplied to the first wire 805 is equal to that of a video signal (gate potential Vsig (L) to turn on the second transistor 801) which makes a pixel emit light, when Vsig (L) is supplied to the second wire 806 in order to write a signal to a pixel in another row, a gate-source voltage of the first transistor 802 becomes 0 V in the pixel to which Vsig (H) is written. Then, an off current flows when the first transistor 802 is normally-on. Accordingly, the charge accumulated in the capacitor 803 is discharged and the gate potential of the second transistor 801 becomes low, thereby a current flows through the second transistor 801, which makes the light emitting element 804 slightly emit light in some cases.

Figure 7:
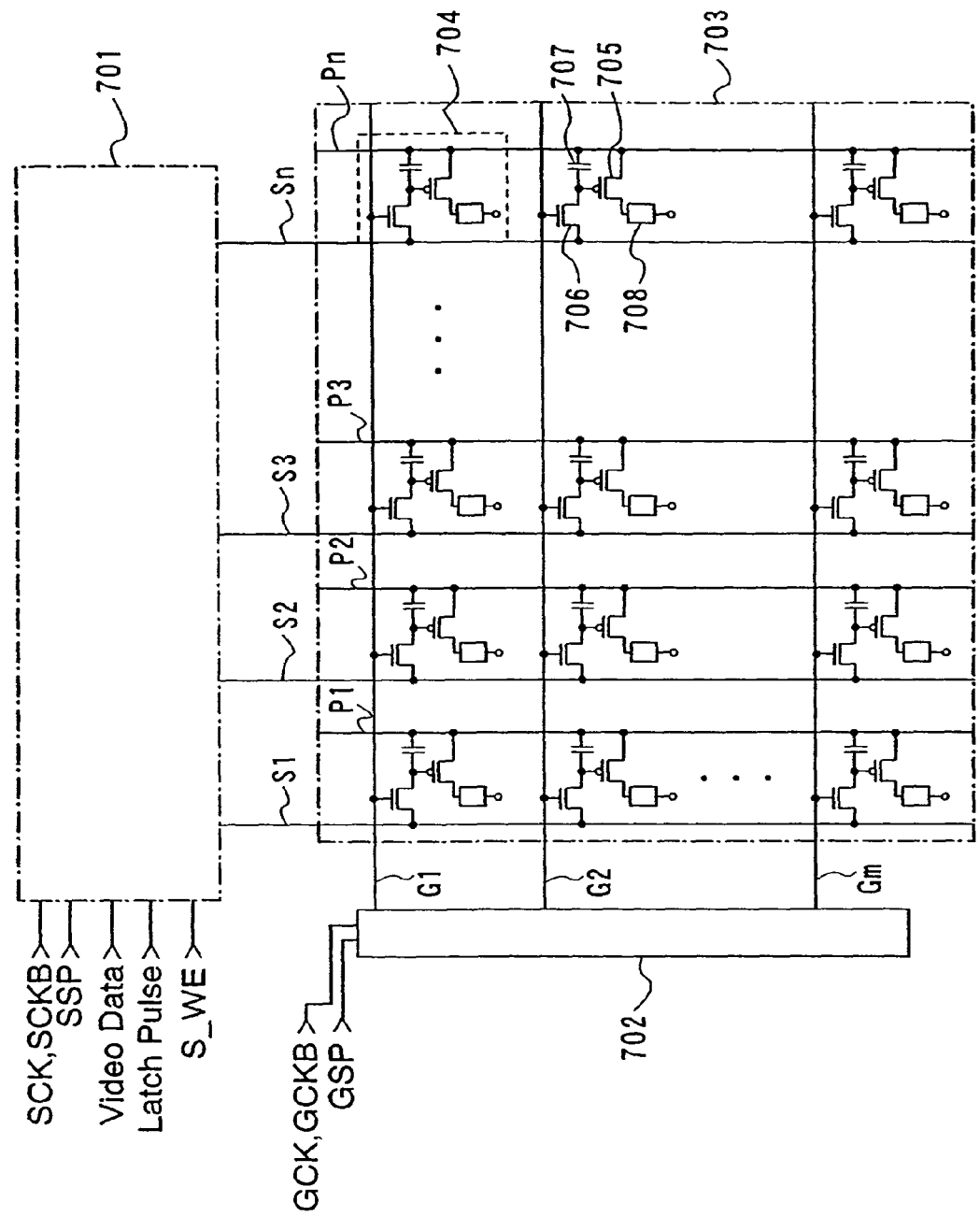
FIG. 7 is a diagram showing a display device of the invention.

Next, FIG. 7 shows a structure of a display device having the aforementioned pixel structure. The display device includes a signal line driver circuit 701, a scan line driver circuit 702, and a pixel portion 703. Signal lines S1 to Sn are extended from the signal line driver circuit 701 to the pixel portion 703, and scan lines G1 to Gm are extended from the scan line driver circuit 702 to the pixel portion 703. Pixels 704 are arranged in matrix corresponding to the scan lines G1 to Gm and the signal lines S1 to Sn.

The pixel 704 includes a driving transistor 705, a switching transistor 706, a capacitor 707, and a light emitting element 708. A gate terminal, a first terminal (one of a source terminal and a drain terminal), and a second terminal (the other of the source terminal and the drain terminal) of the switching transistor 706 are connected to any one of the scan lines G1 to Gm, any one of the signal lines S1 to Sn, and a gate terminal of the driving transistor 705, respectively. Further, a first terminal (one of a source terminal and a drain terminal), and a second terminal (the other of the source terminal and the drain terminal) of the driving transistor 705 are connected to a pixel electrode of the light emitting element 708 and any one of power source lines P1 to Pn, respectively.

Since operation of the scan line driver circuit 702 is similar to that in FIG. 1, which is described in Embodiment Mode 1, description thereof is omitted here. As the signal line driver circuit 701, the signal line driver circuit in FIG. 4, which is described in Embodiment Mode 1, can be used, and description thereof is omitted here.

Here, in a digital time gray scale method, a technique to simultaneously perform writing operation of a signal to a pixel and erasing operation of a signal to a pixel is employed in order to realize high definition and a high gray scale display. That is, in a driving method that a pixel to which a signal is written immediately starts a light emission period (sustain period), the signal written to the pixel is erased before a next signal is written to the pixel in order to provide a light emission time shorter than a writing period (address period) of a signal to a pixel. Such a driving method is described with reference to FIG. 5.

Figure 5:
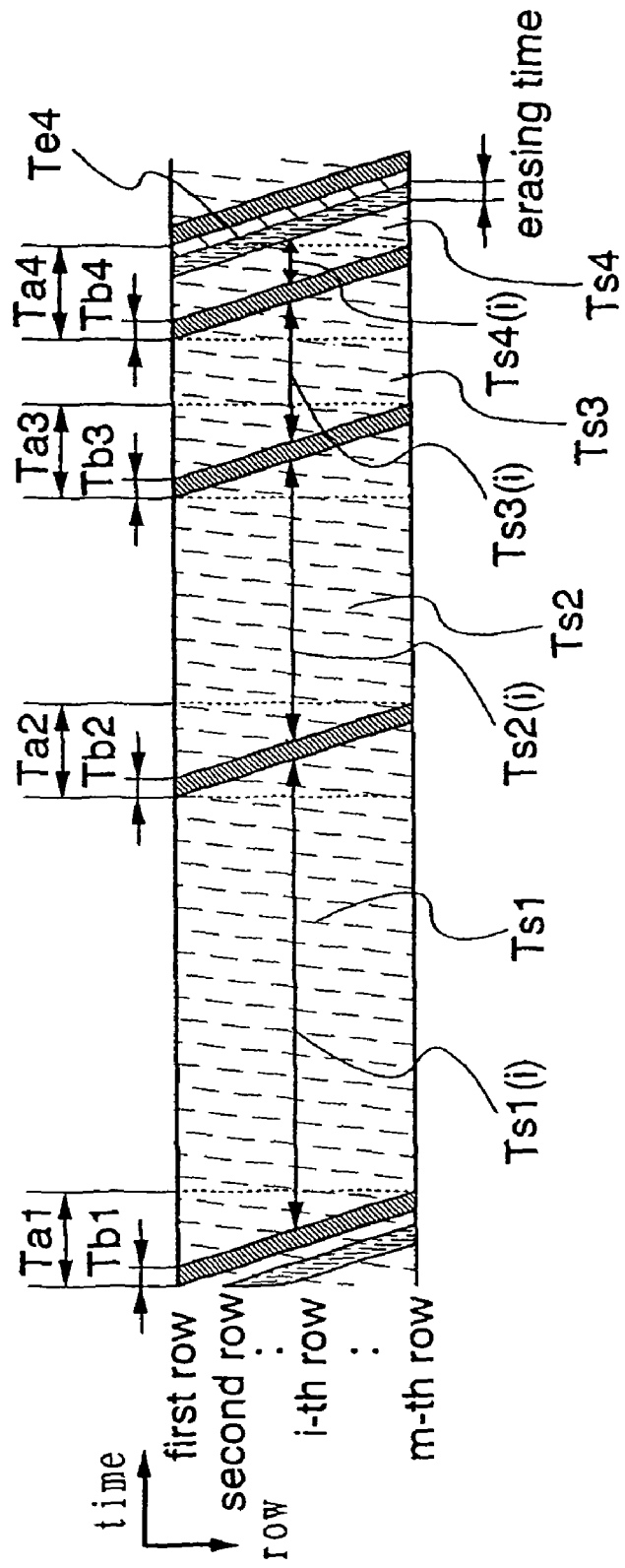
FIG. 5 is a diagram showing a driving method which can be applied to a display device of the invention.

FIG. 5 shows operation of one frame period in accordance with time. In FIG. 5, the lateral direction expresses time and the vertical direction expresses the number of scan rows of scan lines.

When an image is displayed, Writing operation and light emitting operation are alternately performed. A period to perform writing operation and light emitting operation for one screen (one frame) is referred to as one frame period. The process of signals for one frame is not particularly limited; however, at least approximately 60 times per second is preferable so that a person who sees the image does not sense a flicker.

As shown in FIG. 5, one frame period is time-divided into four subframe periods including address periods Ta1, Ta2, Ta3, and Ta4 and sustain periods Ts1, Ts2, Ts3, and Ts4. That is, each pixel row is time-divided into writing time Tb1, Tb2, Tb3, and Tb4 and light emission time Ts1(i), Ts2(i), Ts3(i), and Ts4(i). When a signal for light emission is inputted to a pixel, a light emitting element therein is in a light emission state in the sustain period. A ratio of lengths of light emission time in each subframe period is Ts1(i):Ts2(i):Ts3(i):Ts4(i)= $2^3:2^2:2^1:2^0$=8:4:2:1, thereby a 4-bit gray scale can be expressed. However, the numbers of bits and gray scale levels are not limited to those described here, for example, eight subframe periods may be provided to express an 8-bit gray scale.

Operation of one frame period is described. First, in the address period Ta1, writing operation is performed in the writing time Tb1 of each row from the first to last rows. That is, scan signals are sequentially inputted to a scan line from the first row, thereby pixels are selected. Then, when the pixel is selected, a video signal is inputted from a signal line to the pixel. Depending on the potential thereof, each pixel is controlled to emit light or no light in the sustain period Ts1. Accordingly, start time of writing operation to a pixel differs depending on rows. The row where the writing operation has terminated sequentially starts the sustain period Ts1. In the sustain period, a light emitting element of a pixel to which a signal for light emission is inputted is in a light emission state. Further, the row where the sustain period Ts1 has terminated sequentially starts signal writing operation of a next subframe period, and writing operation is sequentially performed similarly from the first to the last rows in each signal writing time Tb2. In this manner, a video signal is inputted to a pixel similarly in the address periods Ta2, Ta3, and Ta4, and depending on a potential thereof, each pixel is controlled to emit light or no light in the sustain periods Ts2, Ts3, and Ts4. By repeating the aforementioned operations, operations up to the sustain period Ts4 is terminated.

Like the sustain period Ts4, when a sustain period is required to be forcibly terminated in a row where light emission time is already terminated before writing operation up to the last row is terminated, a video signal written to a pixel is erased by erasing time Te so as to control to forcibly put the pixel in a non-light emission state. In the row where the non-light emission state is forcibly made, the non-light emission state is kept for a certain period (this period is a non-light emission period Te4). As soon as the writing period of the last row is terminated, an address period of a next frame period (or a subframe period) sequentially starts from the first row. Accordingly, a subframe period in which light emission time is shorter than an address period can be provided.

In this manner, integrated light emission time in the subframe periods corresponds to light emission time of each pixel in one frame period, by which a gray scale is expressed.

It is to be noted that the subframe periods are sequentially arranged in the order from the longest sustain period; however, they are not necessarily arranged like this. For example, the subframe periods may be sequentially arranged in the order from the shortest sustain period or the subframe period with a long sustain period and the one with a short sustain period may be arranged at random.

Figure 10:
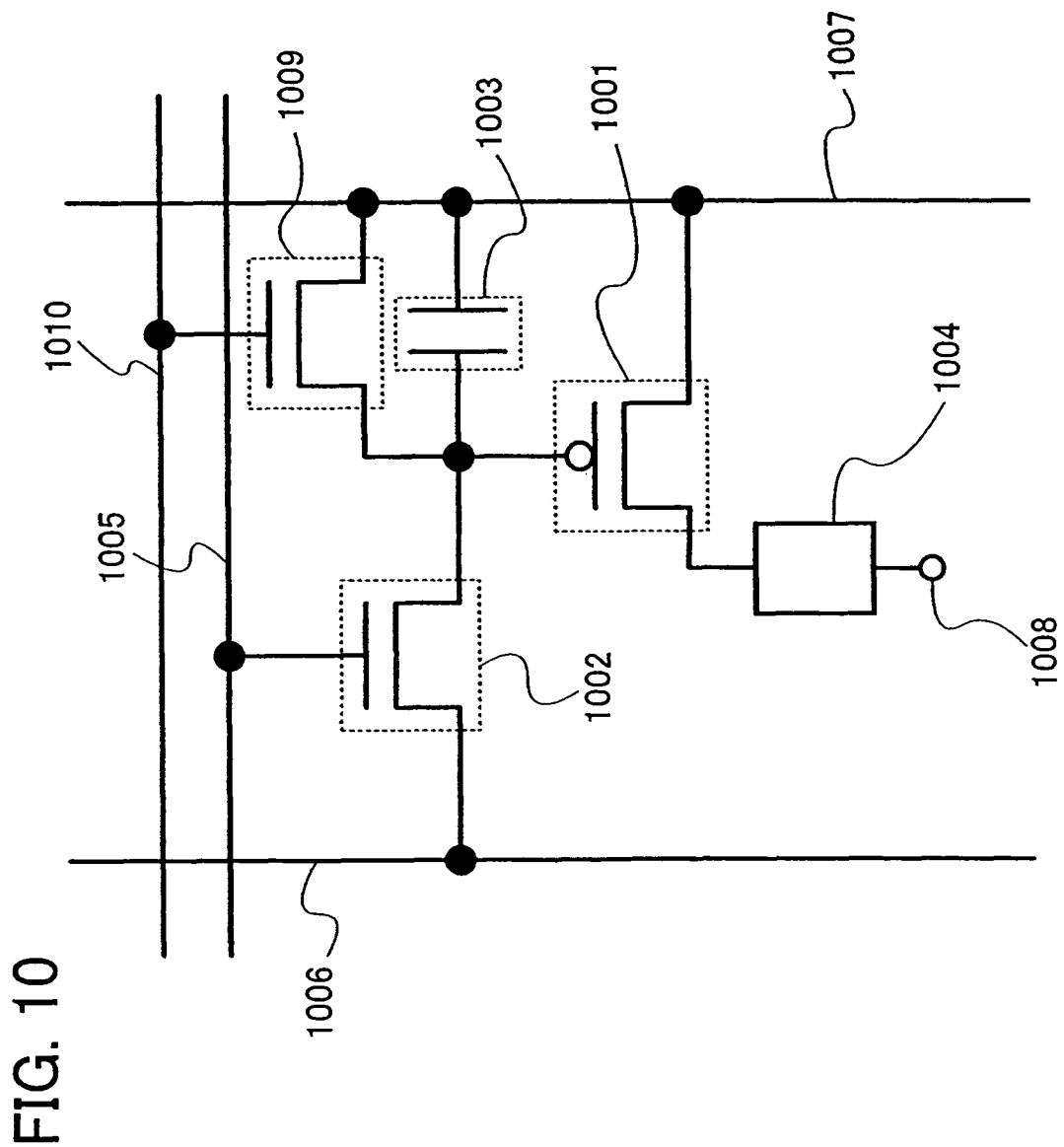
FIG. 10 is a diagram showing a pixel which can be applied to a display device of the invention.

FIG. 10 shows a pixel configuration of a display device which realizes such a driving method. The pixel includes a driving transistor 1001, a switching transistor 1002, a capacitor 1003, a light emitting element 1004, a first scan line 1005, a signal line-1006, a power source line 1007, an erasing transistor 1009, and a second scan line 1010.

A gate terminal, a first terminal (one of a source terminal and a drain terminal), and a second terminal (the other of the source terminal and the drain terminal) of the switching transistor 1002 are connected to the scan line 1005, the signal line 1006, and a gate terminal of the driving transistor 1001, respectively. Further, the second terminal of the switching transistor 1002 is also connected to the power source line 1007 through the capacitor 1003. A first terminal (one of a source terminal and a drain terminal) and a second terminal (the other of the source terminal and the drain terminal) of the driving transistor 1001 are connected to the power source line 1007 and a first electrode (pixel electrode) of the light emitting element 1004, respectively. A low power source potential Vss is applied to a second electrode (counter electrode) 1008 of the light emitting element 1004. It is to be noted that the low power source potential Vss is a potential which satisfies Vss<Vdd on the basis of a high power source potential Vdd applied to the power source line 1007. As the low power source potential Vss, GND, 0 V, or the like may be applied. A potential difference between the high power source potential Vdd and the low power source potential Vss is applied to the light emitting element 1004 so as to supply current thereto to emit light; therefore, each of the high power source potential Vdd and the low power source potential Vss is set so that a potential difference between them becomes a forward threshold voltage of the light emitting element 1004.

An erasing transistor is provided in parallel with the capacitor 1003. That is, a first terminal (one of a source terminal and a drain terminal) of the erasing transistor 1009 is connected to the gate terminal of the driving transistor 1001 and a second terminal (the other of the source terminal and the drain terminal) thereof is connected to the power source line 1007. Further, a gate terminal of the erasing transistor 1009 is connected to the second scan line 1010. It is to be noted that the capacitor 1003 may be omitted when the gate capacitance of the driving transistor 1001 is used as a substitute.

First, description is made on writing operation of a signal to a pixel. When a pixel is selected by the first scan line 1005, that is the case where the switching transistor 1002 is in an on state, a video signal is inputted from the signal line 1006 to the pixel. Then, a charge corresponding to a voltage for the video signal is accumulated in the capacitor 1003, and the capacitor 1003 holds the voltage when the switching transistor 1002 is turned off. This voltage is a voltage between the gate terminal and the first terminal of the driving transistor 1001 and corresponds to a gate-source voltage Vgs of the driving transistor 1001.

It is to be noted that an operating region of a transistor (n-channel transistor here for simplification) can be generally divided into a linear region and a saturation region. When a drain-source voltage is Vds, a gate-source voltage is Vgs, and a threshold voltage is Vth, a boundary between the linear region and the saturation region is when (Vgs−Vth)=Vds is satisfied. In the case where (Vgs−Vth)<Vds is satisfied, a transistor operates in a saturation region and ideally, a current value hardly changes even when Vds changes. That is, a current value is determined only by the level of Vgs. On the other hand, in the case where (Vgs−Vth)>Vds is satisfied, a transistor operates in a linear region and a current value is determined in accordance with the levels of Vds and Vgs. Then, in the case where a transistor operates in a linear region, Vds can be low since Vgs is high. That is, potentials of a source terminal and a drain terminal can be almost equal. Therefore, when a transistor operates in a linear region, the transistor can function as a switch.

Therefore, in the case of a voltage input voltage drive method as in this pixel, a video signal which turns the driving transistor 1001 sufficiently on or off is inputted to the gate terminal so that the driving transistor 1001 functions as a switch.

Therefore, when a pixel emits light, a video signal which turns on the driving transistor 1001 in a linear region is inputted from the signal line 1006. Then, the driving transistor 1001 functions almost as a switch; therefore, a power source potential Vdd applied to the power source line 1007 is ideally applied to a first electrode of the light emitting element 1004 as it is. On the other hand, when a pixel emits no light, a video signal which turns the driving transistor 1001 sufficiently off is inputted from the signal line 1006.

That is, ideally, a voltage applied to the light emitting element 1004 is made constant and luminance obtained by the light emitting element 1004 is made constant. Then, a plurality of subframe periods are provided in one frame period and a video signal is written to each pixel in a signal writing period (address period) of each subframe period. In a light emission period (sustain period), each pixel holds the video signal. Then, a pixel emits light or no light depending on the video signal. It is to be noted that in a subframe where light emission time is shorter than an address period, the signal held in each pixel in the erasing period is erased. Then, light emission or non-light emission of a pixel is controlled per subframe period, and a gray scale is expressed by a sum of light emission time in one frame period.

Next, description is made on an erasing operation in an erasing period of a video signal written to a pixel. The second scan line 1010 selects a pixel and turns on the erasing transistor 1009, thereby a voltage held in the capacitor 1003 is erased. That is, a charge accumulated in the capacitor 1003 is discharged and potentials of both electrodes of the capacitor 1003 are made equal. In this manner, potentials of a gate and a source of the driving transistor 1001 are made equal to turn off the driving transistor 1001.

Figure 9:
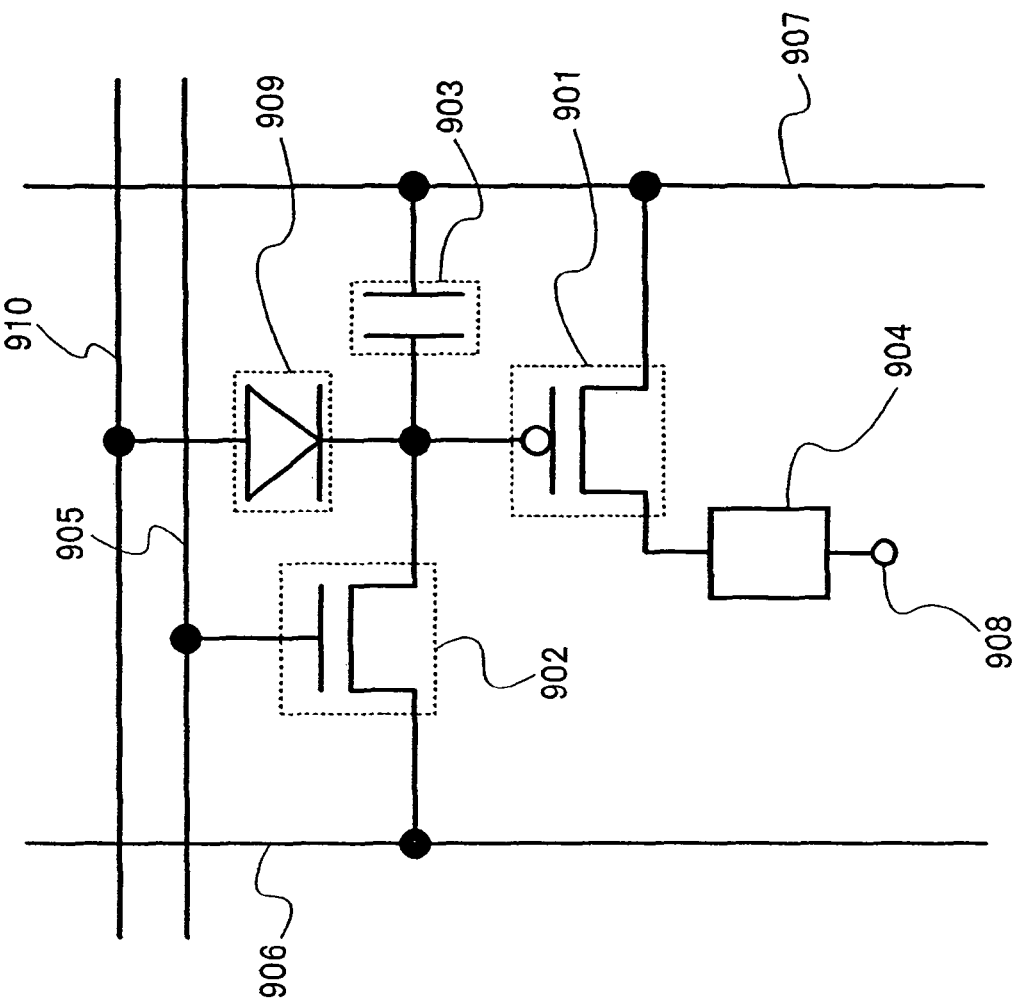
FIG. 9 is a diagram showing a pixel which can be applied to a display device of the invention.

Further, description is made on another pixel structure realizing a similar driving method with reference to FIG. 9. Although one pixel is shown here, a plurality of pixels are arranged in matrix in the row direction and the column direction in a pixel portion of a display device.

The pixel shown in FIG. 9 includes a driving transistor 901, a switching transistor 902, a capacitor 903, a light emitting element 904, a first scan line 905, a signal line 906, a power source line 907, a rectifying element 909, and a second scan line 910. A gate terminal, a first terminal (one of a source terminal and a drain terminal), and a second terminal (the other of the source terminal and the drain terminal) of the switching transistor 902 are connected to the first scan line 905, the signal line 906, and a gate terminal of the driving transistor 901, respectively. The gate terminal of the driving transistor 901 is connected to the second scan line 910 through the rectifying element 909. Further, the second terminal of the switching transistor 902 is connected to the power source line 907 through the capacitor 903. Further, a first terminal (one of a source terminal and a drain terminal) and a second terminal (the other of the source terminal and the drain terminal) of the driving transistor 901 are connected to the power source line 907 and a first electrode (pixel electrode) of the light emitting element 904, respectively. A low power source potential is applied to a second electrode (counter electrode) 908 of the light emitting element 904. It is to be noted that the low power source potential satisfies low power source potential<high power source potential on the basis of a high power source potential applied to the power source line 907. As the low power source potential, GND, 0 V, or the like may be applied. A potential difference between the high power source potential and the low power source potential is applied to the light emitting element 904 so as to make it emit light; therefore, each of the high power source potential and the low power source potential is set so that a potential difference between them becomes equal to or higher than a forward threshold voltage of the light emitting element 1004.

It is to be noted that the capacitor 903 may be connected to a position where a gate potential of the driving transistor 901 can be held. For example, one electrode of the capacitor 903 may be connected to the gate terminal of the driving transistor 901 and the other electrode thereof may be connected to a wire other than the power source line 907. Further, the capacitor 903 may be omitted when the gate capacitance of the driving transistor 901 is used as a substitute.

Subsequently, description is made of operation of a pixel.

When a signal is written to a pixel, an H level signal to turn on the switching transistor 902 is inputted to the first scan line 905. Then, the switching transistor 902 is turned on and a pixel to which a signal is written is selected. Then, a video signal is written from the signal line 906 to a pixel. That is, a charge corresponding to a voltage for the video signal is accumulated in the capacitor 903. When the first scan line 905 is set at an L level so as to turn off the switching transistor 902, the capacitor 903 holds the voltage. It is to be noted that a voltage between the gate terminal and the first terminal of the driving transistor 901 corresponds to a gate-source voltage Vgs of the driving transistor 901.

Here, in the case of a voltage input voltage drive method, a video signal (Vsig (L) to turn on and Vsig (H) to turn off) which turns the driving transistor 901 sufficiently on or off is inputted to the gate terminal of the driving transistor 901. That is, the driving transistor 901 operates in a linear region, which is as a switch.

Therefore, when a video signal Vsig (L) to turn on the driving transistor 901 is inputted, a power source potential Vdd applied to the power source line 907 is ideally applied to the first electrode of the light emitting element 904 as it is.

It is preferable that an H level signal inputted to the first scan line 905 be a potential V1 which is higher than a video signal to make a pixel emit no light (a gate potential Vsig (H) to turn off the driving transistor 901) by a threshold voltage Vth of the switching transistor 902. This is because the first terminal of the switching transistor 902 as an n-channel transistor becomes a drain terminal when Vsig (H) is inputted to the signal line 906. Therefore, the switching transistor 902 is turned off when a potential of the second terminal (source terminal at this time) is lower than a potential of the gate terminal by a threshold voltage Vth of the switching transistor 902. That is, when a gate potential of the switching transistor 902 is lower than V1, Vsig (H) inputted to the signal line 906 cannot be inputted to the gate terminal of the driving transistor 901. Then, the driving transistor 901 cannot be turned off completely, thereby the light emitting element 904 slightly emits light in some cases.

It is preferable that an L level signal inputted to the first scan line 905 be a potential lower than Vsig (L). For example, in the case where a potential of an L level signal inputted to the first scan line 905 is equal to that of a video signal (gate potential Vsig (L) to turn on the driving transistor 901) which makes a pixel emit light, when Vsig (L) is inputted to the signal line 906 for writing a signal to a pixel in another row, a gate-source voltage of the switching transistor 902 becomes 0 V in the pixel to which Vsig (H) is written. Then, an off current flows when the switching transistor 902 is normally-on. Accordingly, the charge accumulated in the capacitor 903 is discharged and the gate potential of the driving transistor 901 becomes low, thereby a current flows through the driving transistor 901 which makes the light emitting element 904 slightly emit light in some cases.

Next, description is made on an erasing operation. In the erasing operation, an H level signal is inputted to the second scan line 910. Then, a current flows through the rectifying element 909, thereby the gate potential of the driving transistor 901 held by the capacitor 903 can be a certain predetermined potential. That is, it is possible to set a potential of the gate terminal of the driving transistor 901 to be a predetermined potential and to forcibly turn off the driving transistor 901 regardless of a video signal written to a pixel in a signal writing period. It is to be noted that a potential of the gate terminal of the driving transistor 901 becomes lower than that of the second scan line 910 by a threshold voltage of the rectifying element 909.

At this time, it is preferable that an H level signal inputted to the second scan line 910 be a potential equal to or higher than a high power source potential inputted to the power source line 907. By appropriately setting the potential of the H level signal, the potential of the gate terminal of the driving transistor 901 can be set higher than the potential of the source terminal thereof when forcibly turning off the driving transistor 901 in the erasing period. Accordingly, even when the driving transistor 901 is normally-on, the driving transistor 901 can be turned off so as to prevent the light emitting element 904 from slightly emitting light.

It is to be noted that an H level signal inputted to the second scan line 910 may be the same as an H level signal inputted to the first scan line 905. As a result, the number of power source lines can be reduced.

It is to be noted that an L level signal is inputted to the second scan line 910 except for in the erasing operation. It is preferable that the potential of the L level signal be a potential equal to or lower than that of a video signal (gate potential Vsig (L) to turn on the driving transistor 901) which makes a pixel emit light. However, if the potential of the L level signal is set too low, a reverse bias voltage applied to the rectifying element 909 becomes high in the case where a video signal for non-light emission (gate potential Vsig (H) to turn off the driving transistor 901) is written to the pixel. Accordingly, an off current flowing to the rectifying element 909 (also referred to as a reverse current) is increased and a charge held in the capacitor 903 leaks. Then, the gate potential of the driving transistor 901 falls, thereby an off current of the driving transistor 901 increases. Therefore, it is preferable that the potential of the L level signal be equal to that of a video signal which makes a pixel emit light (gate potential Vsig (L) to turn on the driving transistor 901).

It is to be noted that the time of erasing operation is when a video signal written to a pixel is erased and corresponds to erase time Te in the timing chart shown in FIG. 5. Further, an erasing period is a period after an erasing operation of the pixel until a signal writing operation to the pixel and corresponds to the erasing period Te4 in the timing chart shown in FIG. 5.

Figure 38:
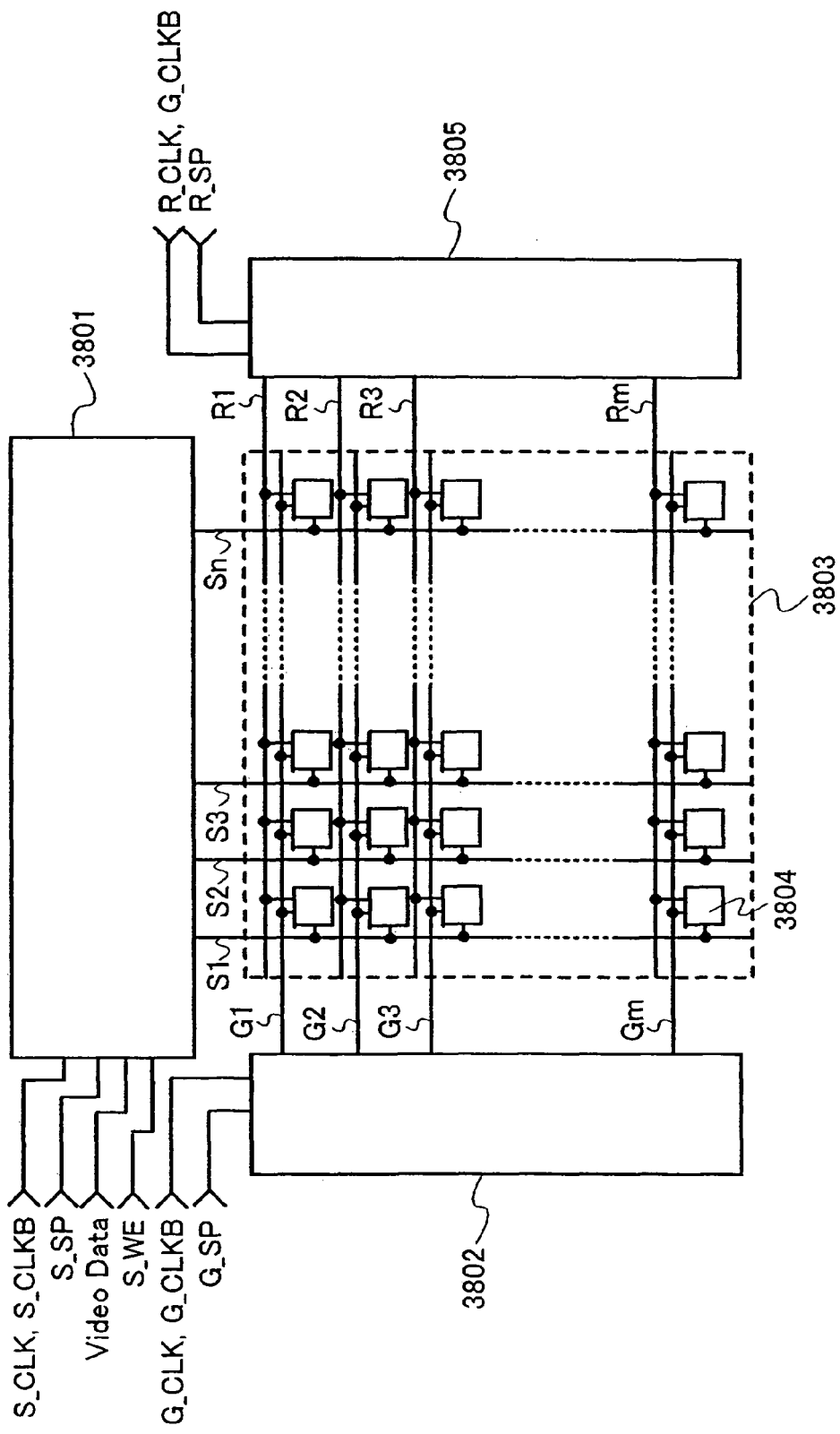
FIG. 38 is a diagram showing a display device of the invention.

Subsequently, FIG. 38 shows a structure of a display device to which the aforementioned driving method can be applied, that is, a structure example of a display device having the pixel structure of FIG. 9 or 10.

The display device includes a signal line driver circuit 3801, a first scan line driver circuit 3802, a second scan line driver circuit 3805, and a pixel portion 3803. Signal lines S1 to Sn are extended from the signal line driver circuit 3801 in a column direction, first scan lines G1 to Gm are extended from the first scan line driver circuit 3802 in a row direction, and second scan lines R1 to Rm are extended from the second scan line driver circuit 3805 in the row direction. A plurality of pixels 3804 are arranged in matrix in the pixel portion 3803 corresponding to the signal lines S1 to Sn, the first scan lines G1 to Gm, and the second scan lines R1 to Rm.

Signals such as a clock signal (G_CLK), an inverted clock signal (G_CLKB), and a start pulse signal (G_SP) are inputted to the first scan line driver circuit 3802. In accordance with these signals, a signal is outputted to a first scan line Gp (one of the first scan lines G1 to Gm) of a pixel row to be selected. Then, a pixel row to which a signal is written is selected.

Signals such as a clock signal (R_CLK), an inverted clock signal (R CLKB), and a start pulse signal (RASP) are inputted to the second scan line driver circuit 3805. In accordance with these signals, a signal is outputted to a second scan line Rp (one of the second scan lines R1 to Rm) of a pixel row to be selected. Then, a pixel row in which a signal is erased is selected.

Signals such as a clock signal (S_CLK), an inverted clock signal (S_CLKB), a start pulse signal (S_SP), and a video signal (Video Data) are inputted to the signal line driver circuit 3801. In accordance with these signals, a video signal corresponding to the pixels in each column is outputted to each of the signal lines S1 to Sn. Further, a control signal (S_WE) is inputted to the signal line driver circuit 3801. In accordance with the signal, a video signal is outputted when the normal display mode is selected, whereas a non-display signal is outputted when the power saving mode is selected.

Therefore, the video signal supplied to the signal lines S1 to Sn is written to the pixel 3804 of each column in a pixel row selected by a signal inputted through the first scan line Gp (one of the scan lines G1 to Gm). Then, each pixel row is selected through each of the first scan lines G1 to Gm, and video signals corresponding to each of the pixels 3804 are inputted to all the pixels 3804. Each of the pixels 3804 holds the data of the written video signal for a certain period, thereby each of the pixels 3804 can keep a light emission or non-light emission state. In a subframe period in which a sustain period is shorter than an address period, each pixel row is selected through the second scan lines R1 to Rm, and an erasing signal is inputted to all the pixels 3804.

Figure 39:
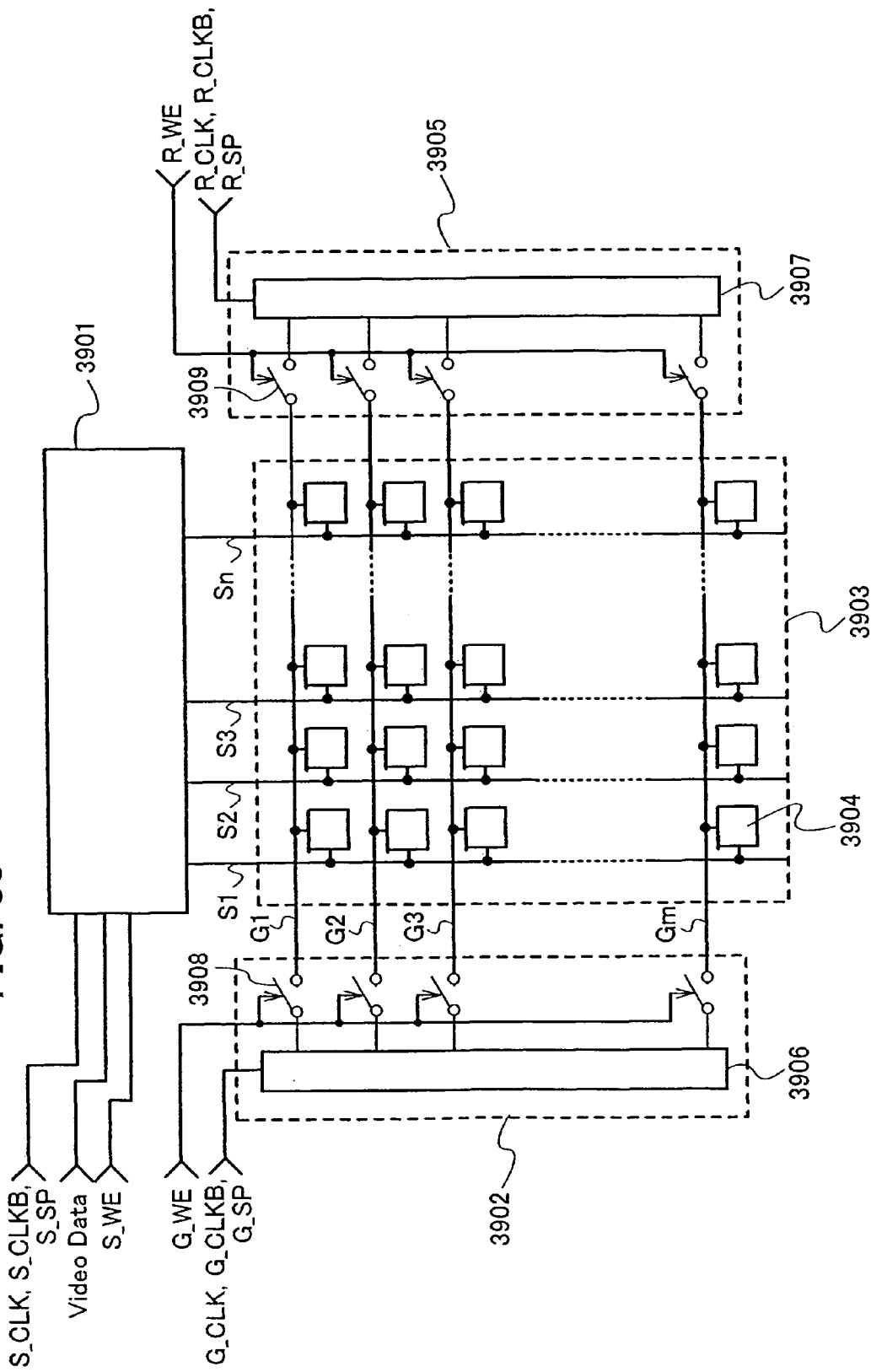
FIG. 39 is a diagram showing a display device of the invention.

It is to be noted that the aforementioned driving method can be realized also in the pixel shown in FIG. 8. FIG. 39 shows a structure of a display device in that case and operation thereof is described below.

The display device includes a signal line driver circuit 3901, a first scan line driver circuit 3902, a second scan line driver circuit 3905, and a pixel portion 3903. Pixels 3904 are arranged in matrix corresponding to the scan lines G1 to Gm and the signal lines S1 to Sn in the pixel portion 3903. The first scan line driver circuit 3902 includes a shift register circuit 3906 and switches 3908 for controlling to: electrically connect or disconnect the shift register 3906 and each of the scan lines G1 to Gm. The second scan line driver circuit 3905 includes a shift register circuit 3907 and switches 3909 for controlling to electrically connect or disconnect the shift register 3906 and each of the scan lines G1 to Gm.

It is to be noted that a scan line Gp (one of the scan lines G1 to Gm) corresponds to the first wire 805 of FIG. 8, and a signal line Sq (one of the signal lines S1 to Sn) corresponds to the second wire 806 of FIG. 8.

Figure 42:
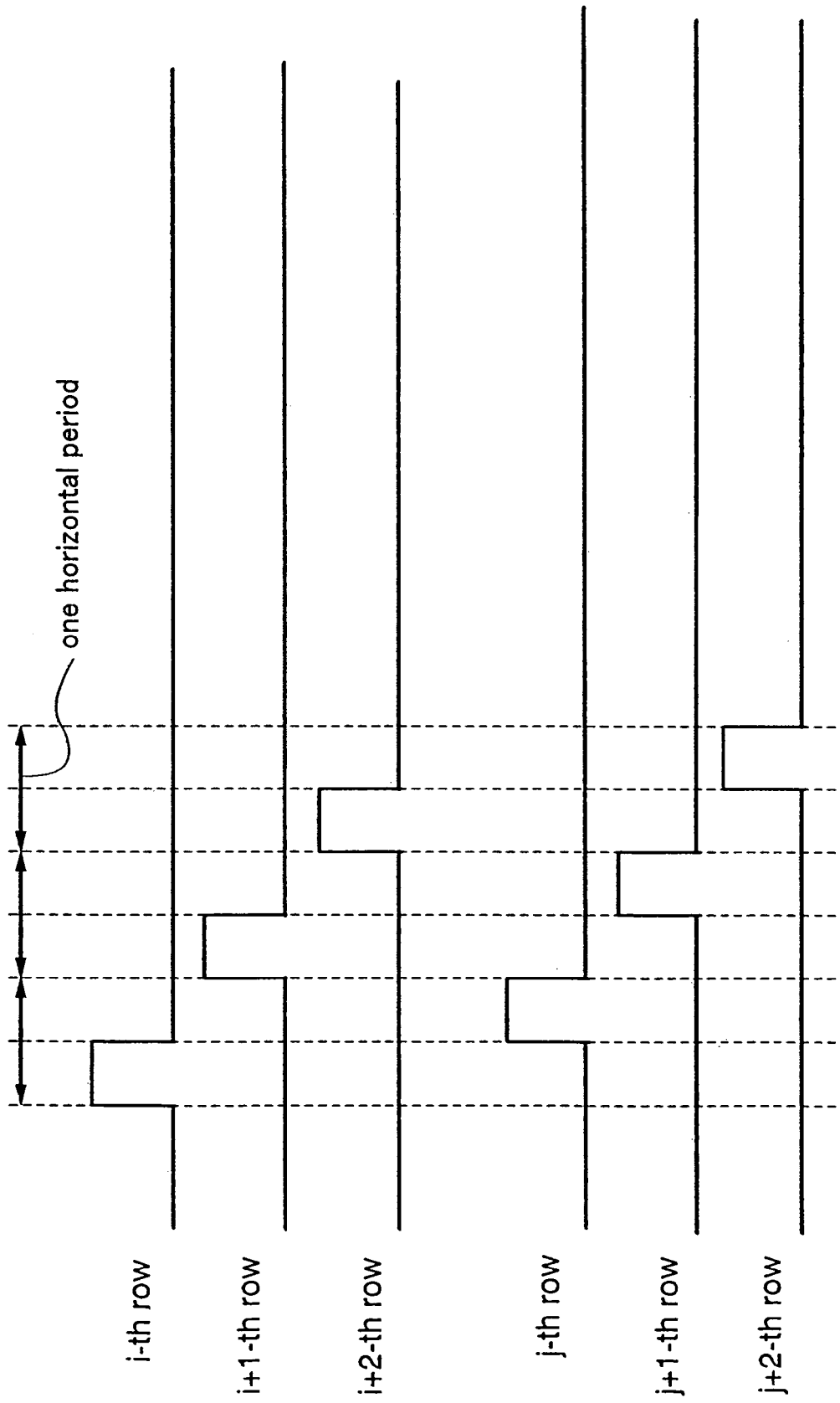
FIG. 42 is a diagram showing a driving method which can be applied to a display device of the invention.

Signals such as a clock signal (G_CLK), an inverted clock signal (G_CLKB), a start pulse signal (G_SP), and a control signal (G_WE) are inputted to the first scan line driver circuit 3902. In accordance with these signals, signals selecting pixels are outputted to a first scan line Gp (one of the first scan lines G1 to Gm) of a pixel row to be selected. Note that the signals at this time are pulses outputted in the former half of one horizontal period as shown in a timing chart of FIG. 42. That is, signals outputted from the shift register 3906 are outputted to the scan lines G1 to Gm only when the switches 3908 are in an on state.

Signals such as a clock signal (R_CLK), an inverted clock signal (R CLKB), a start pulse signal (R_SP), and a control signal (R_WE) are inputted to the second scan line driver circuit 3905. In accordance with these signals, signals are outputted to a second scan line Ri (one of the second scan lines R1 to Rm) of a pixel row to be selected. Note that the signals at this time are pulses outputted in the latter half of one horizontal period as shown in the timing chart of FIG. 42. That is, signals outputted from the shift register 3907 are outputted to the scan lines G1 to Gm only when the switches 3909 are in an on state.

Signals such as a clock signal (S_CLK), an inverted clock signal (S_CLKB), a start pulse signal (S_SP), a video signal (video Data), and an output control signal (S_WE) are inputted to the signal line driver circuit 3901. In accordance with these signals, a signal corresponding to pixels of each column is outputted to each of the signal lines S1 to Sn. The output control signal (S_WE) controls a signal outputted from the signal line driver circuit 3901. That is, a video signal is outputted when the control signal (S_WE) is at an L level, whereas an erasing signal or a non-display signal is outputted when the control signal (S_WE) is at an H level.

Therefore, the video signal inputted to the signal lines S1 to Sn is written to the pixel 3904 of each column in the pixel row selected by a signal inputted to a scan line Gi (one of the scan lines G1 to Gm) from the first scan line driver circuit 3902. Then, each pixel row is selected through each of the scan lines G1 to Gm, thereby video signals corresponding to each of the pixels 3904 are written to all the pixels 3904. Each of the pixels 3904 holds the data of the written video signal for a certain period. Then, each of the pixels 3904 can keep a lighting state or a non-lighting state by holding the data of the video signal for a certain period.

Further, a signal (also referred to as erasing signal) for making a pixel emit no light is written from the signal lines S1 to Sn to the pixel 3904 of each column in the pixel row selected by a signal inputted to the scan line Gi (one of the scan lines G1 to Gm) from the second scan line driver circuit 3905. Then, each pixel row is selected by each of the scan lines G1 to Gm, thereby setting a non-lighting period. For example, the time when the pixel in an i-th row is selected by the signal inputted from the second scan line driver circuit 3905 to the scan line Gi is erasing time Te in FIG. 5.

Embodiment Mode 3

In this embodiment mode, description is made of the case where the invention is applied to the display device using a display element in which luminance of a pixel is changed in accordance with an applied voltage as a liquid crystal display device. The pixel shown in this embodiment mode includes a circuit for holding an analog voltage and a digital signal memory circuit. That is, in the case where partial display is performed in the power saving mode, a digital signal is stored in a pixel in a non-display area, thereby considerably reducing the number of times of refresh operations to the pixel in the non-display area, or requiring no more refresh operations.

Figure 12:
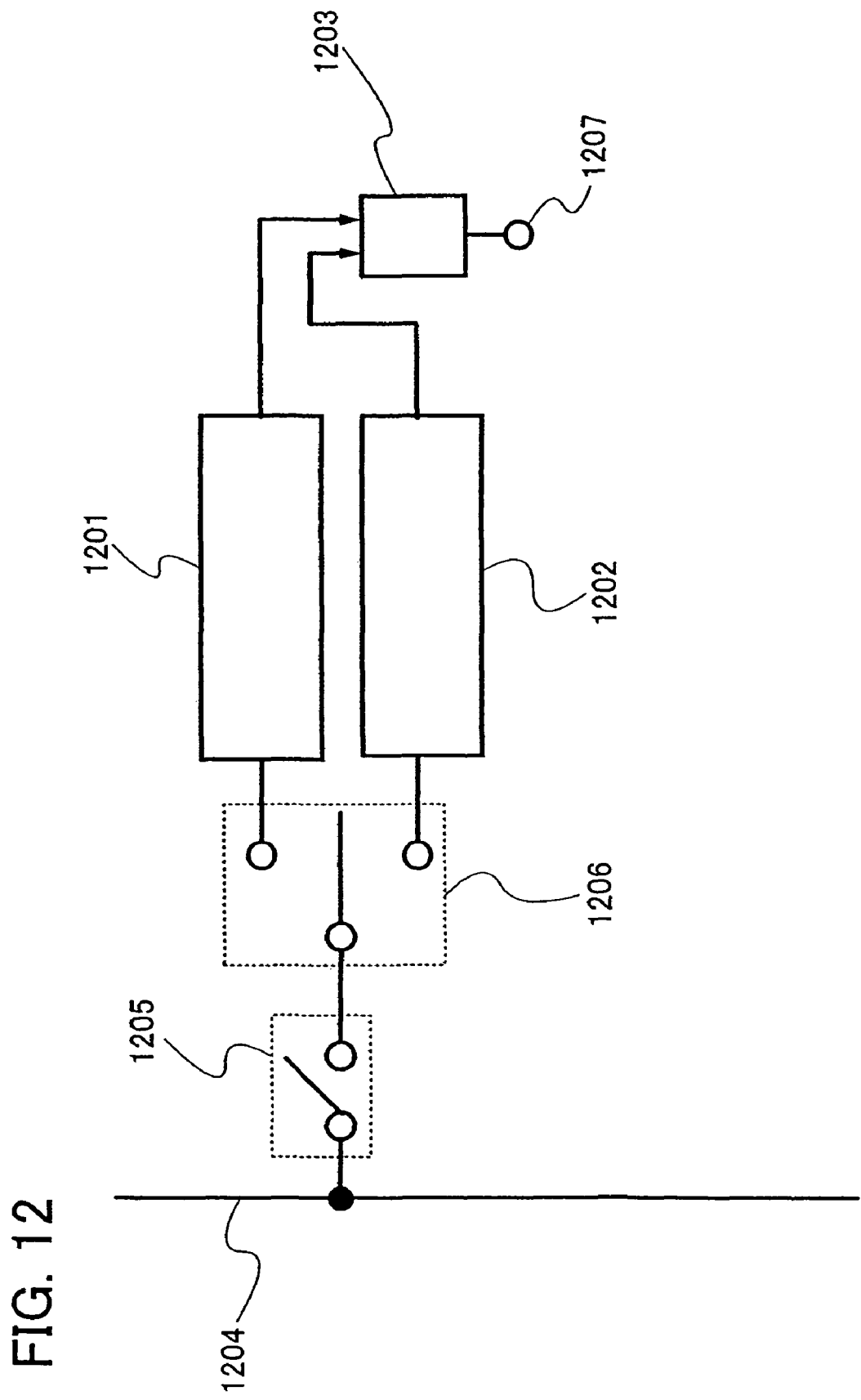
FIG. 12 is a diagram showing a pixel which can be applied to a display device of the invention.

First, FIG. 12 shows a basic structure of a pixel. Although only one pixel is shown here, a plurality of pixels are arranged in matrix in a row direction and a column direction in a pixel portion of a display device. The pixel includes an analog voltage holding circuit 1201, a digital signal memory circuit 1202, a display element 1203, a signal line 1204, a first switch 1205, and a second switch 1206.

In the case of this structure, the first switch 1205 is turned on in selecting the pixel.

In all pixels in the normal display mode and pixels in the power saving mode, the analog voltage holding circuit 1201 is selected by the second switch 1206. Then, an analog voltage corresponding to a video signal is inputted to the analog voltage holding circuit 1201 from the signal line 1204.

The analog voltage holding circuit 1201 holds the analog voltage and applies the voltage to the display element 1203. In this manner, a gray scale of the pixel is expressed in accordance with the analog voltage. Then, an analog voltage is inputted to the analog voltage holding circuit 1201 from the signal line 1204 in each frame period.

In the pixels in the power saving mode, the digital signal memory circuit 1202 is selected by the second switch 1206. Then, a digital signal which puts a pixel in a non-displaying state is inputted to the digital signal memory circuit 1202 from the signal line 1204.

The digital signal memory circuit 1202 stores the digital signal and applies a potential to a pixel electrode of the display element 1203. Then, a signal written to a pixel in a non-display area is stored by the digital signal memory circuit 1202; therefore, in the power saving mode, the number of times of rewriting a signal to the pixel in the non-display area is not required to be drastically reduced, or the signal is not required to be rewritten. Accordingly, power consumption can be drastically reduced.

Note that in the normal display mode, an analog voltage may be inputted to a pixel as a video signal, whereas in the power saving mode, a digital signal may be written to all pixels in both a display area and a non-display area as a video signal. In that case, a digital signal can express only 2 gray scales; therefore, multi-gray scale display can be performed by using an area gray scale method in combination. Alternatively, in the normal display mode, a moving image may be displayed, whereas in the power saving mode, a still image may be displayed.

The case of using an area gray scale method is described with reference to FIGS. 13 and 14.

Figure 13:
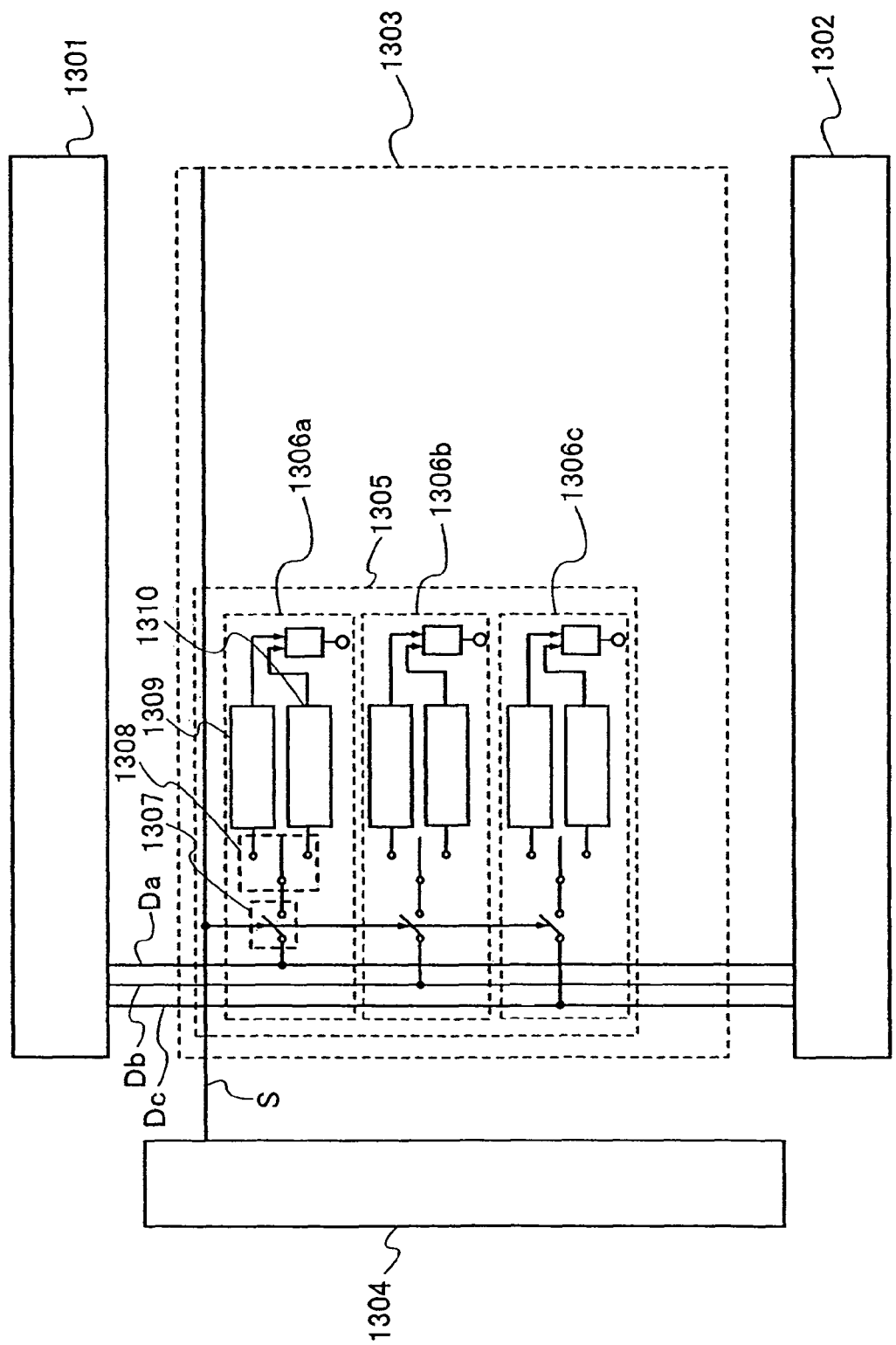
FIG. 13 is a diagram showing pixels which can be applied to a display device of the invention.

A display device in FIG. 13 includes a first signal line driver circuit 1301, a second signal line driver circuit 1302, a pixel portion 1303, and a scan line driver circuit 1304. In the pixel portion 1303, pixels 1305 are arranged in matrix corresponding to a scan line and a signal line.

Each of the pixels 1305 includes a sub-pixel 1306a, a sub-pixel 1306b, and a sub-pixel 1306c. Lighting regions of the sub-pixels are weighted. For example, the sizes of the lighting regions are set so as to satisfy $2^2:2^1:2^0$. This makes it possible to perform 3-bit display, that is, display with 8 gray scale levels.

Note that a first switch 1307 of the sub-pixel 1306*a* is connected to a signal line Da, a first switch 1307 of the sub-pixel 1306*b* is connected to a signal line Db, and a first switch 1307 of the sub-pixel 1306*c* is connected to a signal line Dc. By a signal inputted to a scan line S from the scan line driver circuit 1304, the first switches 1307 of the sub-pixel 1306*a*, the sub-pixel 1306*b*, and the sub-pixel 1306*c* are controlled to be turned on/off. In other words, the first switch 1307 is in an on state in a selected pixel. Then, an analog voltage or a digital signal is written to the analog voltage holding circuit 1309 or the digital signal memory circuit 1310 from each signal line.

In other words, in the case of the normal display mode, a signal is inputted to the scan line S to turn on the first switch 1307, and the analog voltage holding circuit 1309 is selected by the second switch 1308. Analog voltages corresponding to video signals are inputted from the first signal line driver circuit 1301 to the signal lines Da, Db, and Dc. Then, the analog voltage is held in the analog voltage holding circuit 1309 of each sub-pixel. Note that at that time, the analog voltages inputted to the signal lines Da, Db, and Dc which are connected in the same pixel column are equal or approximately equal to one another. Therefore, a gray scale can be expressed depending on the level of the analog voltage.

On the other hand, in the case of the power saving mode, a signal is inputted to the scan line S to turn on the first switch 1307, and the digital signal memory circuit 1310 is selected by the second switch 1308. A digital signal corresponding to a video signal is inputted from the second signal line driver circuit 1302 to the signal lines Da, Db, and Dc. Then, the digital signal is stored in the digital signal memory circuit 1310 of each sub-pixel. Note that a signal of each bit corresponding to the size of the lighting area of each sub-pixel is inputted as the digital signal inputted to each of the signal lines Da, Db, and Dc at that time. Therefore, a gray scale can be expressed by selecting lighting or non-lighting of each sub-pixel by the digital signal.

Figure 14:
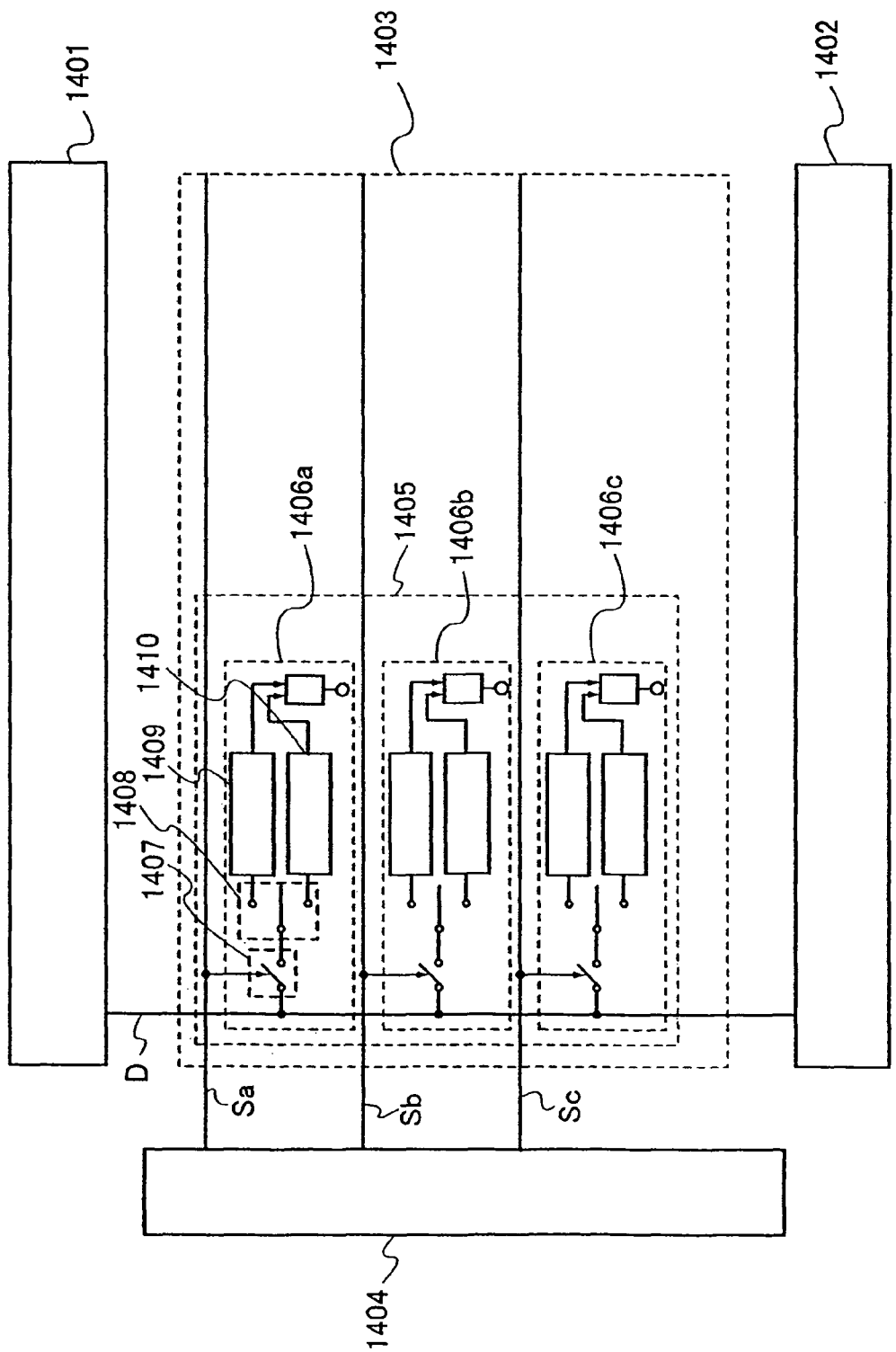
FIG. 14 is a diagram showing pixels which can be applied to a display device of the invention.

Next, a structure of FIG. 14 is described. A display device in FIG. 14 includes a first signal line driver circuit 1401, a second signal line driver circuit 1402, a pixel portion 1403, and a scan line driver circuit 1404. In the pixel portion 1403, pixels 1405 are arranged in matrix corresponding to a scan line and a signal line.

Each of the pixels 1405 includes a sub-pixel 1406*a*, a sub-pixel 1406*b*, and a sub-pixel 1406*c*. Lighting areas of the sub-pixels are weighted. For example, the sizes of the lighting areas are set so as to satisfy $2^2:2^1:2^0$. This makes it possible to perform 3-bit display, that is, display with 8 gray scale levels.

Note that first switches 1407 of the sub-pixels 1406*a*, 1406*b*, and 1406*c* are connected to a signal line D. Then, the first switch 1407 of the sub-pixel 1406*a* is controlled to be turned on/off by a signal inputted to a scan line Sa from the scan line driver circuit 1404; the first switch 1407 of the sub-pixel 1406*b* is controlled to be turned or/off by a signal inputted to a scan line Sb from the scan line driver circuit 1404; and the first switch 1407 of the sub-pixel 1406*c* is controlled to be turned on/off by a signal inputted from the scan line driver circuit 1404 to a scan line Sc. In other words, the first switch 1407 is in an on state in a selected pixel. Then, an analog voltage or a digital signal is written to the analog voltage holding circuit 1409 or the digital signal memory circuit 1410 from each signal line.

In other words, in the case of the normal display mode, signals are sequentially inputted to the scan lines Sa, Sb, and Sc to turn on the first switch 1407 of each sub-pixel, and the analog voltage holding circuit 1409 is selected by the second switch 1408. An analog voltage corresponding to a video signal is inputted from the first signal line driver circuit 1401 to the signal line D. Then, the analog voltage is sequentially held in the analog voltage holding circuit 1409 of each sub-pixel. Note that the analog voltages inputted to the signal line D while each sub-pixel is selected are equal or approximately equal to one another. Therefore, a gray scale can be expressed depending on the level of the analog voltage.

On the other hand, in the case of the power saving mode, signals are sequentially inputted to the scan lines Sa, Sb, and Sc to turn on the first switch 1407 of each sub-pixels, and the digital signal memory circuit 1410 is selected by the second switch 1408. A digital signal corresponding to a video signal is inputted from the second signal line driver circuit 1402 to the signal line D. Then, the digital signal is sequentially stored in the digital signal memory circuit 1410 of each sub-pixel. Note that a digital signal of each bit corresponding to the size of the lighting area of each sub-pixel is inputted while each sub-pixel is selected. Therefore, a gray scale can be expressed by selecting lighting or non-lighting of each sub-pixel by the digital signal.

Accordingly, when the partial display is performed in the display device of the invention in the case of power saving mode, the number of times of rewriting a signal to a pixel in a display area can be considerably reduced, or rewriting a signal is no more required.

Figure 15:
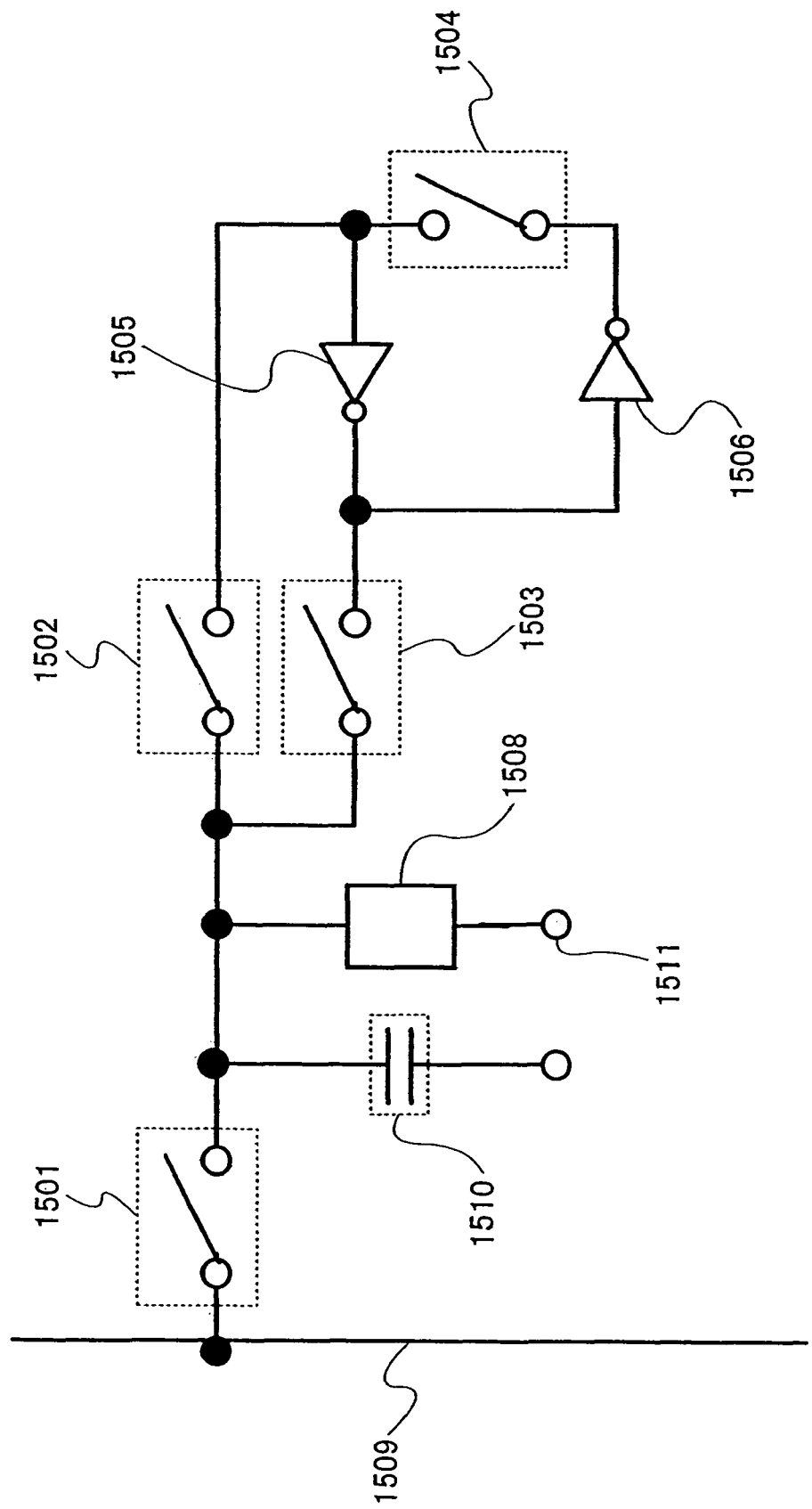
FIG. 15 is a diagram showing a pixel which can be applied to a display device of the invention.

In addition, FIG. 15 shows a structure example of a pixel including an analog voltage holding circuit and a digital signal memory circuit. The pixel includes a pixel selecting switch 1501, a first switch 1502, a second switch 1503, a third switch 1504, a first inverter 1505, a second inverter 1506, a display element 1508, a signal line 1509, and a capacitor 1510.

The pixel selecting switch 1501 is turned on when writing a signal to the pixel.

Here, in the case of the normal display mode, the first switch 1502 and the second switch 1503 are turned off. Note that the third switch 1504 may be in either an on state or an off state. Then, an analog voltage corresponding to a video signal is inputted from the signal line 1509, and a charge for the analog voltage is accumulated in the capacitor 1510. By turning off the pixel selecting switch 1501, the analog voltage is held in the capacitor 1510.

In this manner, a gray scale is expressed in accordance with the analog voltage.

On the other hand, in the case of the power saving mode, the first switch 1502 is turned on first, and then, the second switch 1503 is turned off. The third switch 1504 is turned on from an off state. A digital signal corresponding to a video signal is inputted from the signal line 1509 to the first inverter 1505, and the output from the first inverter 1505 is inputted to the second inverter 1506. Then, the output from the second inverter 1506 is inputted to the capacitor 1510 and the display element 1508. Even if the pixel selecting switch 1501 is turned off, the output from the second inverter 1506 can keep being inputted to a pixel electrode of the display element 1508. Note that the first switch 1502 and the third switch 1504 may be simultaneously turned on in the case where the digital signal has high drive capability.

When the digital signal is written to the pixel, the digital signal is stored as shown in FIG. 16A. In other words, the output from the first inverter 1505 is inputted to an input terminal of the second inverter 1506 as shown by an arrow, and the output from the second inverter 1506 is inputted to an input terminal of the first inverter 1505. Therefore, the digital signal written to the pixel can keep being stored.

In the case of applying a liquid crystal element to the display element 1508, image burn-in or the like is caused in the liquid crystal element when a DC voltage is applied to the liquid crystal element for a long time. Therefore, a voltage applied to the liquid crystal element is preferably inverted regularly. Thus, the first switch 1502 and the second switch 1503 are alternately turned on and off as shown in FIGS. 16A and 16B with the pixel selecting switch 1501 turned off and the third switch 1504 turned on. In addition, a potential applied to a counter electrode 1511 is also changed at timing when the first switch 1502 and the second switch 1503 are regularly turned on/off. In a white display pixel, an AC voltage is applied to the display element 1508. On the other hand, in a black display pixel, a voltage applied to the display element 1508 is set to be equal to or lower than a threshold voltage of the liquid crystal element.

For example, description is made with reference to FIG. 17 of the case where the pixel is put in a lighting state (white display) when a digital signal (Digital Video Data) inputted from the signal line 1509 is High (also referred to as an H level) and the pixel is put in a non-lighting state (black display) when the digital signal (Digital Video Data) is Low (also referred to as an L level). At this time, a potential applied to the counter electrode 1511 is set to be at an L level in a signal writing period to the pixel. In a writing time (referring to time for writing a signal to a selected pixel within the signal writing period to the pixel), the third switch 1504 is turned on from off with the pixel selecting switch 1501 turned on, the first switch 1502 turned on, and the second switch 1503 turned off. Then, in a power saving mode period, the pixel selecting switch 1501 is turned off and the third switch is turned on.

As shown in FIG. 17, in a pixel to which a High digital signal (Digital Video Data) is inputted from the signal line 1509 in the writing time (referring to time for writing a signal to a selected pixel within the signal writing period to the pixel), the first switch 1502 is turned on and the second switch 1503 is turned off in the power saving mode period. When an H level output from the second inverter 1506 is inputted to a pixel electrode of the display element 1508, an L level potential is applied to the counter electrode 1511 of the display element 1508. In addition, an H level potential is applied to the counter electrode 1511 of the display element 1508 when the first switch 1502 is turned off, the second switch 1503 is turned on, and an L level output from the first inverter 1505 is inputted to the pixel electrode of the display element 1508. Thus, an AC voltage can keep being applied to the display element 1508.

On the other hand, in a pixel to which a Low digital signal (Digital Video Data) is inputted from the signal line 1509 in the writing time (referring to time for writing a signal to a selected pixel within the signal writing period to the pixel), the first switch 1502 is turned on and the second switch 1503 is turned off in the power saving mode period. When the output at an L level from the second inverter 1506 is inputted to the pixel electrode of the display element 1508, a potential at an L level is applied to the counter electrode 1511 of the display element 1508. In addition, a potential at an H level is applied to the counter electrode 1511 of the display element 1508 when the first switch 1502 is turned off, the second switch 1503 is turned on, and the output at an H level from the first inverter 1505 is inputted to the pixel electrode of the display element 1508. Thus, a voltage applied to the display element 1508 can be set to be equal to or lower than a threshold voltage of the liquid crystal element.

Note that in the case of the power saving mode, a gray scale can be expressed using an area gray scale method or the like.

The case of applying an area gray scale method is briefly described with reference to FIG. 18. A pixel includes a sub-pixel 1800a, a sub-pixel 1800b, and a sub-pixel 1800c. Lighting regions of the sub-pixels are weighted. For example, the sizes of the lighting regions are set so as to satisfy $2^0:2^1:2^2$. This makes it possible to perform 3-bit display, that is, display with 8 gray scale levels.

Figure 18:
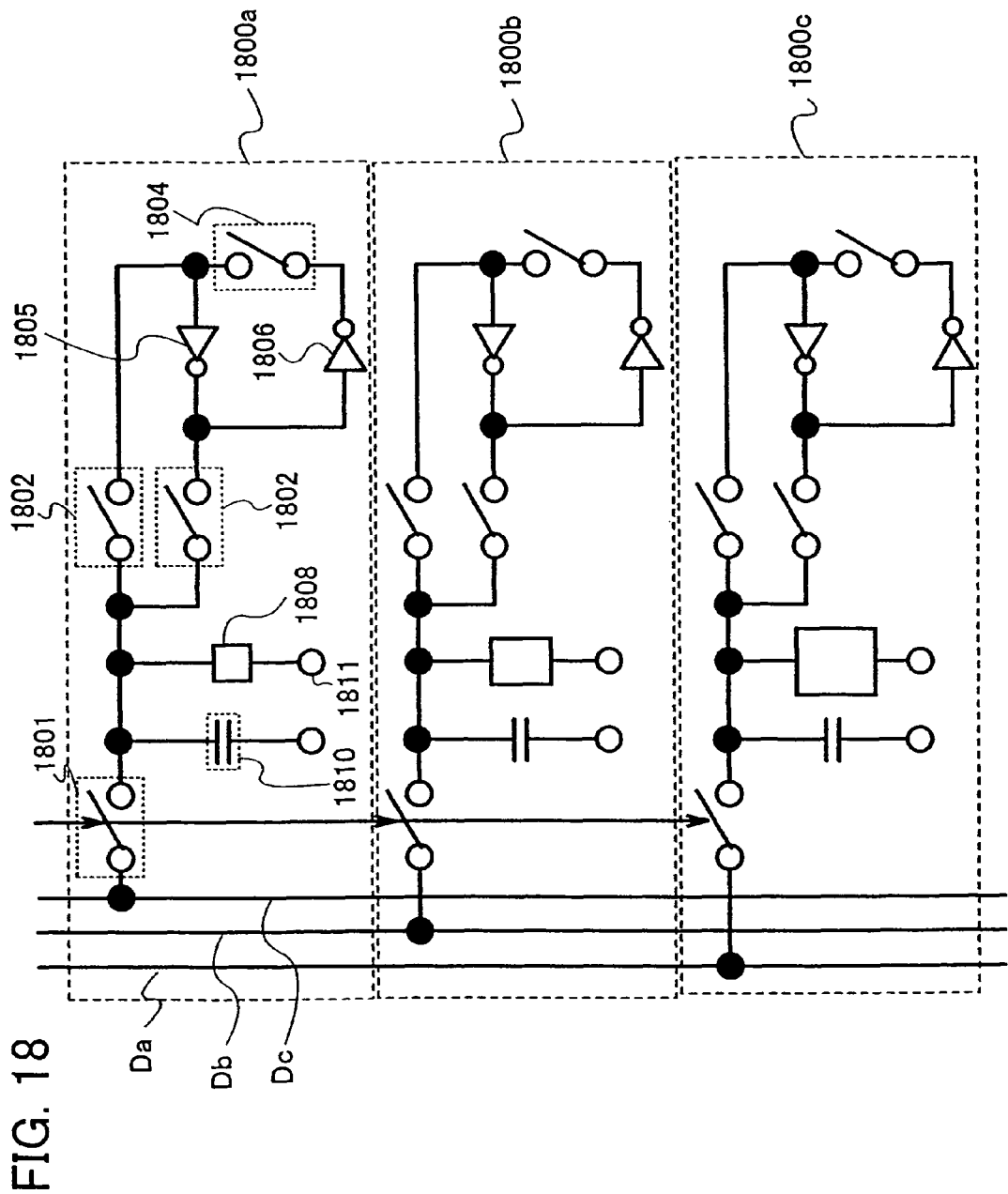
FIG. 18 is a diagram showing pixels which can be applied to a display device of the invention.

Note that a pixel selecting switch 1801, a first switch 1802, a second switch 1803, a third switch 1804, a first inverter 1805, a second inverter 1806, a display element 1808, and a capacitor 1810 in FIG. 18 correspond to the pixel selecting switch 1501, the first switch 1502, the second switch 1503, the third switch 1504, the first inverter 1505, the second inverter 1506, the display element 1508, and the capacitor 1510 of the pixel in FIG. 15, respectively. In FIG. 18, a signal line is provided for each sub-pixel as the signal line 1509 shown in FIG. 15. In other words, a pixel selecting switch 1801 of the sub-pixel 1800a is connected to a signal line Da; a pixel selecting switch 1801 of the sub-pixel 1800b is connected to a signal line Db; and a pixel selecting switch 1801 of the sub-pixel 1800c is connected to a signal line Dc. Then, a digital signal of each bit corresponding to the size of the lighting region of each sub-pixel is inputted from each signal line. Therefore, a gray scale can be expressed by selecting lighting or non-lighting of each sub-pixel by the digital signal.

Figure 19:
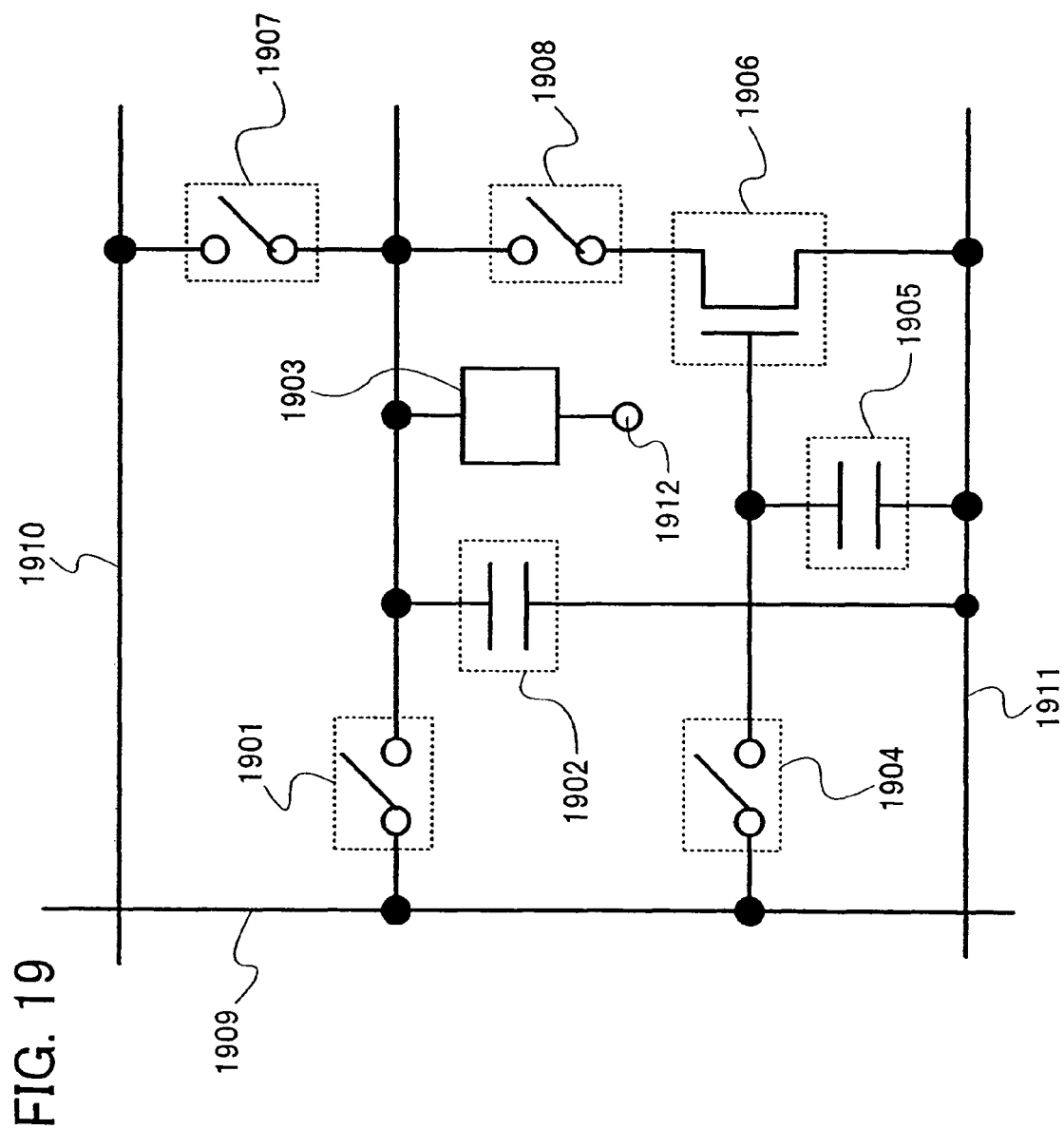
FIG. 19 is a diagram showing a pixel which can be applied to a display device of the invention.

Subsequently, FIG. 19 shows another structure example of a pixel including an analog voltage holding circuit and a digital signal memory circuit. The pixel includes a first pixel selecting switch 1901, a second pixel selecting switch 1904, a first capacitor 1902, a second capacitor 1905, a display element 1903, a transistor 1906, a first switch 1907, a second switch 1908, a signal line 1909, a first power source line 1910, and a second power source line 1911. Vrefh and Vrefl are alternately applied to the first power source line 1910, and Vcom is applied to the second power source line 1911. Here, Vrefh satisfies (Vrefh>Vcom) and (Vrefh−Vcom)>$V_{LCD}$, and Vrefl satisfies (Vrefl<Vcom) and (Vcom−Vrefl)>$V_{LCD}$. When Vrefh or Vrefl is applied to one electrode of the display element 1903 and Vcom is applied to the other electrode, a voltage equal to or higher than a threshold voltage $V_{LCD}$ is applied to the display element 1903. In addition, a potential equal or approximately equal to that of the second power source line 1911 is applied to a counter electrode 1912 of the display element 1903. In other words, when Vcom is applied to a pixel electrode of the display element 1903, the applied voltage of the display element 1903 is set to be equal to or lower than a threshold voltage $V_{LCD}$.

Figure 20:
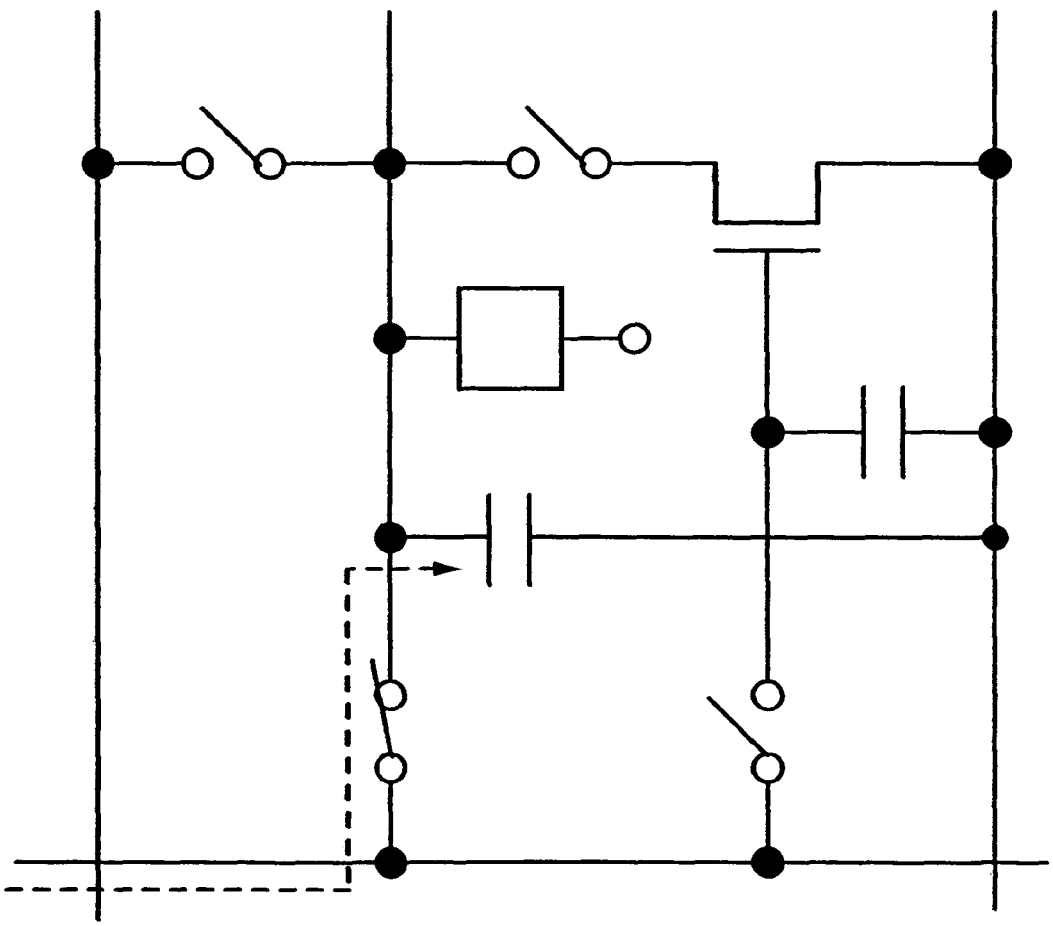
FIG. 20 is a diagram showing an operation of a pixel which can be applied to a display device of the invention.

Operation of the pixel is described. In the case of the normal display mode, the first pixel selecting switch 1901 is turned on, and the second pixel selecting switch 1904, the first switch 1907, and the second switch 1908 are turned off as shown in FIG. 20. Then, an analog potential in accordance with a gray scale level of the pixel is inputted to the signal line 1909. The analog potential corresponds to a video signal. Note that the pixel in FIG. 20 has the same structure as that of the pixel in FIG. 19; therefore, FIG. 19 can be referred to for the reference numerals.

Figure 21B:
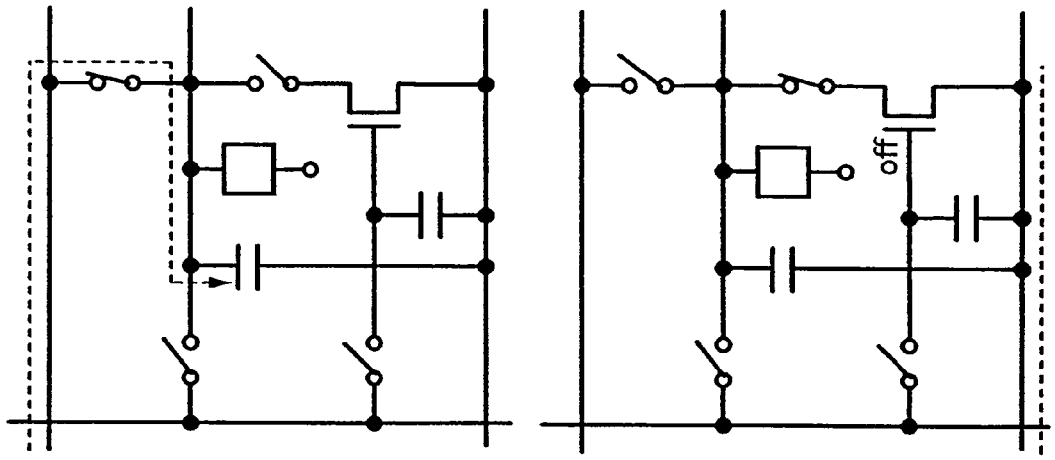
FIGS. 21A to 21D are diagrams showing operations of a pixel which can be applied to a display device of the invention.
Figure 21D:
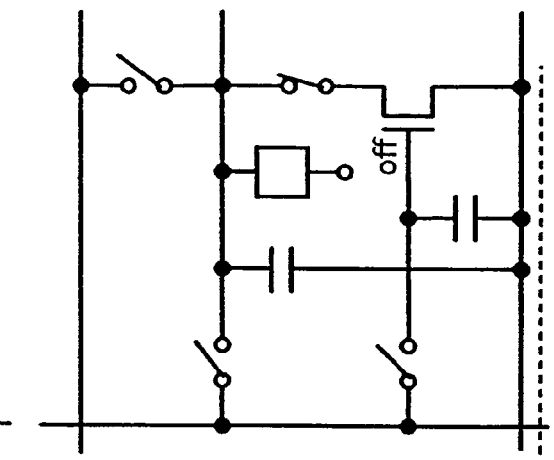
Figure 21A:
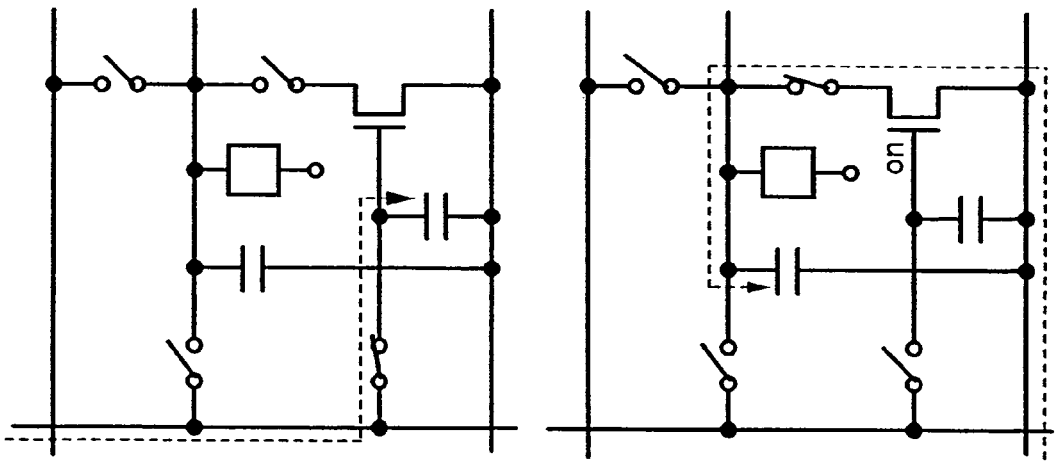

Subsequently, the case of the power saving mode is described. The second pixel selecting switch 1904 is turned on first, and then, the first pixel selecting switch 1901, the first switch 1907, and the second switch 1908 are turned off. Then, a digital signal is inputted to the signal line 1909. This digital signal corresponds to a video signal. Then, the signal is written to the second capacitor 1905 as shown in FIG. 21A.

Next, the second pixel selecting switch 1904 is turned off and the first switch 1907 is turned on, while the first pixel selecting switch 1901 and the second switch 1908 are turned off. Then, a potential Vrefh of the first power source line 1910 is applied to one electrode of the first capacitor 1902 as shown in FIG. 21B. In addition, a potential Vcom of the second power source line 1911 is applied to the other electrode of the first capacitor 1902; therefore, a charge for a potential difference (Vrefh-Vcom) is accumulated in the capacitor 1902. Note that a power source potential Vrefh is applied to the pixel electrode of the display element 1903 at that time.

Subsequently, the first switch 1907 is turned off and the second switch 1908 is turned on, while the first pixel selecting switch 1901 and the second pixel selecting switch 1904 are turned off. Then, the transistor 1906 is controlled to be turned on/off in accordance with a digital signal written to the second capacitor 1905.

Figure 21C:
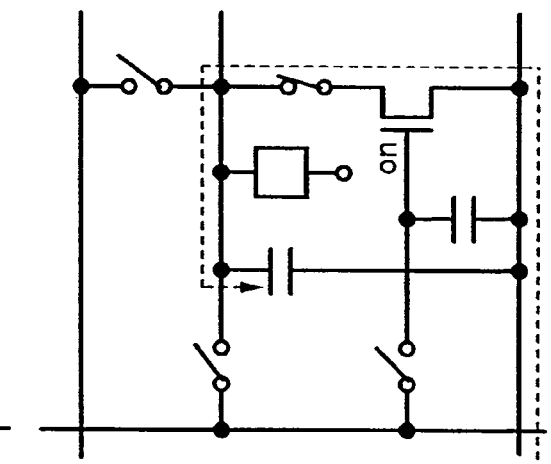

In other words, the transistor 1906 is turned on when the digital signal written to the second capacitor 1905 is at an H level; therefore, the potential Vcom of the second power source line 1911 is applied to both electrodes of the first capacitor 1902 as shown in FIG. 21C. Then, a potential of Vcom is applied to the pixel electrode of the display element 1903. Note that a voltage is hardly applied to the display element 1903 at that time since a potential approximately equal to Vcom is applied to the counter electrode 1912 of the display element 1903. Accordingly, the pixel is put in a non-lighting state. On the other hand, the transistor 1906 is turned off when the digital signal written to the second capacitor 1905 is at an L level; therefore, the first capacitor 1902 holds the voltage as shown in FIG. 21D. Accordingly, since a potential applied to the pixel electrode of the display element 1903 is kept at Vrefh, the pixel is put in a lighting state.

Subsequently, similar operation is performed with a potential of Vrefl applied to the first power source line 1910 in a next frame period. Then, a reverse bias voltage of that applied to the display element 1903 in the last frame period is applied to the display element 1903 of a lighting pixel Thus, the direction of bias applied to the display element 1903 can be changed by changing the potential applied to the first power source line 1910 in each frame period. Therefore, image burn-in of the display element 1903 can be prevented.

Note that the digital signal held in the second capacitor 1905 is acceptable as long as it can control the transistor 1906 to be turned on/off. Therefore, normal operation can be performed even if the charge accumulated in the second capacitor 1905 is slightly discharged. Accordingly, in the power saving mode, periodic rewriting of a digital signal to the pixel in a non-display area may be performed every several frame periods or ten-odd frame periods. Thus, power consumption can be reduced.

It is to be noted that a pixel structure which can be applied to a display device of the invention is not limited to the aforementioned structure. A static memory as shown in FIG. 15, a dynamic memory as shown in FIG. 19, or combination of these may be used for a digital signal memory circuit.

Embodiment Mode 4

Figure 22A:
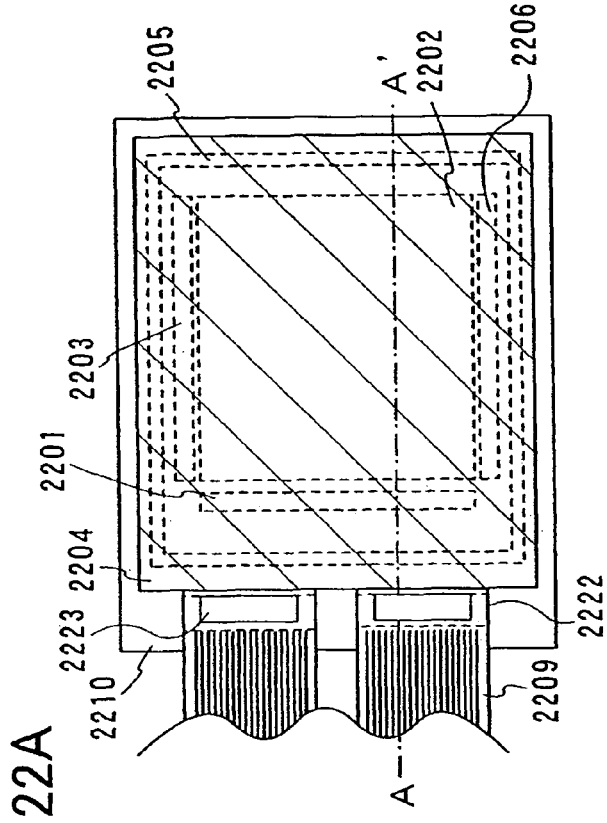
FIGS. 22A and 22B are diagrams showing a display panel of the invention.
Figure 22B:
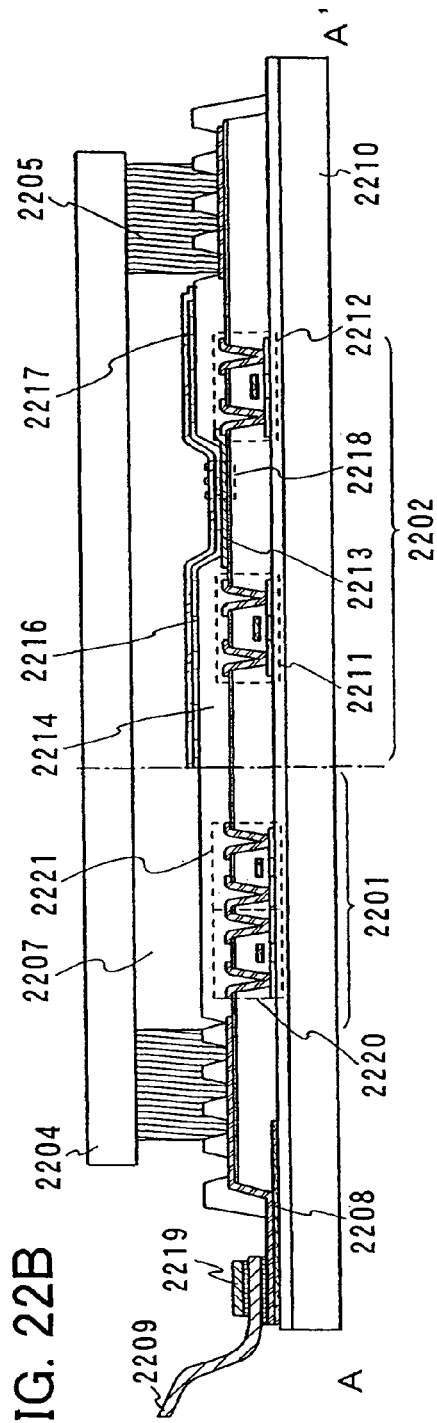

In this embodiment mode, description is made of a structure of a display panel having a pixel structure described in Embodiment Mode 2 with reference to FIGS. 22A and 22B.

Note that FIG. 22A is a top plan view showing a display panel, and FIG. 22B is a cross-sectional view of FIG. 22A taken along line A-A'. The display panel includes a signal line driver circuit 2201, a pixel portion 2202, a first scan line driver circuit 2203, and a second scan line driver circuit 2206, which are shown by dotted lines. It also includes a sealing substrate 2204 and a sealing material 2205, and a portion surrounded by the sealing material 2205 is a space 2207.

Note that a wire 2208 is a wire for transmitting a signal to be inputted to the first scan line driver circuit 2203, the second scan line driver circuit 2206, and the signal line driver circuit 2201, and receives a video signal, a clock signal, a start pulse signal, and the like through an FPC (flexible printed circuit) 2209 serving as an external input terminal. An IC chip (a semiconductor chip provided with a memory circuit, a buffer circuit, or the like) 2219 is mounted by COG (Chip On Glass) or the like over the junction of the FPC 2209 and the display panel. Note that only the FPC is shown here; however, a printed wiring board (PWB) may be attached to the FPC. The display device in this specification includes not only a display panel itself but also a display panel with an FPC or a PWB attached thereto.

Next, a cross-sectional structure is described with reference to FIG. 22B. The pixel portion 2202 and its peripheral driver circuits (the first scan line driver circuit 2203, the second scan line driver circuit 2206, and the signal line driver circuit 2201) are formed on a substrate 2210. Here, the signal line driver circuit 2201 and the pixel portion 2202 are shown.

It is to be noted that as the signal line driver circuit 2201 includes a TFT 2220 and a TFT 2221. In this embodiment mode, the display panel in which the peripheral driver circuits are formed on one substrate is described; however, the invention is not limited to this. All or a part of the peripheral driver circuits may be formed into an IC chip or the like and mounted by COG or the like.

The pixel portion 2202 includes a TFT 2211 and a TFT 2212. Note that a source electrode of the TFT 2212 is connected to a first electrode (pixel electrode) 2213. An insulator 2214 is formed so as to cover end portions of the first electrode 2213. Here, a positive photosensitive acrylic resin film is used.

The insulator 2214 is formed so as to have a curved surface with a curvature at an upper end portion or a lower end portion thereof in order to make the coverage favorable. For example, in the case of using positive photosensitive acrylic as a material of the insulator 2214, the insulator 2214 is preferably formed so as to have a curved surface with a curvature radius (0.2 μm to 3 μm) only at the upper end portion. Either a negative type which becomes insoluble in an etchant by light irradiation or a positive type which becomes soluble in an etchant by light irradiation can be used as the insulator 2214.

A layer 2216 containing an organic compound and a second electrode (counter electrode) 2217 are formed on the first electrode 2213. Here, a material having a high work function is preferably used for the first electrode 2213 which functions as an anode. For example, the first electrode 2213 can be formed using a single-layer film such as an indium tin oxide (ITO) film, an indium zinc oxide (IZO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and a titanium nitride film; or the like. When the first electrode 2213 has a stacked layer structure, it can have low resistance as a wire and form a favorable ohmic contact. Further, the first electrode 2213 can function as an anode.

In addition, the layer 2216 containing an organic compound is formed by a deposition method using an deposition mask or an ink-jet method. A metal complex belonging to Group 4 of the Periodic Table is used for a part of the layer 2216 containing an organic compound, and a material which can be used in combination may be either a low molecular material or a high molecular material. In addition, as a material used for the layer containing an organic compound, a single layer or a stacked layer of an organic compound is often used generally. In addition, this embodiment also includes a structure in which an inorganic compound is used for a part of the film formed of an organic compound. Moreover, a known triplet material can also be used.

As a material used for the second electrode 2217 (cathode) which is formed on the layer 2216 containing an organic compound, a material having a low work function Al, Ag, Li; Ca, or an alloy thereof such as MgAg, MgIn, AlLi, $CaF_2$, or $Ca_3N_2$) may be used. In the case where light generated in the layer 2216 containing an organic compound is transmitted through the second electrode 2217 (cathode), a stacked layer of a metal thin film with a thin thickness and a light-transmissive conductive film (an alloy of indium tin oxide (ITO), an alloy of indium oxide and zinc oxide ($In_2O_3$—ZnO), zinc oxide (ZnO), or the like) is preferably used as the second electrode 2217 (cathode).

By attaching the sealing substrate 2204 to the substrate 2210 with the sealing material 2205, a light emitting element 2218 is provided in the space 2207 surrounded by the substrate 2210, the sealing substrate 2204, and the sealing material 2205. Note that there is also a case where the space 2207 is filled with the sealing material 2205 as well as a case where the space 2207 is filled with an inert gas (such as nitrogen or argon).

Note that an epoxy-based resin is preferably used as the sealing material 2205. The material preferably allows as little moisture and oxygen as possible to penetrate. As the sealing substrate 2204, a plastic substrate formed of FRP (Fiberglass-Reinforced Plastics), PVF (polyvinyl fluoride), myler, polyester, acrylic, or the like can be used besides a glass substrate or a quartz substrate.

The display panel having the pixel structure of the invention can be obtained as described above. It is to be noted that the aforementioned structure is one example, and a display panel structure of the invention is not limited to this.

By forming the signal line driver circuit 2201, the pixel portion 2202, the first scan line driver circuit 2203, and the second scan line driver circuit 2206 over one substrate as shown in FIGS. 22A and 22B, cost of the display device can be reduced.

Figure 28A:
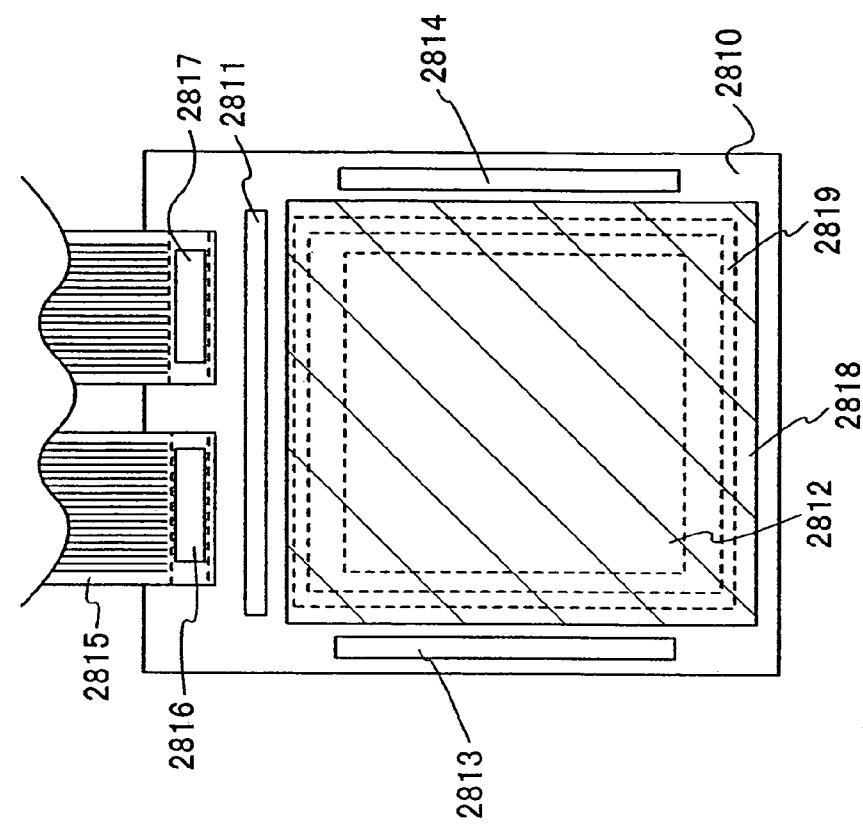
FIGS. 28A and 28B are diagrams showing display panels of the invention.

Note that the structure of the display panel is not Limited to a structure in which the signal line driver circuit 2201, the pixel portion 2202, the first scan line driver circuit 2203, and the second scan line driver circuit 2206 are formed over one substrate as shown in FIG. 22A, and a structure may be employed in which a signal line driver circuit 2801 shown in FIG. 28A corresponding to the signal line driver circuit 2201 is formed into an IC chip and mounted on a display panel by COG or the like. Note that a substrate 2800, a pixel portion 2802, a first scan line driver circuit 2804, a second scan line driver circuit 2803, an FPC 2805, an IC chip 2806, an IC chip 2807, a sealing substrate 2808, and a sealing material 2809 of FIG. 28A correspond to the substrate 2210, the pixel portion 2202, the first scan line driver circuit 2203, the second scan line driver circuit 2206, the FPC 2209, the IC chip 2222, the IC chip 2223, the sealing substrate 2204, and the sealing material 2205 of FIG. 22A, respectively.

In other words, only a signal line driver circuit which requires high speed operation is formed into an IC chip using a CMOS or the like so as to reduce power consumption. In addition, by using a semiconductor chip of a silicon wafer or the like as the IC chip, higher-speed operation and lower power consumption can be achieved.

Furthermore, cost reduction can be achieved by forming the first scan line driver circuit 2804, the second scan line driver circuit 2803, and the pixel portion 2802 over one substrate.

Thus, cost of a high-definition display device can be reduced. In addition, a substrate area can be used efficiently by mounting an IC chip provided with a functional circuit (memory or buffer) on a connecting portion of the FPC 2805 and the substrate 2800.

Figure 28B:
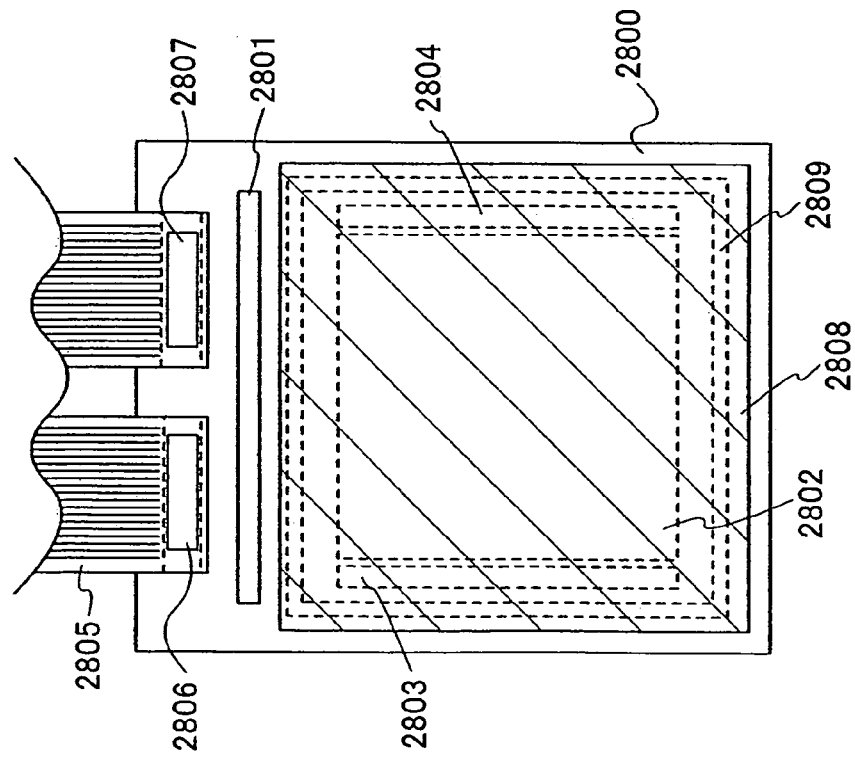

In addition, a structure may be employed in which a signal line driver circuit 2811, a first scan line driver circuit 2814, and a second scan line driver circuit 2813 of FIG. 28B corresponding to the signal line driver circuit 2201, the first scan line driver circuit 2203, and the second scan line driver circuit 2206 of FIG. 22A are formed into an IC chip and mounted on a display panel by COG or the like. In this case, power consumption of a high-definition display device can further be reduced. Therefore, polysilicon is preferably used for a semiconductor layer of a transistor used in a pixel portion to provide a display device which consumes lower power. Note that a substrate 2810, a pixel portion 2812, an FPC 2815, an IC chip 2816, an IC chip 2817, a sealing substrate 2818, and a sealing material 2822 of FIG. 28B correspond to the substrate 2210, the pixel portion 2202, the FPC 2209, the IC chip 2222, the IC chip 2223, the sealing substrate 2204, and the sealing material 2205 of FIG. 22A, respectively.

In addition, cost reduction can be achieved by using amorphous silicon for a semiconductor layer of a transistor of the pixel portion 2812. Furthermore, a large display panel can be manufactured.

Further, the first scan line driver circuit and the second scan line driver circuit, and the signal line driver circuit are not necessarily provided in a row direction and a column direction of the pixel. For example, a peripheral driver circuit 2901 formed into an IC chip as shown in FIG. 29A may have functions of the first scan line driver circuit 2814, the second scan line driver circuit 2813, and the signal line driver circuit 2811 shown in FIG. 28B. Note that a substrate 2900, a pixel portion 2902, an FPC 2904, an IC chip 2905, an IC chip 2906, a sealing substrate 2907, and a sealing material 2908 of FIG. 29A correspond to the substrate 2210, the pixel portion 2202, the FPC 2209, the IC chip 2222, the IC chip 2223, the sealing substrate 2204, and the sealing material 2205 of FIG. 22A, respectively.

Note that FIG. 29B is a schematic diagram showing the connection of wires of the display device of FIG. 29A. The display device includes a substrate 2910, a peripheral driver circuit 2911, a pixel portion 2912, an FPC 2913, and an FPC 2914. A signal and a power source potential from the external are inputted to the peripheral driver circuit 2911 through the FPC 2913. Then, the output from the peripheral driver circuit 2911 is inputted to a wire connected to a pixel included in the pixel portion 2912, in a row direction and a wire in a column direction.

Figure 23A:
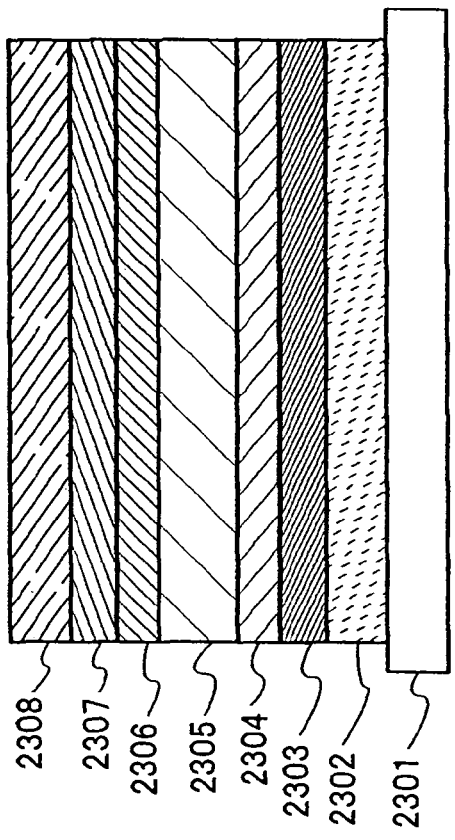
FIGS. 23A and 23B are diagrams showing light emitting elements which can be applied to a display device of the invention.
Figure 23B:
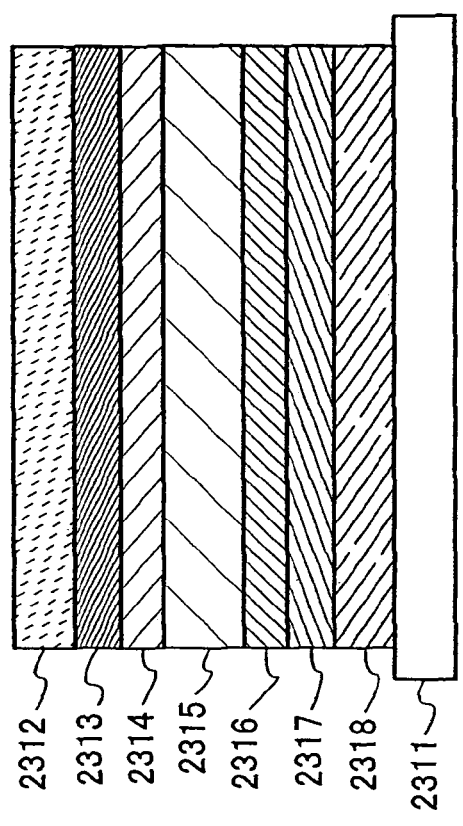

Furthermore, an example of a light emitting element applicable to the light emitting element 2218 is shown in FIGS. 23A and 23B. In other words, a structure of a light emitting element applicable to the pixel described in Embodiment Modes 1 to 4 is explained with reference to FIGS. 23A and 23B. It is to be noted that a light emitting element using an organic material is described here as an example; however, it is needless to say that a light emitting element using an inorganic material can be applied to the invention.

In a light emitting element shown in FIG. 23A, an anode 2302, a hole injection layer 2303 formed of a hole injecting material, a hole transporting layer 2304 formed of a hole transporting material, a light emitting layer 2305, an electron transporting layer 2306 formed of an electron transporting material, an electron injection layer 2307 formed of an electron injecting material, and a cathode 2308 are stacked over a substrate 2301 in this order. Here, the light emitting layer 2305 may be formed of only one kind of light emitting material; however, it may also be formed of two or more kinds of materials. The structure of the element of the invention is not limited to this.

In addition to the stacked layer structure shown in FIG. 23A where each functional layer is stacked, there are wide variations such as an element formed of a high molecular compound, a high efficiency element which utilizes a triplet light emitting material which emits light from a triplet excitation state in a light emitting layer. It is also possible to apply to a white light emitting element which can be obtained by dividing a light emitting region into two regions, by controlling a recombination region of carriers using a hole blocking layer, and the like.

The element of the invention shown in FIG. 23A can be formed by sequentially depositing a hole injecting material, a hole transporting material, and a light emitting material over the substrate 2301 having the anode 2302 (ITO). Next, an electron transporting material and an electron injecting material are deposited, and finally the cathode 2308 is deposited.

Materials suitable for the hole injecting material, the hole transporting material, the electron transporting material, the electron injecting material, and the light emitting material are as follows.

As the hole injecting material, an organic compound such as a porphyrin-based compound, a phthalocyanine (hereinafter referred to as "$H_2Pc$"), copper phthalocyanine (hereinafter referred to as "CuPc"), or the like is effective. Further, a material that has a smaller value of an ionization potential than that of the hole transporting material to be used and has a hole transporting function can also be used as the hole injecting material. There is also a material obtained by chemically doping a conductive high molecular compound, which includes polyaniline and polyethylene dioxythiophene (hereinafter referred to as "PEDOT") doped with polystyrene sulfonate (hereinafter referred to as "PSS"). Also, a high molecular compound of an insulator is effective in terms of planarization of an anode, and polyimide (hereinafter referred to as "PI") is often used. Further, an inorganic compound is also used, which includes an ultrathin film of aluminum oxide (hereinafter referred to as "alumina") in addition to a thin film of a metal such as gold or platinum.

It is an aromatic amine-based (that is, one having a bond of benzene ring-nitrogen) compound that is most widely used as the hole transporting material. A material that is widely used includes 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD"), 4,4'-bis[N-(1-naphthyl)-N-phenyl-amino]-biphenyl (hereinafter referred to as "α-NPD"), and star burst aromatic amine compounds such as 4,4',4"-tris(N,N-diphenyl-amino)-triphenylamine (hereinafter referred to as "TDATA") and 4,4',4"-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as Alq, BAlq, tris(4-methyl-8-quinolinolato)aluminum (hereinafter referred to as "Almq"), or bis(10-hydroxybenzo[h]-quinolinato)beryllium (hereinafter referred to as "BeBq"), and in addition, a metal complex having an oxazole-based or thiazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$"). Further, in addition to the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-S-(4-biphenylyl)-2,3,4-triazole (hereinafter referred to as "p-EtTAZ"), and phenanthroline derivatives such as bathophenanthroline (hereinafter referred to as "BPhen") and BCP have an electron transporting property.

As the electron injecting material, the above-mentioned electron transporting materials can be used. In addition, an ultrathin film of an insulator, for example, metal halide such as calcium fluoride, lithium fluoride, or cesium fluoride, alkali metal oxide such as lithium oxide, or the like is often used. Further, an alkali metal complex such as lithium acetyl acetonate (hereinafter referred to as "Li(acac)") or 8-quinotinolato-lithium (hereinafter referred to as "Liq") is also effective.

As the light emitting material, in addition to the above-mentioned metal complexes such as Alq, Almq, BeBq, BAlq, $Zn(BOX)_2$, and $Zn(BTZ)_2$, various fluorescent pigments are effective. The fluorescent pigments include 4,4'-bis(2,2-diphenyl-vinyl)-biphenyl, which is blue, and 4-dicyanomethylene)-2-methyl-6-(p-dimethylaminostyryl)-4H-pyran, which is red-orange, and the like. Also, a triplet light emitting material is available, which mainly includes a complex with platinum or iridium as a central metal. As the triplet light emitting material, tris(2-phenylpyridine)iridium, bis(2-(4'-tolyl)pyridinato-N,$C^{2'}$)acetylacetonato iridium (hereinafter referred to as "$acacIr(tpy)_2$"), 2,3,7,8,12,13,17,18-octaethyl-21H,23Hporphyrin-platinum, and the like are known.

By using the materials each having the function as described above in combination, a highly reliable light emitting element can be formed.

Further, a light emitting element in which layers are formed in a reverse order to that of FIG. 23A can be used as shown in FIG. 23B. That is, a cathode 2318, an electron injection layer 2317 formed of an electron injecting material, an electron transporting layer 2316 formed of an electron transporting material, a light emitting layer 2315, a hole transporting layer 2314 formed of a hole transporting material, a hole injection layer 2313 formed of a hole injecting material, and an anode 2312 are stacked in this order over a substrate 2311.

In addition, in order to extract light emission of a light emitting element, at least one of an anode and a cathode is required to transmit light. A TFT and a light emitting element are formed over a substrate and there are light emitting elements having a top emission structure where light emission is extracted through a surface opposite to the substrate, having a bottom emission structure where light emission is extracted through a surface on the substrate side, and having a dual emission structure where light emission is extracted through a surface opposite to the substrate and a surface on the substrate side respectively. The pixel structure of the invention can be applied to the light emitting element having any emission structure.

Figure 24A:
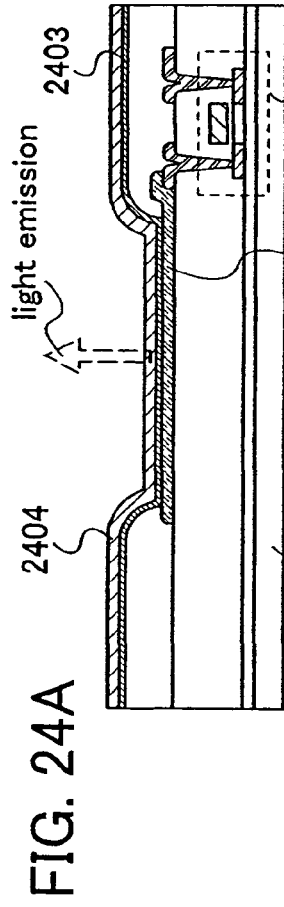
FIGS. 24A to 24C are diagrams showing a display panel of the invention.

Description is made with reference to FIG. 24A of a light emitting element with a top emission structure.

A driving TFT 2401 is formed over a substrate 2400 and a first electrode 2402 is formed in contact with a source electrode of the driving TFT 2401, over which a layer 2403 containing an organic compound and a second electrode 2404 are formed.

Further, the first electrode 2402 is an anode of a light emitting element. The second electrode 2404 is a cathode of the light emitting element. That is, a region where the layer 2403 containing an organic compound is interposed between the first electrode 2402 and the second electrode 2404 corresponds to the light emitting element.

Further, as a material used for the first electrode 2402 which functions as an anode, a material having a high work function is preferably used. For example, a single layer of a titanium nitride film, a chromium film, a tungsten film, a Zn film, a Pt film, or the like, a stacked layer of a titanium nitride film and a film containing aluminum as a main component, a stacked layer of three layers of a titanium nitride film, a film containing aluminum as a main component, and a titanium nitride film, or the like can be used. With a stacked layer structure, the resistance as a wire is low, a preferable ohmic contact can be obtained, and further a function as an anode can be obtained. By using a metal film which reflects light, an anode which does not transmit light can be formed.

As a material used for the second electrode 2404 which functions as a cathode, a stacked layer of a metal thin film formed of a material having a low work function (Al, Ag, Li, Ca, or an alloy thereof such as MgAg, MgIn, AlLi, $CaF_2$, or $Ca_3N_2$) and a light-transmissive conductive film (indium tin oxide (ITO), indium zinc oxide (IZO), zinc oxide (ZnO), or the like) is preferably used. By using a metal thin film and a light-transmissive conductive film in this manner, a cathode which can transmit light can be formed.

In this manner, light from the light emitting element can be extracted to the top surface as shown by an arrow in FIG. 24A. That is, in the case of applying to the display panel shown in FIGS. 22A and 22B, light is emitted to the sealing substrate 2204 side. Therefore, in the case of using a light emitting element with a top emission structure to a display device, a substrate which transmits light is used as the sealing substrate 2204.

In the case of providing an optical film, an optical film may be provided over the sealing substrate 2204.

It is to be noted that a metal film formed of a material which functions as a cathode and has a low work function, such as MgAg, MgIn, or AlLi can be used for the first electrode 2402. For the second electrode 2404, a light-transmissive conductive film such as an ITO (indium tin oxide) film or an indium zinc oxide (IZO) film can be used. Accordingly, with this structure, the transmittance of the top light emission can be improved.

Figure 24B:
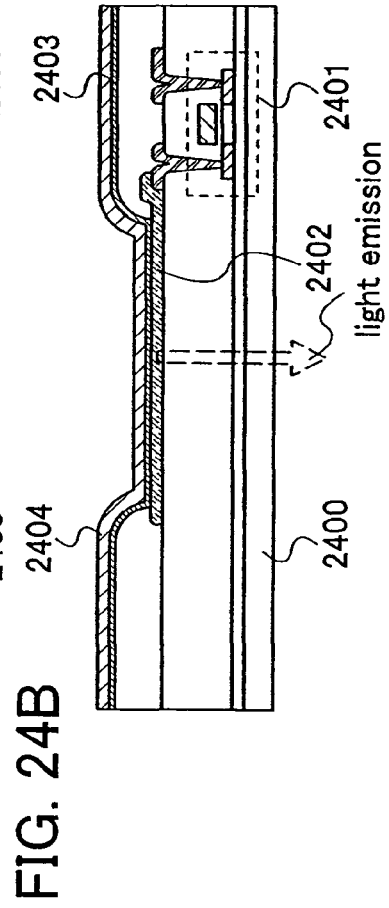

Further, description is made of a light emitting element with a bottom emission structure with reference to FIG. 24B. The same reference numerals as those in FIG. 24A are used since the structures are the same except for the light emission structure.

Here, as a material used for the first electrode 2402 which functions as an anode, a material having a high work function is preferably used. For example, a light-transmissive conductive film such as an indium tin oxide (ITO) film or an indium zinc oxide (IZO) film can be used. By using a light-transmissive conductive film, an anode which can transmit light can be formed.

As a material used for the second electrode 2404 which functions as a cathode, a metal film formed of a material having a low work function (Al, Ag, Li, Ca, or an alloy thereof such as MgAg, MgIn, AlLi, $CaF_2$, or $Ca_3N_2$) can be used. By using a metal film which reflects light, a cathode which does not transmit light can be formed.

In this manner, light from the light emitting element can be extracted to a bottom surface as shown by an arrow in FIG. 24B. That is, in the case of applying to the display panel shown in FIGS. 22A and 22B, light is emitted to the substrate 2210 side. Therefore, in the case of using a light emitting element with a bottom emission structure for a display device, a substrate which transmits light is used as the substrate 2240.

In the case of providing an optical film, an optical film may be provided over the substrate 2210.

Figure 24C:
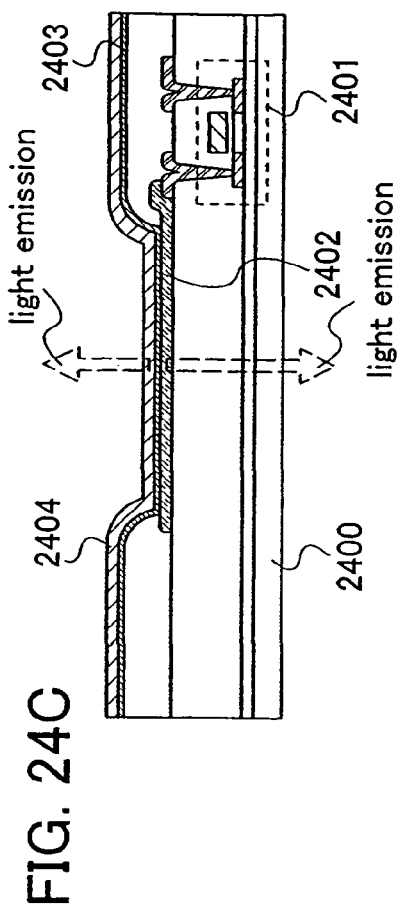

Description is made with reference to FIG. 24C of a light emitting element with a dual emission structure. The same reference numerals as those in FIG. 24A are used since the structures are the same except for the light emission structure.

Here, as a material used for the first electrode 2402 which functions as an anode, a material having a high work function is preferably used. For example, a light-transmissive conductive film such as an ITO (indium tin oxide) film or an indium zinc oxide (IZO) film can be used. By using a light-transmissive conductive film, an anode which can transmit light can be formed.

As a material used for the second electrode 2404 which functions as a cathode, a stacked layer of a metal thin film formed of a material having a low work function (Al, Ag, Li, Ca, or an alloy thereof such as MgAg, MgIn, AlLi, $CaF_2$, or $Ca_3N_2$), and a light-transmissive conductive film (ITO (indium tin oxide), indium oxide zinc oxide ($In_2O_3$—ZnO) alloy, zinc oxide (ZnO), or the like) is preferably used. By using a metal thin film and a light-transmissive conductive film in this manner, a cathode which can transmit light can be formed.

In this manner, light from the light emitting element can be extracted to the both surfaces as shown by arrows of FIG. 24C. That is, in the case of applying to the display panel shown in FIGS. 22A and 22B, light is emitted to the substrate 2210 side and the sealing substrate 2204 side. Therefore, in the case of applying a light emitting element with a dual emission structure to a display device, substrates which transmit light are used as the substrate 2210 and the sealing substrate 2204.

In the case of providing an optical film, optical films may be provided over both the substrate 2210 and the sealing substrate 2204.

The invention can also be applied to a display device which realizes full color display by using a white light emitting element and a color filter.

As shown in FIG. 25, a base film 2502 is formed over a substrate 2500 and a driving TFT 2501 is formed thereover. A first electrode 2503 is formed in contact with a source electrode of the driving TFT 2501 and a layer 2504 containing an organic compound and a second electrode 2505 are formed thereover.

The first electrode 2503 is an anode of a light emitting element. The second electrode 2505 is a cathode of the light emitting element. That is, a region where the layer 2504 containing an organic compound is interposed between the first electrode 2503 and the second electrode 2505 corresponds to the light emitting element. In the structure shown in FIG. 25, white light is emitted. A red color filter 2506R, a green color filter 2506G, and a blue color filter 2506B are provided over the light emitting element, thereby full color display can be carried out. Further, a black matrix (also referred to as BM) 2507 for separating these color filters is provided.

The aforementioned structures of the light emitting element can be used in combination and can be appropriately used for the display device having the pixel structure of the invention. The structures of the display panel and the light emitting elements described above are examples, and it is needless to say that the pixel structure of the invention can be applied to display devices having other structures.

Next, a partial cross-sectional view of a pixel portion of a display panel is described.

First, description is made of the case of using a crystalline semiconductor film (polysilicon (p-Si) film) as a semiconductor layer of a transistor with reference to FIGS. 26A and 26B and FIGS. 27A and 27B.

Here, the semiconductor layer is obtained by, for example, forming an amorphous silicon (a-Si) film over a substrate by a known film deposition method. Note that the semiconductor film is not limited to the amorphous silicon film, and any semiconductor film having an amorphous structure (including a microcrystalline semiconductor film) may be used. Further, a compound semiconductor film having an amorphous structure, such as an amorphous silicon germanium film may be used.

Then, the amorphous silicon film is crystallized by laser crystallization, thermal crystallization using RTA or an annealing furnace, thermal crystallization using a metal element which promotes crystallization, or the like. Needless to say, such crystallization may be carried out in combination.

As a result of the aforementioned crystallization, a crystallized region is formed in a part of the amorphous semiconductor film.

In addition, the crystalline semiconductor film having a partially increased crystallinity is patterned into a desired shape, and an island-shaped semiconductor film is formed using the crystallized region. The semiconductor film is used as the semiconductor layer of the transistor. Note that patterning is to process a film shape, which means forming a film pattern by a photolithography technique (including forming contact hole in photosensitive acrylic and processing photosensitive acrylic so as to be a spacer), forming a mask pattern by a photolithography technique and etching with the use of the mask pattern, or the like.

As shown in FIGS. 26A and 26B, a base film 2602 is formed over a substrate 2601, and a semiconductor layer is formed thereover. The semiconductor layer includes a channel forming region 2603 and an impurity region 2605 functioning as a source or drain region, which are in a driving transistor 2618, and a channel forming region 2606, an LDD region 2607, and an impurity region 2608, which function as a lower electrode of a capacitor 2619. Note that channel doping may be carried out to the channel forming regions 2603 and 2606.

As the substrate, a glass substrate, a quartz substrate, a ceramic substrate, a plastic substrate, or the like can be used. The base film 2602 can be formed using a single layer of aluminum-nitride (AlN), silicon oxide ($SiO_2$), silicon oxynitride ($SiO_xN_y$), or the like, or stacked layers thereof.

A gate electrode 2610 and an upper electrode 2611 of the capacitor 2619 are formed over the semiconductor layer with a gate insulating film 2609 interposed therebetween.

An interlayer insulating film 2612 is formed so as to cover the driving transistor 2618 and the capacitor 2619. Then, a contact hole is formed in the interlayer insulating film 2612, through which a wire 2613 and a wire 2621 are in contact with the impurity region 2605 and the impurity region 2608, respectively. A pixel electrode 2614 is formed in contact with the wire 2613, and a second interlayer insulator 2615 is formed so as to cover end portions of the pixel electrode 2614 and the wire 2613. Here, the second interlayer insulator 2615 is formed using a positive photosensitive acrylic resin film. Then, a layer 2616 containing an organic compound and a counter electrode 2617 are formed over the pixel electrode 2614. Thus, a light emitting element 2620 corresponds to a region where the layer 2616 containing an organic compound is interposed between the pixel electrode 2614 and the counter electrode 2617.

In addition, the LDD region which forms a part of the lower electrode of the capacitor 2619 may overlap the upper electrode 2611. That is, the capacitor 2619 may have a region 26202 as shown in FIG. 26B. Note that common portions to those in FIG. 26A are denoted by the same reference numerals, and description thereof is omitted.

Figure 27A:
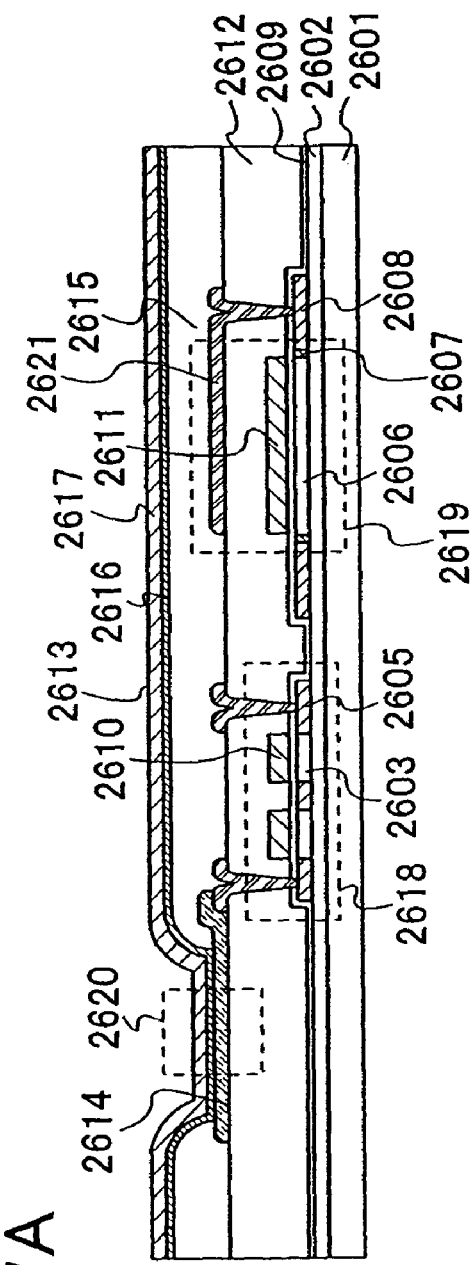
FIGS. 27A and 27B are diagrams showing structures of a transistor and a capacitor which can be applied to a pixel of the invention.

In addition, as shown in FIG. 27A, a second upper electrode 26301 may be provided, which is formed in the same layer as the wire 2613 in contact with the impurity region 2605 of the driving transistor 2618. Note that common portions to those in FIG. 26A are denoted by the same reference numerals, and description thereof is omitted. A second capacitor is formed by interposing the interlayer insulating film 2612 between the second upper electrode 26301 and the upper electrode 2611. In addition, since the second upper electrode 26301 is in contact with the impurity region 2608, a first capacitor having such a structure that the gate insulating film 2609 is interposed between the upper electrode 2611 and the channel forming region 2606, and the second capacitor having such a structure that the interlayer insulating film 2612 is interposed between the upper electrode 2611 and the second upper electrode 26301 are connected in parallel, so that a capacitor 26302 having the first and second capacitors is obtained. Since the capacitor 26302 has a total capacitance of those of the first and second capacitors, the capacitor having a large capacitance can be formed in a small area. That is, using the capacitor in the pixel structure of the invention leads to a further improved aperture ratio.

Figure 27B:
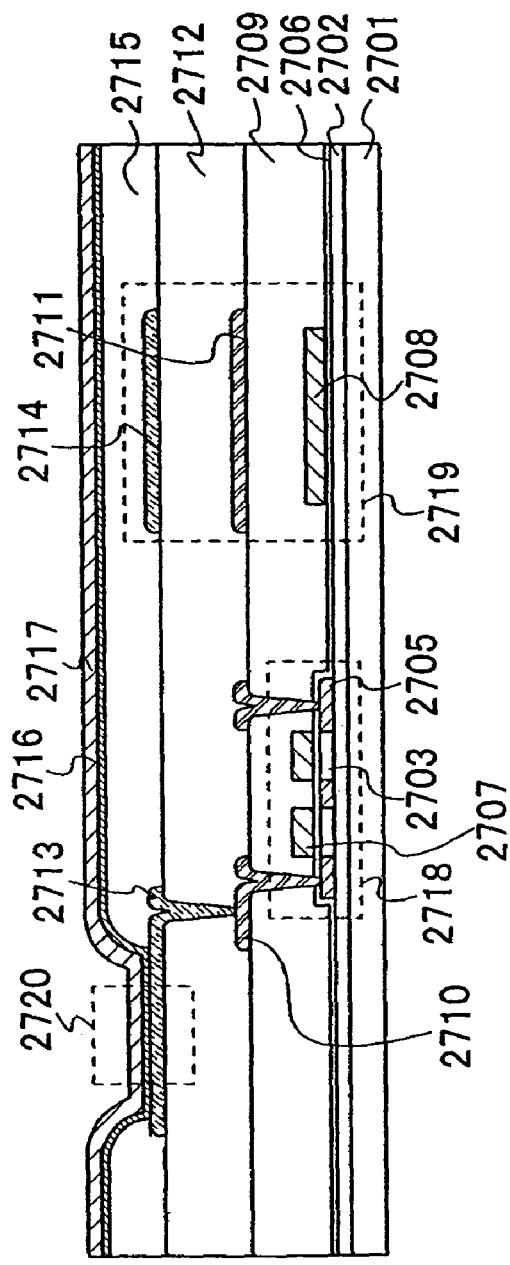

Alternatively, a structure of a capacitor as shown in FIG. 27B may be employed. A base film 2702 is formed over a substrate 2701, and a semiconductor layer is formed thereover. The semiconductor layer includes a channel forming region 2703 and an impurity region 2705 functioning as a source or drain region of a driving transistor 2718. Note that channel doping may be carried out to the channel forming region 2703.

As the substrate, a glass substrate, a quartz substrate, a ceramic substrate, a plastic substrate, or the like can be used. The base film 2702 can be formed using a single layer of aluminum nitride (AlN), silicon oxide ($SiO_2$), silicon oxynitride ($SiO_xN_y$), or the like or stacked layers thereof.

A gate electrode 2707 and a first electrode 2708 are formed over the semiconductor layer with a gate insulating film 2706 interposed therebetween.

A first interlayer insulating film 2709 is formed so as to cover the driving transistor 2718 and the first electrode 2708. Then, a contact hole is formed in the first interlayer insulating film 2709, through which a wire 2710 is in contact with the impurity region 2705. In addition, a second electrode 2711 is formed in the same layer and with the same material as the wire 2710.

Furthermore, a second interlayer insulating film 2712 is formed so as to cover the wire 2710 and the second electrode 2711. Then, a contact hole is formed in the second interlayer insulating film 2712, through which a pixel electrode 2713 is formed in contact with the wire 2710. A third electrode 2714 is formed in the same layer and with the same material as the pixel electrode 2713. Here, a capacitor 2719 is formed of the first electrode 2708, the second electrode 2711, and the third electrode 2714.

An insulator 2715 is formed so as to cover an end portion of the pixel electrode 2713 and the third electrode 2714, and a layer 2716 containing an organic compound and a counter electrode 2717 are formed over the third insulator 2715 and the third electrode 2714. Then, an light emitting element 2720 corresponds to a region where the layer 2716 containing an organic compound is interposed between the pixel electrode 2713 and the counter electrode 2717.

As described above, each of the structures shown in FIGS. 26A and 26B and FIGS. 27A and 27B can be given as a structure of a transistor using a crystalline semiconductor film for a semiconductor layer. Note that the transistors having the structures shown in FIGS. 26A and 26B and FIGS. 27A and 27B are examples of transistors with a top-gate structure. That is, the transistor may be either a p-channel transistor or an n-channel transistor. In the case where the transistor is an n-channel transistor, the LDD region may be formed either so as to overlap the gate electrode or not to overlap, or a part of the LDD region may be formed so as to overlap the gate electrode. Further, the gate electrode may have a tapered shape and the LDD region may be provided below the tapered portion of the gate electrode in a self-aligned manner. In addition, the number of gate electrodes is not limited to two, and a multi-gate structure with three or more gate electrodes may be employed, or a single gate structure may also be employed.

Next, as a structure of a transistor which uses polysilicon (p-Si) for a semiconductor layer, FIGS. 30A and 30B each show a partial cross-sectional view of a display panel using a transistor which has a structure where a gate electrode is interposed between a substrate and a semiconductor layer, that is, a transistor with a bottom-gate structure where a gate electrode is located below a semiconductor layer.

A base film 3002 is formed over a substrate 3001. Then, a gate electrode 3003 is formed over the base film 3002. A first electrode 3004 is formed in the same layer and with the same material as the gate electrode. As a material of the gate electrode 3003, polycrystalline silicon to which phosphorus is added can be used. Silicide, which is a compound of metal and silicon, may be used in addition to polycrystalline silicon.

Then, a gate insulating film 3005 is formed so as to cover the gate electrode 3003 and the first electrode 3004. As the gate insulating film 3005, a silicon oxide film, a silicon nitride film, or the like is used.

A semiconductor layer is formed over the gate insulating film 3005. The semiconductor layer includes a channel forming region 3006, an LDD region 3007, and an impurity region 3008 functioning as a source or drain region, which are in a driving transistor 3022, and a channel forming region 3009, an LDD region 3010, and an impurity region 3011, which function as a second electrode of a capacitor 3023. Note that channel doping may be carried out to the channel forming regions 3006 and 3009.

As the substrate, a glass substrate, a quartz substrate, a ceramic substrate, a plastic substrate, or the like can be used. The base film 3002 can be formed using a single layer of aluminum nitride (AlN), silicon oxide ($SiO_2$), silicon oxynitride ($SiO_xN_y$), or the like or stacked layers thereof.

A first interlayer insulating film 3012 is formed so as to cover the semiconductor layer. Then, a contact hole is formed in the first interlayer insulating film 3012, through which a wire 3013 is in contact with the impurity region 3008. A third electrode 3014 is formed in the same layer and with the same material as the wire 3013. The capacitor 3023 is formed with the first electrode 3004, the second electrode, and the third electrode 3014.

In addition, an opening portion 3015 is formed in the first interlayer insulating film 3012. A second interlayer insulating film 3016 is formed so as to cover the driving transistor 3022, the capacitor 3023, and the opening portion 3015. Then, a contact hole is formed in the second interlayer insulating film 3016, through which a pixel electrode 3017 is formed. Then, an insulator 3018 is formed so as to cover end portions of the pixel electrode 3017. For example, a positive photosensitive acrylic resin film can be used. Subsequently, a layer 3019 containing an organic compound and a counter electrode 3020 are formed over the pixel electrode 3017. Thus, a light emitting element 3021 corresponds to a region where the layer 3019 containing an organic compound is interposed between the pixel electrode 3017 and the counter electrode 3020. The opening portion 3015 is located below the light emitting element 3021. That is, in the case where light emitted from the light emitting element 3021 is extracted from the substrate side, the transmittance can be improved due to the existence of the opening portion 3015.

Figure 30A:
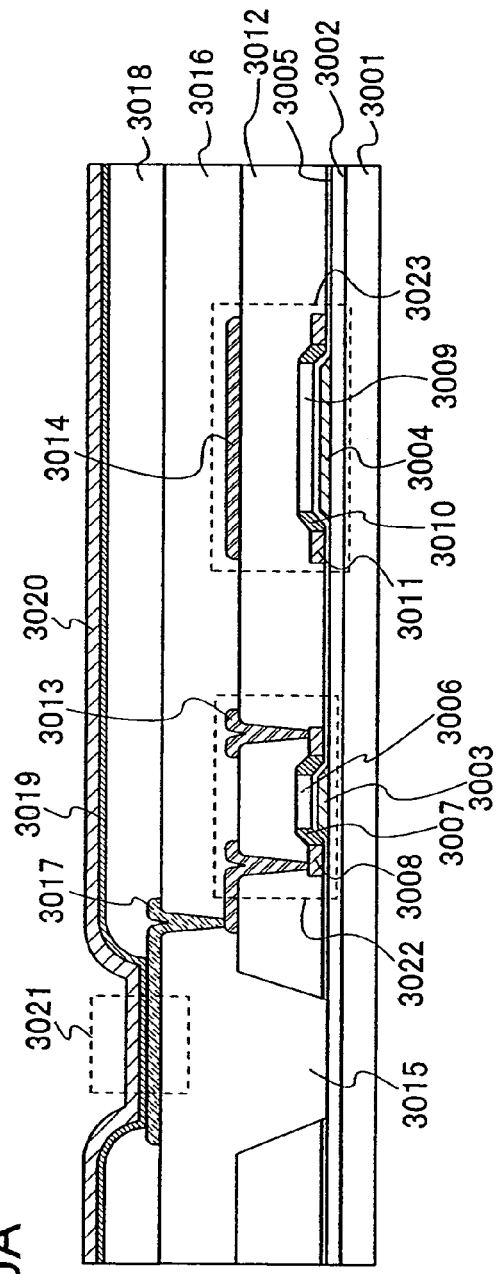
FIGS. 30A and 30 B are diagrams showing structures of a transistor and a capacitor which can be applied to a pixel of the invention.
Figure 30B:
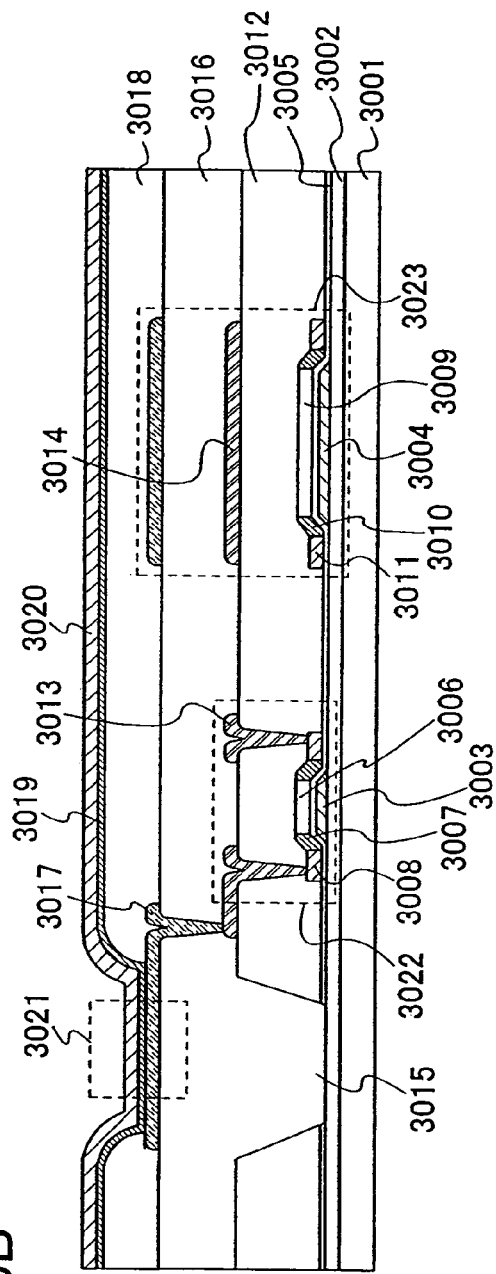

Furthermore, a fourth electrode 3024 may be formed in the same layer and with the same material as the pixel electrode 3017 in FIG. 30A so as to obtain a structure shown in FIG. 30B. In this case, a capacitor 3025 can be formed by the first electrode 3004, the second electrode, the third electrode 3014, and the fourth electrode 3024.

Next, description is made of the case of using an amorphous silicon (a-Si:H) film as a semiconductor layer of a transistor. FIGS. 31A and 31B show cases of a top-gate transistor, and FIGS. 32A, 32B, 30A, and 30B show cases of a bottom-gate transistor.

FIG. 31A shows a cross sectional view of a transistor having a forward staggered structure, which uses amorphous silicon for a semiconductor layer. A base film 3102 is formed over a substrate 3101. Further, a pixel electrode 3103 is formed over the base film 3102. In addition, a first electrode 3104 is formed in the same layer and with the same material as the pixel electrode 3103.

As the substrate, a glass substrate, a quartz substrate, a ceramic substrate, a plastic substrate, or the like can be used. The base film 3102 can be formed using a single layer of aluminum nitride (AlN), silicon oxide ($SiO_2$), silicon oxynitride ($SiO_xN_y$), or the like or stacked layers thereof.

Wires 3105 and 3106 are formed over the base film 3102, and an end portion of the pixel electrode 3103 is covered with the wire 3105. N-type semiconductor layers 3107 and 3108 each having N-type conductivity are formed over the wires 3105 and 3106 respectively. In addition, a semiconductor layer 3109 is formed over the base film 3102 and between the wires 3105 and 3106. The semiconductor layer 3109 is partially extended so as to cover the N-type semiconductor layers 3107 and 3108. Note that the semiconductor layer is formed by an amorphous semiconductor film such as an amorphous silicon (a-Si:H) film or a microcrystalline semiconductor (μ-Si:H) film. Then, a gate insulating film 3110 is formed over the semiconductor layer 3109, and an insulating film 3111 is formed in the same layer and with the same material as the gate insulating film 3110, and also over the first electrode 3104. Note that as the gate insulating film 3110, a silicon oxide film, a silicon nitride film, or the like is used.

A gate electrode 3112 is formed over the gate insulating film 3110. In addition, a second electrode 3113 is formed in the same layer and with the same material as the gate electrode, and over the first electrode 3104 with the insulating film 3111 interposed therebetween. A capacitor 3119 corresponds to a region where the insulating film 3111 is interposed between the first electrode 3104 and the second electrode 3113. An insulator 3114 is formed so as to cover end portions of the pixel electrode 3103, the driving transistor 3118, and the capacitor 3119.

A layer 3115 containing an organic compound and a counter electrode 3116 are formed over the insulator 3114 and the pixel electrode 3103 located in an opening portion of the insulator 3114. Thus, a light emitting element 3117 corresponds to a region where the layer 3115 containing an organic compound is interposed between the pixel electrode 3103 and the counter electrode 3116.

The first electrode 3104 shown in FIG. 31A may be formed like a first electrode 3120 as shown in FIG. 31B. The first electrode 3120 is formed in the same layer and with the same material as the wires 3105 and 3106.

Figure 32A:
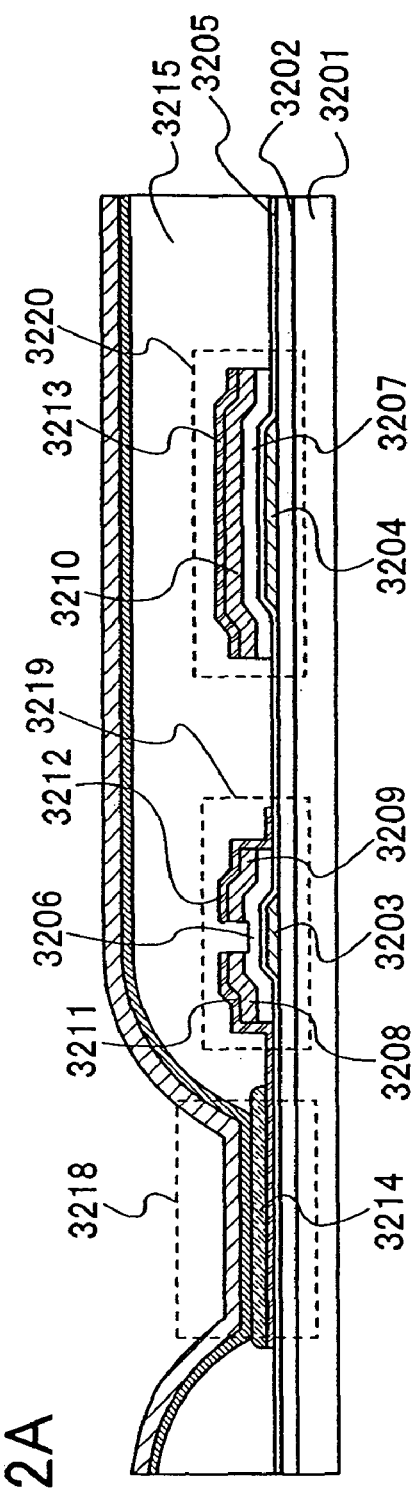
FIGS. 32A and 32B are diagrams showing structures of a transistor and a capacitor which can be applied to a pixel of the invention.
Figure 32B:
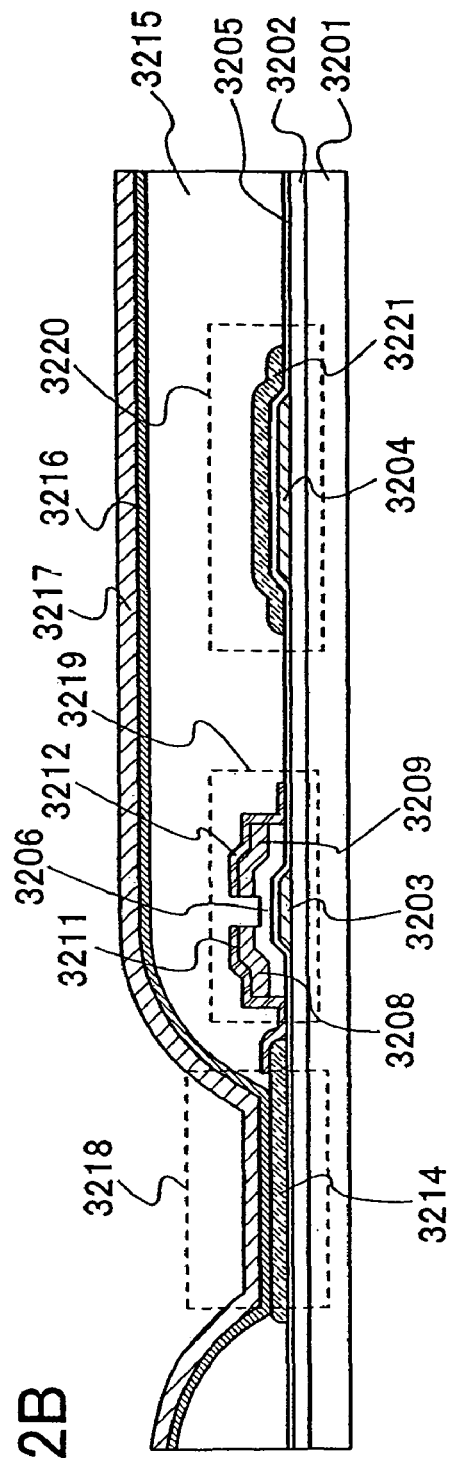

FIGS. 32A and 32B show partial cross-sectional views of a display panel having a bottom-gate transistor which uses amorphous silicon as its semiconductor layer.

A base film 3202 is formed over a substrate 3201. A gate electrode 3203 is formed over the base film 3202. A first electrode 3204 is formed in the same layer and with the same material as the gate electrode. As a material of the gate electrode 3203, polycrystalline silicon to which phosphorus is added can be used. Silicide, which is a compound of metal and silicon, may be used in addition to polycrystalline silicon.

Then, a gate insulating film 3205 is formed so as to cover the gate electrode 3203 and the first electrode 3204. As the gate insulating film 3205, a silicon oxide film, a silicon nitride film, or the like is used.

A semiconductor layer 3206 is formed over the gate insulating film 3205. In addition, a semiconductor layer 3207 is formed in the same layer and with the same material as the semiconductor layer 3206.

As the substrate, a glass substrate, a quartz substrate, a ceramic substrate, a plastic substrate, or the like can be used. The base film 3202 can be formed using a single layer of aluminum nitride (AlN), silicon oxide ($SiO_2$), silicon oxynitride ($SiO_xN_y$), or the like or stacked layers thereof.

N-type semiconductor layers 3208 and 3209 having N-type conductivity are formed over the semiconductor layer 3206, and an N-type semiconductor layer 3210 is formed over the semiconductor layer 3207.

Wires 3211 and 3212 are formed over the N-type semiconductor layers 3208 and 3209 respectively, and a conductive layer 3213 is formed in the same layer and with the same material as the wires 3211 and 3212, over the N-type semiconductor layer 3210.

Thus, a second electrode is formed of the semiconductor layer 3207, the N-type semiconductor layer 3210, and the conductive layer 3213. Note that a capacitor 3220 having a structure where the gate insulating film 3205 is interposed between the second electrode and the first electrode 3204 is formed.

One end portion of the wire 3211 is extended, and a pixel electrode 3214 is formed so as to be in contact with an upper potion of the extended wire 3211.

In addition, an insulator 3215 is formed so as to cover end portions of the pixel electrode 3214, a driving transistor 3219, and the capacitor 3220.

Then, a layer 3216 containing an organic compound and a counter electrode 3217 are formed over the pixel electrode 3214 and the insulator 3215. A light emitting element 3218 corresponds to a region where the layer 3216 containing an organic compound is interposed between the pixel electrode 3214 and the counter electrode 3217.

The semiconductor layer 3207 and the N-type semiconductor layer 3210, which are to be a part of the second electrode of the capacitor, are not necessarily required. That is, the second electrode may be the conductive layer 3213, so that the capacitor may have such a structure that the gate insulating film 3205 is interposed between the first electrode 3204 and the conductive layer 3213.

Note that the pixel electrode 3214 is formed before the wire 3211 is formed in FIG. 32A, thereby a capacitor 3222 as shown in FIG. 32B can be obtained, which has a structure where the gate insulating film 3205 is interposed between the first electrode 3204 and a second electrode 3221 formed of the pixel electrode 3214.

Although FIGS. 32A and 32B show inverted staggered channel-etched transistors, a channel-protective transistor may be used. Description of channel-protective transistors is made with reference to FIGS. 30A and 30B.

A channel-protective transistor shown in FIG. 33A is different from the channel-etched driving transistor 3219 shown in FIG. 32A in that an insulator 3301 functioning as an etching mask is provided over the channel forming region in the semiconductor layer 3206. Common portions except for that point are denoted by the same reference numerals.

Similarly, a channel-protective transistor shown in FIG. 30B is different from the channel-etched driving transistor 3219 shown in FIG. 32B in that the insulator 3301 functioning as an etching mask is provided over the channel forming region in the semiconductor layer 3206. Common portions except for that point are denoted by the same reference numerals.

By using an amorphous semiconductor film as a semiconductor layer (channel forming region, source region, drain region, and the like) of a transistor included in a pixel of the invention, the manufacturing cost can be reduced.

Note that structures of the transistors and capacitors to which a pixel structure of the invention can be applied are not limited to those described above, and various structures of transistors and capacitors can be used.

Embodiment Mode 5

The display device of the invention can be applied to various electronic appliances, specifically a display portion of electronic appliances. The electronic appliances include cameras such as a video camera and a digital camera, a goggle-type display, a navigation system, an audio reproducing device (car audio component stereo, audio component stereo, or the like), a computer, a game machine, a portable information terminal (mobile computer, mobile phone, mobile game machine, electronic book, or the like), an image reproducing device having a recording medium (specifically, a device for reproducing a recording medium such as a digital versatile disc (DVD) and having a display for displaying the reproduced image) and the like.

Figure 34A:
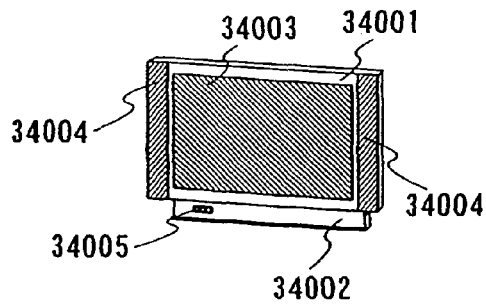
FIGS. 34A to 34H are views showing electrical appliances to which a display device of the invention can be applied.

FIG. 34A shows a display which includes a housing 34001, a supporting base 34002, a display portion 34003, a speaker portion 34004, a video inputting terminal 34005, and the like. A display device having the pixel structure of the invention can be used for the display portion 34003. Note that the display includes all display devices for displaying information such as for a personal computer, receiving television broadcasting, and displaying an advertisement. A display using the display device of the invention for the display portion 34003 can reduce power consumption.

In recent years, the need to grow in size of a display has been increased. In accordance with the enlargement of a display, rise in price becomes a problem. Therefore, an object is to reduce the manufacturing cost as much as possible and to provide a high quality product at as low price as possible.

Figure 34B:
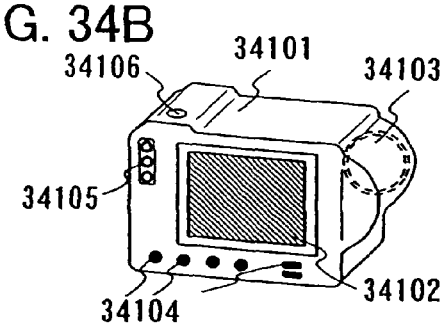

FIG. 34B shows a camera which includes a main body 34101, a display portion 34102, an image receiving portion 34103, operating keys 34104, an external connection port 34105, a shutter 34106, and the like.

In recent years, in accordance with advance in performance of a digital camera and the like, competitive manufacturing thereof has been intensified. Thus, it is important to provide a higher-performance product at as low price as possible. A digital camera using the display device of the invention for the display portion 34102 can reduce power consumption.

Figure 34C:
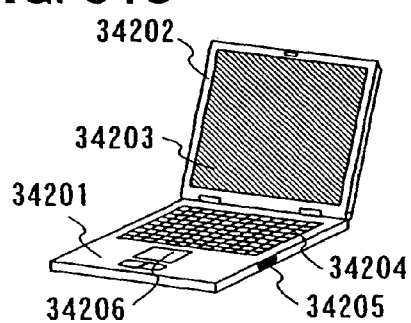

FIG. 34C shows a computer which includes a main body 34201, a housing 34202, a display portion 34203, a keyboard 34204, an external connection port 34205, a pointing mouse 34206, and the like. A computer using the display device of the invention for the display portion 34203 can reduce power consumption.

Figure 34D:
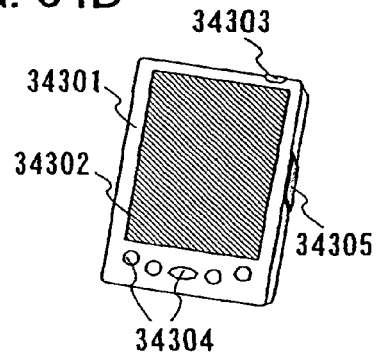

FIG. 34D shows a mobile computer which includes a main body 34301, a display portion 34302, a switch 34303, operating keys 34304, an infrared port 34305, and the like. A mobile computer using the display device of the invention for the display portion 34302 can reduce power consumption by switching between a normal mode and a power saving mode.

Figure 34E:
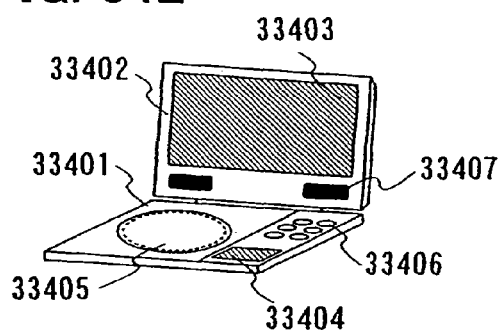

FIG. 34E shows a portable image reproducing device having a recording medium (specifically, a DVD reproducing device), which includes a main body 34401, a housing 34402, a display portion A 34403, a display portion B 34404, a recording medium (DVD or the like) reading portion 34405, an operating key 34406, a speaker portion 34407, and the like. The display portion A 34403 mainly displays image data and the display portion B 34404 mainly displays text data. An image reproducing device using the display device of the invention for the display portions A 34403 and B 34404 can reduce power consumption by switching between a normal mode and a power saving mode.

Figure 34F:
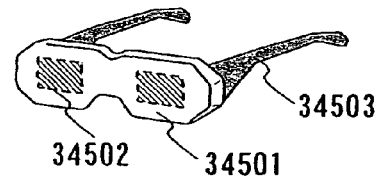

FIG. 34F shows a goggle-type display which includes a main body 34501, a display portion 34502, and an arm portion 34503. A goggle type display using the display device of the invention for the display portion 34502 can reduce power consumption by switching between a normal mode and a power saving mode.

Figure 34G:
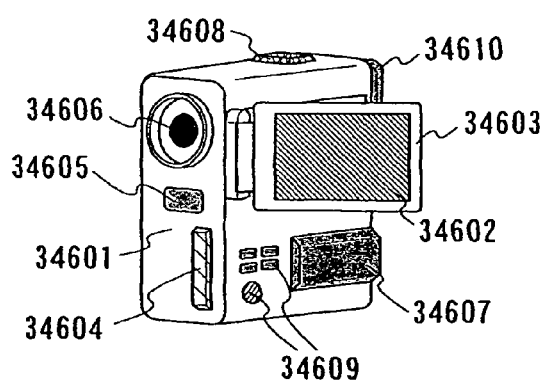

FIG. 34G shows a video camera which includes a main body 342001, a display portion 342002, a housing 342003, an external connection port 342004, a remote control receiving portion 342005, an image receiving portion 342006, a battery 342007, an audio inputting portion 342008, operating keys 342009, an eye piece portion 34610, and the like. A video camera using the display device of the invention for the display portion 342002 can reduce power consumption by switching between a normal mode and a power saving mode.

Figure 34H:
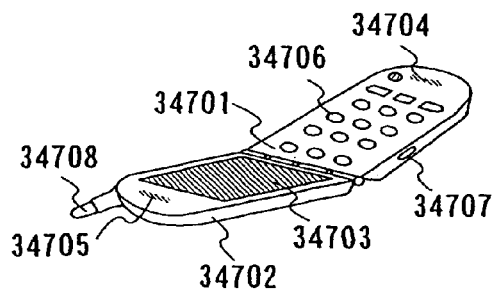

FIG. 34H shows a mobile phone which includes a main body 34701, a housing 34702, a display portion 34703, an audio inputting portion 34704, an audio outputting portion 34705, operating keys 34706, an external connection port 34707, an antenna 34708, and the like.

In recent years, a mobile phone is provided with a game function, a camera function, an electronic money function, or the like, and the need for a high-value added mobile phone has been increased. Further, the high definition display has been required. The mobile phone using the display device of the invention for the display portion 34703 can reduce power consumption by switching a normal mode and a power saving mode.

While a mobile phone becomes multifunctional and the frequency of use is increased, long time use with one charge is required.

For example, peripheral driver circuits are formed into an IC chip by using CMOS or the like as shown in FIGS. 28B and 29A, thereby low power consumption can be achieved.

Thus, the invention can be applied to various electronic appliances.

Embodiment Mode 6

Figure 37:
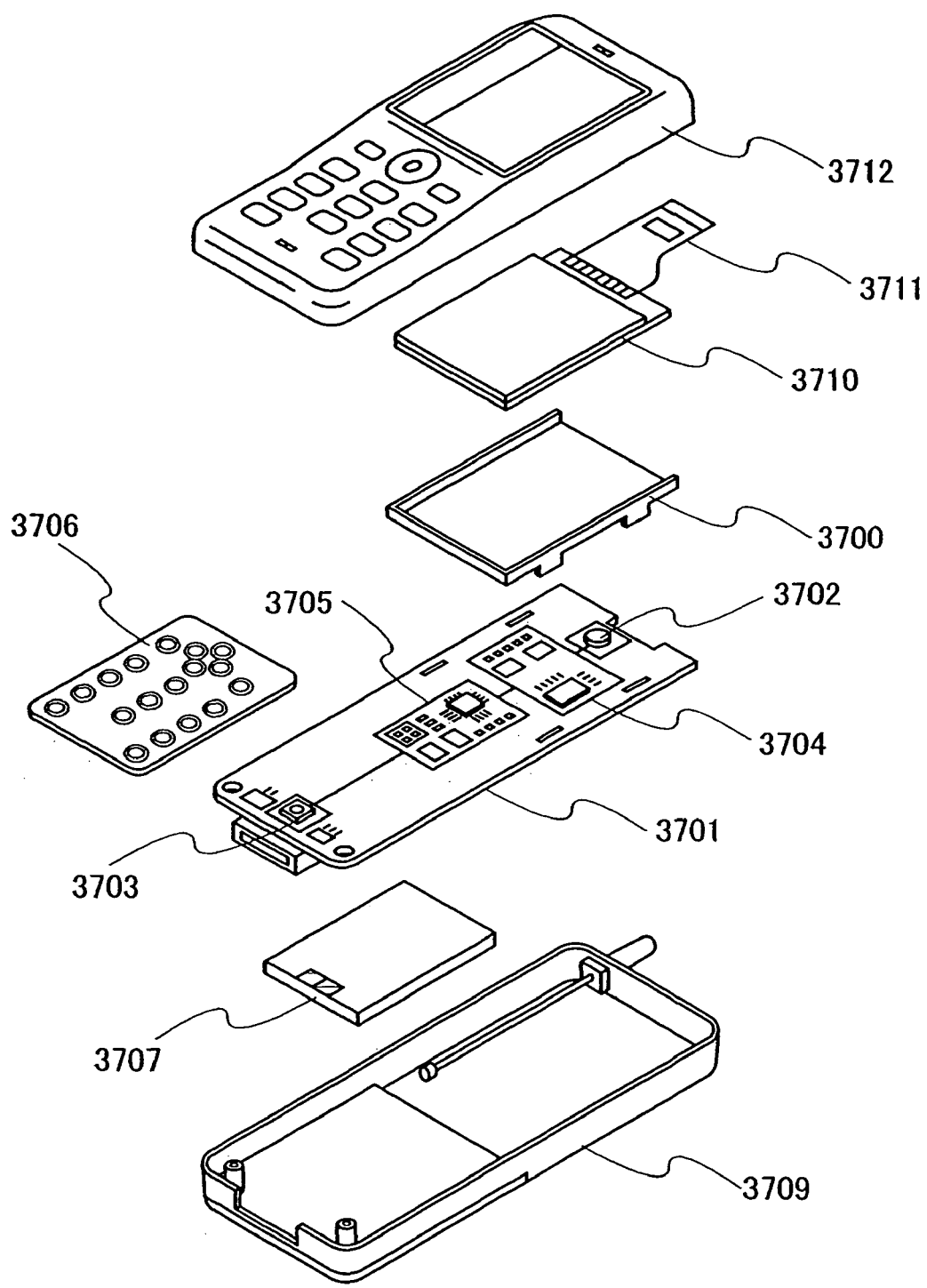
FIG. 37 is a view showing a structure example of a mobile phone.

In this embodiment mode, description is made of a structure example of a mobile phone having the display device of the invention for a display portion with reference to FIG. 37.

A display panel 3710 is incorporated in a housing 3700 so as to be freely attached and detached. The shape and size of the housing 3700 can be appropriately changed in accordance with the size of the display panel 3710. The housing 3700 provided with the display panel 3710 is fitted in a printed circuit board 3701 so as to be assembled as a module.

The display panel 3710 is connected to the printed circuit board. 3701 through an FPC 3711. A speaker 3702, a microphone 3703, a transmitting and receiving circuit 3704, and a signal processing circuit 3705 including a CPU, a controller, and the like are formed over the printed circuit board 3701. The forgoing module, an inputting means 3706, and a battery 3707 are combined, which is stored in a case 3709. A pixel portion of the display panel 3710 is disposed so as to be seen from an opening window formed in the case 3709.

The display panel 3710 may be formed by forming a pixel portion and a part of peripheral driver circuits (a driver circuit whose operation frequency is low among a plurality of driver circuits) using TFTs over one substrate; forming a part of the peripheral driver circuits (a driver circuit whose operation frequency is high among the plurality of driver circuits) into an IC chip; and mounting the IC chip on the display panel 3710 by COG (Chip On Glass). Alternatively, the IC chip may be connected to a glass substrate by using TAB (Tape Automated Bonding) or a printed circuit board. It is to be noted that FIG. 28A shows a structure example of such a display panel that a part of peripheral driver circuits and a pixel portion are formed over one substrate and an IC chip provided with the other part of the peripheral driver circuits is mounted by COG or the like. By employing the above-described structure, power consumption of a display device can be reduced and the life per charge of a mobile phone can be made long. In addition, cost reduction of the mobile phone can be achieved.

In addition, in order to further reduce the power consumption, the pixel portion may be formed using TFTs over a substrate as shown in FIGS. 28B and 29A, all of the peripheral driver circuits may be formed into an IC chip, and the IC chip may be mounted on the display panel by COG (Chip On Glass) or the like. Further, in the pixel portion, an amorphous semiconductor film is used for a semiconductor layer of a transistor, thereby the manufacturing cost can be reduced.

It is to be noted that the structure described in this embodiment mode is an example of a mobile phone, and the display device of the invention can be applied not only to a mobile phone having the above-described constitution but also to mobile phones having various structures.

Embodiment Mode 7

Figure 35:
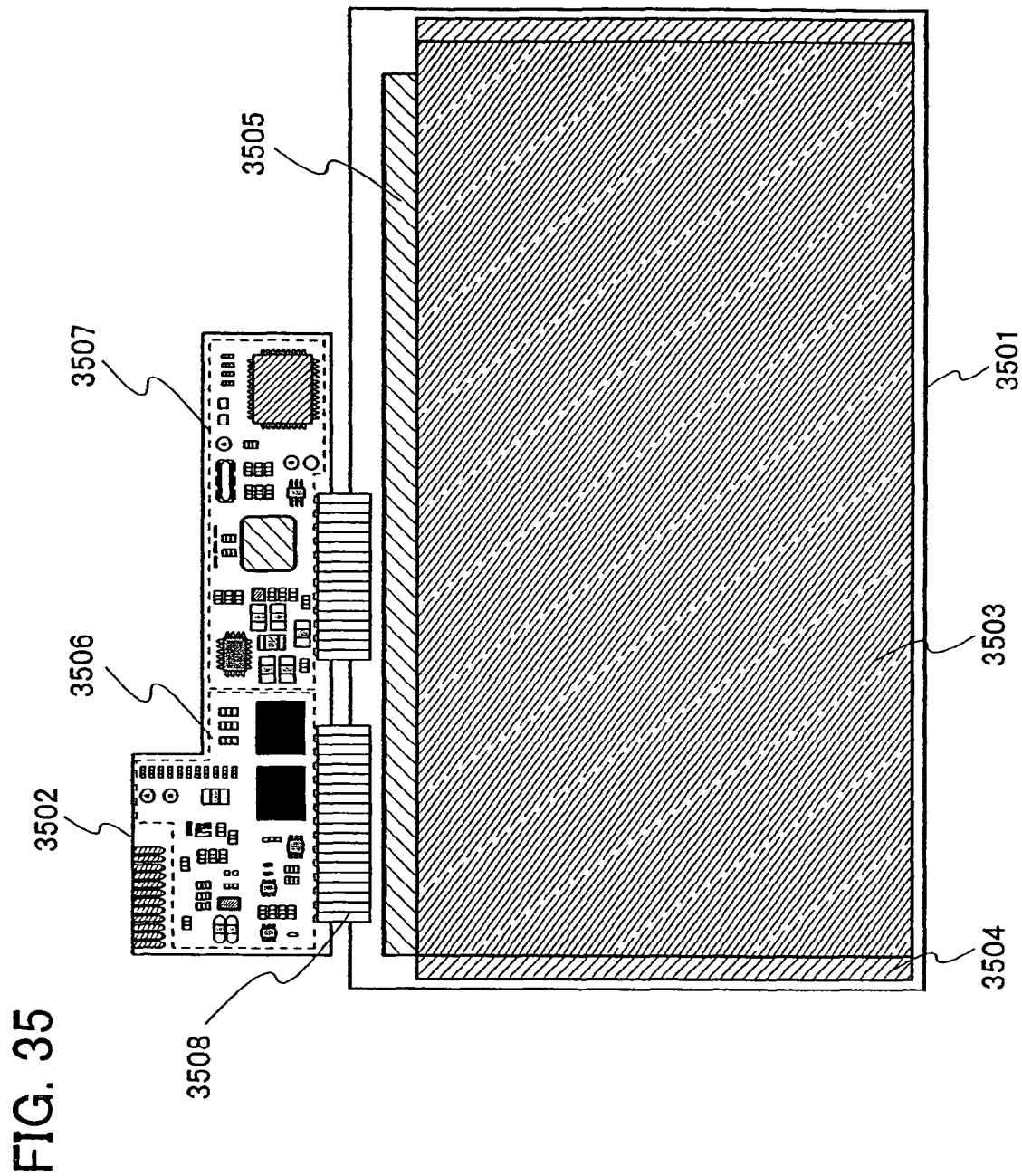
FIG. 35 is a view showing an example of an EL module.

FIG. 35 shows an EL module combining a display panel 3501 and a circuit board 3502. The display panel 3501 includes a pixel portion 3503, a scan line driver circuit 3504, and a signal line driver circuit 3505. A control circuit 3506, a signal dividing circuit 3507, and the like are formed over the circuit board 3502. The display panel 3501 and the circuit board 3502 are connected to each other by a connecting wire 3508. As the connecting wire, an FPC or the like can be used.

The display panel 3501 may be formed by forming a pixel portion and a part of peripheral driver circuits (a driver circuit whose operation frequency is low among a plurality of driver circuits) using TFTs over one substrate; forming a part of the peripheral driver circuits (a driver circuit whose operation frequency is high among the plurality of driver circuits) into an IC chip; and mounting the IC chip on the display panel 3501 by COG (Chip On Glass) or the like. Alternatively, the IC chip may be mounted on the display panel 3501 by using TAB (Tape Automated Bonding) or a printed circuit board. It is to be noted that FIG. 28A shows an example of structure where a part of peripheral driver circuits and a pixel portion are formed over one substrate and an IC chip provided with the other part of the peripheral driver circuits is mounted by COG or the like.

In addition, in order to further reduce the power consumption, the pixel portion may be formed using TFTs over a glass substrate, all of the peripheral driver circuits may be formed into an IC chip, and the IC chip may be mounted on the display panel by COG (Chip On Glass) or the like.

Note that in the case where an amorphous semiconductor film is applied to a semiconductor layer of a transistor constituting a pixel, it is preferable that the pixel portion be formed using TFTs over a substrate, all of the peripheral driver circuits be formed into an IC chip, and the IC chip be mounted on the display panel by COG (Chip On Glass). Note that FIG. 28B shows an example of the structure where a pixel portion is formed over a substrate and an IC chip provided with a peripheral driver circuit is mounted on the substrate by COG or the like.

Figure 36:
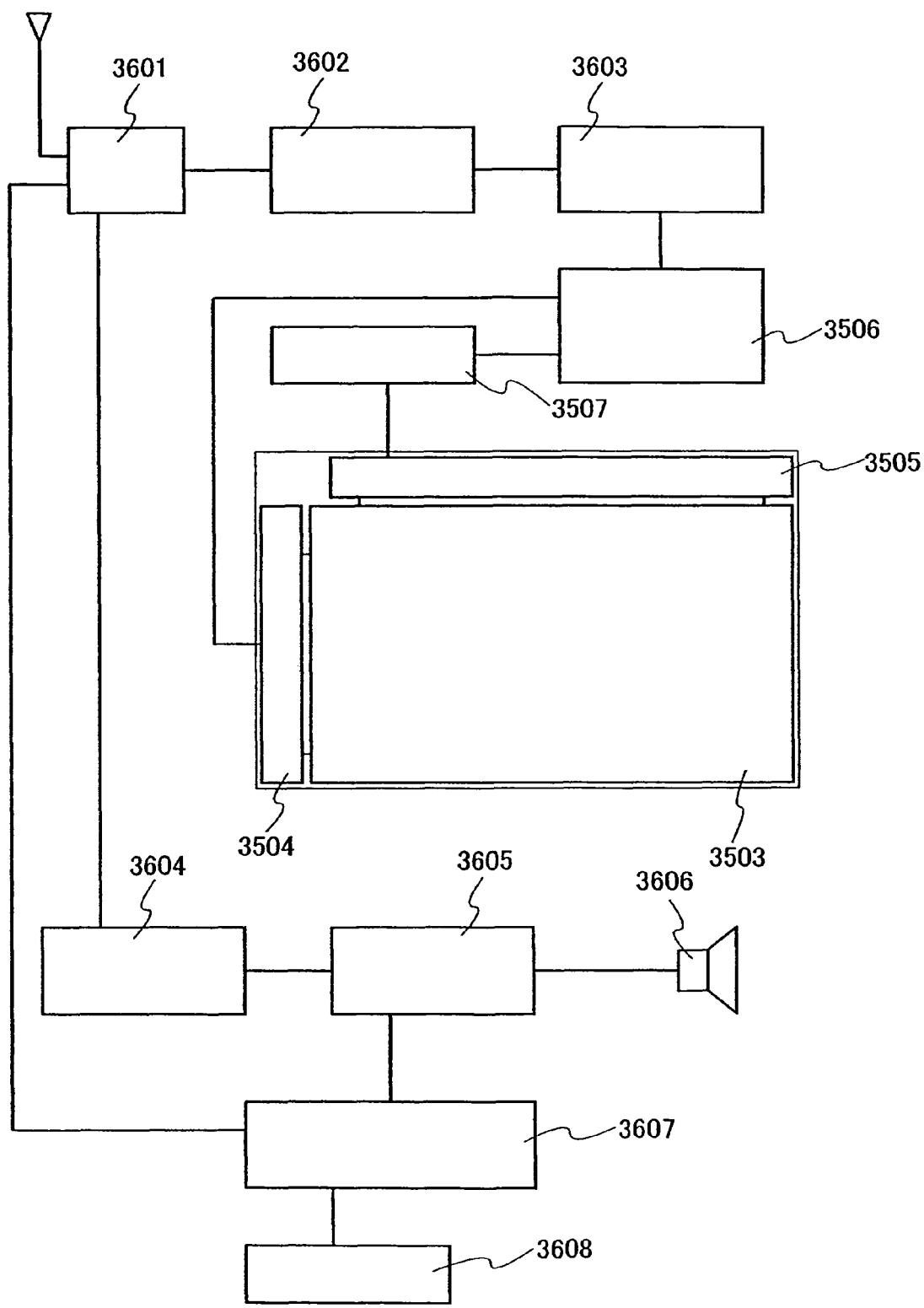
FIG. 36 is a block diagram showing a main structure of an EL TV receiver.

An EL television receiver can be completed with the above-described EL module. FIG. 36 is a block diagram showing a main structure of an EL television receiver. A tuner 3601 receives video signals and audio signals. The video signals are processed by a video signal amplifier circuit 3602, a video signal processing circuit 3603 for converting a signal outputted from the video signal amplifier circuit 3602 into a color signal corresponding to each color of red, green and blue, and the control circuit 3506 for converting the video signal into the input specification of a driver circuit. The control circuit 3506 outputs a signal to each of the scan line side and the signal line side. In the case of driving in a digital manner, a structure where the signal dividing circuit 3507 is provided on the signal line side to supply an input digital signal by dividing into m number of signals may be employed.

An audio signal received by the tuner 3601 is transmitted to an audio signal amplifier circuit 3604, and an output thereof is supplied to a speaker 3606 through an audio signal processing circuit 3605. A control circuit 3607 receives receiving station (received frequency) and volume control data from an input portion 3608, and transmits signals to the tuner 3601 and the audio signal processing circuit 3605

By incorporating the EL module shown in FIG. 35 into the housing 34001, a TV receiver can be completed as shown in FIG. 34A. The display portion 34003 is constituted by the EL module. In addition, the speaker portion 34004, the video inputting terminal 34005, and the like are provided appropriately.

It is needless to say that the invention can also be applied to various appliances other than the TV receiver, such as a monitor of a personal computer, and in particular a large display medium such as an information display panel at the station or the airport, and an advertisement board on the street.

This application is based on Japanese Patent Application serial no. 2005-222219 filed in Japan Patent Office on 29 th, Jul., 2005, the entire contents of which are hereby incorporated by reference.

EXPLANATION OF REFERENCE

101: signal line driver circuit, 102: scan line driver circuit, 103: pixel portion, 104: pixel, 207: semiconductor layer, 401: shift register circuit, 402: latch circuit, 403: latch circuit, 404: circuit, 405: analog switch, 406: transistor, 407: inverter, 408: wire, 600: substrate, 601: signal line driver circuit, 602: scan line driver circuit, 603: pixel portion, 604: counter electrode, 605: connecting terminal portion, 606: connecting terminal, 607: connecting terminal, 608: contact hole, 609: video line, 610: clock line, 611: connecting terminal, 701: signal line driver circuit, 702: scan line driver circuit, 703: pixel portion, 704: pixel, 705: driving transistor, 706: switching transistor, 707: capacitor, 708: light emitting element, 801: transistor, 802: transistor, 803: capacitor, 804: light emitting element, 805: wire, 806: wire, 807: wire, 808: electrode, 901: driving transistor, 902: switching transistor, 903: capacitor, 904: light emitting element, 905: scan line, 906: signal line, 907: power source line, 908: electrode (counter electrode), 909: rectifier element, 910: scan line, 1001: driving transistor, 1002: switching transistor, 1003: capacitor, 1004: light emitting element, 1005: scan line, 1006: signal line, 1007: power source line, 1008: electrode (counter electrode), 1009: erasing transistor, 1010: scan line, 1201: analog voltage holding circuit, 1202: digital signal memory circuit, 1203: display element, 1204: signal line, 1205: switch, 1206: switch, 1301: signal line driver circuit, 1302: signal line driver circuit, 1303: pixel portion, 1304: scan line driver circuit, 1305: pixel, 1307: switch, 1308: switch, 1309: analog voltage holding circuit, 1310: digital signal memory circuit, 1401: signal line driver circuit, 1402: signal line driver circuit, 1403: pixel portion, 1404: scan line driver circuit, 1405: pixel, 1407: switch, 1408: switch, 1409: analog voltage holding circuit, 1410: digital signal memory circuit, 1501: pixel selecting switch, 1502: switch, 1503: switch, 1504: switch, 1505: inverter, 1506: inverter, 1508: display element, 1509: signal line, 1510: capacitor, 1511: counter electrode, 1801: pixel selecting switch, 1802: switch, 1803: switch, 1804: switch, 1805: inverter, 1806: inverter, 1808: display element, 1810: capacitor, 1901: pixel selecting switch, 1902: capacitor, 1903: display element, 1904: pixel selecting switch, 1905: capacitor, 1906: transistor, 1907: switch, 1908: switch, 1909: signal line, 1910: power source line, 1911: power source line, 1912: counter electrode, 2201: signal line driver circuit, 2202: pixel portion, 2203: scan line driver circuit, 2204: sealing substrate, 2205: sealing material, 2206: scan line driver circuit, 2207: space, 2208: wire, 2209: FPC, 2210: substrate, 2211: TFT, 2212: TFT, 2213: electrode, 2214: insulator, 2216: layer, 2217: electrode, 2218: light emitting element, 2220: TFT, 2221: TFT, 2222: IC chip, 2223: IC chip, 2240: substrate, 2301: substrate, 2302: anode, 2303: hole injection layer, 2304: hole transporting layer, 2305: light emitting layer, 2306 electron transporting layer, 2307: electron injection layer, 2308: cathode, 2311: substrate, 2312: anode, 2313: hole injection layer, 2314: hole transporting layer, 2315: light emitting layer, 2316 electron transporting layer, 2317: electron injection layer, 2318: cathode, 2400: substrate, 2401: driving TFT, 2402: electrode, 2403: layer, 2404: electrode, 2500: substrate, 2501: driving TFT, 2502: base film, 2503: electrode, 2504: layer, 2505: electrode, 2507: black matrix (BM), 2601: substrate, 2602: base film, 2603: channel forming region, 2605: impurity region, 2606: channel forming region, 2607: LDD region, 2608: impurity region, 2609: gate insulating film, 2610: gate electrode, 2611: upper electrode, 2612: interlayer insulating film, 2613: wire, 2614: pixel electrode, 2615: interlayer insulator, 2616: layer, 2617: counter electrode, 2618: driving transistor, 2619: capacitor, 2620: light emitting element, 2621: wire, 2701: substrate, 2702: base film, 2703: channel forming region, 2705: impurity region, 2706: gate insulating film, 2707: gate electrode, 2708: electrode, 2709: interlayer insulating film, 2710 wire, 2711: electrode, 2712: interlayer insulating film,- 2713: pixel electrode, 2714: electrode, 2715: insulator, 2716: layer, 2717: counter electrode, 2718: driving transistor, 2719: capacitor, 2720: light emitting element, 2800: substrate, 2801: signal line driver circuit, 2802: pixel portion, 2803: scan line driver circuit, 2804: scan line driver circuit, 2805: FPC, 2806: IC chip, 2807: IC chip, 2808: sealing substrate, 2809: sealing material, 2810: substrate, 2811: signal line driver circuit, 2812: pixel portion, 2813: scan line driver circuit, 2814: scan line driver circuit, 2815: FPC, 2816: IC chip, 2817: IC chip, 2818: sealing substrate, 2822: sealing material, 2900: substrate, 2901: peripheral driver circuit, 2902: pixel portion, 2904: FPC, 2905: IC chip, 2906: IC chip, 2907: sealing substrate, 2908: sealing material, 2910: substrate, 2911: peripheral driver circuit, 2912: pixel portion, 2913: FPC, 2914: FPC, 3001: substrate, 3002: base film, 3003: gate electrode, 3004: electrode, 3005: gate insulating film, 3006: channel forming region, 3007: LDD region, 3008: impurity region, 3009: channel forming region, 3010: LDD region, 3011: impurity region, 3012: interlayer insulating film, 3013: wire, 3014: electrode, 3015: opening portion, 3016: interlayer insulating film, 3017: pixel electrode, 3018: insulator, 3019: layer, 3020: counter electrode, 3021: light emitting element, 3022: driving transistor, 3023: capacitor, 3024: electrode, 3025: capacitor, 3101: substrate, 3102: base film, 3103: pixel electrode, 3104: electrode, 3105: wire, 3106: wire, 3107: N-type semiconductor layer, 3108: N-type semiconductor layer, 3109: semiconductor layer, 3110: gate insulating film, 3111: insulating film, 3112: gate electrode, 3113: electrode, 3114: insulator, 3115: layer, 3116: counter electrode, 3117: light emitting element, 3118: driving transistor, 3119: capacitor, 3120: electrode, 3201: substrate, 3202: base film, 3203: gate electrode, 3204: electrode, 3205: gate insulating film, 3206: semiconductor layer, 3207: semiconductor layer, 3208: N-type semiconductor layer, 3210: N-type semiconductor layer, 3211: wire, 3213: conductive layer, 3214: pixel electrode, 3215: insulator, 3216: layer, 3217: counter electrode, 3218: light emitting element, 3219: driving transistor, 3220: capacitor, 3221: electrode, 3222: capacitor, 3301: insulator, 3501: display panel, 3502: circuit board, 3503: pixel portion, 3504: scan line driver circuit, 3505: signal line driver circuit, 3506: control circuit, 3507: signal dividing circuit, 3508: connecting wire, 3601: tuner, 3602: video signal amplifier circuit, 3603: video signal processing circuit, 3604: audio signal amplifier circuit, 3605: audio signal processing circuit, 3606: speaker, 3607: control circuit, 3608: input portion, 3700: housing, 3701: printed circuit board, 3702: speaker, 3703: microphone, 3704: transmitting and receiving circuit, 3705: signal processing circuit, 3706: inputting means, 3707: battery, 3709: case, 3710: display panel, 3711: FPC, 3801: signal line driver circuit, 3802: scan line driver circuit, 3803: pixel portion, 3804: pixel, 3805: scan line driver circuit, 3901: signal line driver circuit, 3902: scan line driver circuit, 3903: pixel portion, 3904: pixel, 3905: scan line driver circuit, 3906: shift register circuit, 3907: shift register circuit, 3908: switch, 3909: switch, 4001: shift register circuit, 4002: sampling switch, 4003: circuit, 4004: flip-flop circuit, 4005: AND gate, 4006: switch, 4007: analog switch, 4008: transistor, 4009: wire, 4010: inverter, 1306*a*: sub-pixel, 1306*b*: sub-pixel, 1306*c*: sub-pixel, 1406*a*: sub-pixel, 1406*b*: sub-pixel, 1406*c*: sub-pixel, 1800*a*: sub-pixel, 1800*b*: sub-pixel, 1800*c*: sub-pixel, 2506B: color filter, 2506G: color filter, 2506R: color filter, 26202: region, 26301: upper electrode, 26302: capacitor, 34001: housing, 34002: supporting base, 34003: display portion, 34004: speaker portion, 34005: video inputting terminal, 34101: main body, 34102: display portion, 34103: image receiving portion, 34104: operating keys, 34105: external connection port, 34106: shutter, 34201: main body, 34202: housing, 34203: display portion, 34204: keyboard, 34205: external connection port, 34206: pointing mouse, 34301: main body, 34302: display portion, 34303: switch, 34304: operating keys, 34305: infrared port, 34401: main body, 34402: housing, 34403: display portion A, 34404: display portion B, 34405: reading portion, 34406: operating key, 34407: speaker portion, 34501: main body, 34502: display portion, 34503: arm portion, 34610: eye piece portion, 34701: main body, 34702: housing, 34703: display portion, 34704: audio inputting portion, 34705: audio outputting portion, 34706: operating keys, 34707: external connection port, 34708: antenna, 342001: main body, 342002: display portion, 342003: housing, 342004: external connection port, 342005: remote control receiving portion, 342006: image receiving portion, 342007: battery, 342008: audio inputting portion, 342009: operating keys

The invention claimed is:

1. A display device comprising:
 a signal line driver circuit comprising:
  a shift register circuit for outputting a sampling pulse;
  a first latch circuit for latching a video signal in accordance with the sampling pulse outputted from the shift register circuit;
  a second latch circuit for latching the video signal outputted from the first latch circuit; and
  a switching circuit including an analog switch electrically connected to a signal line and a transistor electrically connected to the signal line; and
 a scan line driver circuit,
 wherein the analog switch is configured to control an electrical connection between the signal line and an output of the second latch circuit in accordance with a control signal,
 wherein the transistor is configured to control an electrical connection between the signal line and a wiring in accordance with the control signal, and
 wherein the switching circuit is configured to supply a signal which puts a pixel in a non-displaying state to the signal line through the transistor while the scan line driver circuit selects the pixel and the shift register circuit stops operating.

2. The display device according to claim 1, wherein the pixel comprises a switching transistor and a driving transistor.

3. The display device according to claim 2, wherein the pixel further comprises a capacitor element.

4. The display device according to claim 1, wherein the pixel comprises a light emitting element.

5. A display device comprising:
 a pixel portion;
 a connecting terminal portion;
 a signal line driver circuit provided on an opposite side of the pixel portion from the connecting terminal portion, the signal line driver circuit comprising:
  a shift register circuit for outputting a sampling pulse;
  a first latch circuit for latching a video signal in accordance with the sampling pulse outputted from the shift register circuit;
  a second latch circuit for latching the video signal outputted from the first latch circuit; and
  a switching circuit including an analog switch electrically connected to a signal line and a transistor electrically connected to the signal line; and
 a scan line driver circuit,
 wherein the analog switch is configured to control an electrical connection between the signal line and an output of the second latch circuit in accordance with a control signal,
 wherein the transistor is configured to control an electrical connection between the signal line and a wiring in accordance with the control signal, and
 wherein the switching circuit is configured to supply a signal which puts a pixel in a non-displaying state to the signal line through the transistor while the scan line driver circuit selects the pixel and the shift register circuit stops operating.

6. The display device according to claim 5, wherein the pixel comprises a switching transistor and a driving transistor.

7. The display device according to claim 6, wherein the pixel comprises a capacitor element.

8. The display device according to claim 5, wherein the pixel comprises a light emitting element.

9. A driving method of a display device comprising a shift register circuit, a latch circuit, and a switching circuit in a signal line driver circuit, and can perform partial display, wherein the switching circuit includes an analog switch electrically connected a signal line and a transistor electrically connected the signal line, wherein the analog switch is configured to control an electrical connection between the signal line and an output of the latch circuit in accordance with a control signal, and wherein the transistor is configured to control an electrical connection between the signal line and a wiring in accordance with the control signal, the driving method comprising the steps of:

supplying the a video signal outputted from the latch circuit to the signal line through the analog switch while a first pixel in a display area is selected ;

supplying a non-display signal to the signal line through the transistor while a pixel in a non-display area is selected;

inputting a clock signal to the shift register circuit while the first pixel in the display area is selected;

stopping to input the clock signal to the shift register circuit when the pixel in the non-display area starts to be selected; and starting to input the clock signal to the shift register circuit when a selection of a pixel is shifted from the non-display area to the display area, no less than one horizontal period prior to a start of a selection of the pixel in the display area.

* * * * *

UNITED STATES PATENT AND TRADEMARK OFFICE
CERTIFICATE OF CORRECTION

PATENT NO. : 7,999,800 B2  
APPLICATION NO. : 11/494258  
DATED : August 16, 2011  
INVENTOR(S) : Tomoyuki Iwabuchi et al.

It is certified that error appears in the above-identified patent and that said Letters Patent is hereby corrected as shown below:

In The Specification:

Column 8, Line 6; Change "(GASP)" to --(G_SP)--.

Column 9, Line 59; Change "Or" to --or--.

Column 12, Line 16; Change "(i+1)" to --(j+1)--.

Column 15, Line 12; Change "Writing" to --writing--.

Column 20, Line 28; Change "RASP" to --R_SP--.

Column 21, Line 33; Change "video" to --Video--.

Column 23, Line 54; Change "or/off" to --on/off--.

Column 29, Line 41; Change "Limited" to --limited--.

Column 32, Line 3; Change "-S-" to "-5-".

Column 32, Line 14-15; Change "quinotinolato" to --quinolinolato--.

Column 33, Line 16; Change "U" to --Li--.

Signed and Sealed this  
Seventh Day of February, 2012

David J. Kappos  
*Director of the United States Patent and Trademark Office*